United States Patent
Nagai et al.

(10) Patent No.: US 7,190,004 B2
(45) Date of Patent: Mar. 13, 2007

(54) LIGHT EMITTING DEVICE

(75) Inventors: Youichi Nagai, Itami (JP); Makoto Kiyama, Itami (JP); Takao Nakamura, Itami (JP); Takashi Sakurada, Itami (JP); Katsushi Akita, Itami (JP); Koji Uematsu, Itami (JP); Ayako Ikeda, Itami (JP); Koji Katayama, Itami (JP); Susumu Yoshimoto, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/001,414

(22) Filed: Dec. 2, 2004

(65) Prior Publication Data

US 2005/0121688 A1 Jun. 9, 2005

(30) Foreign Application Priority Data

Dec. 3, 2003 (JP) ............................. 2003-404266
Sep. 27, 2004 (JP) ............................. 2004-279980

(51) Int. Cl.
*H01L 33/00* (2006.01)

(52) U.S. Cl. ....................... 257/102; 257/103; 257/101; 257/94; 257/E33.029

(58) Field of Classification Search ...................... None
See application file for complete search history.

(56) References Cited

U.S. PATENT DOCUMENTS

| 6,337,536 B1 | 1/2002 | Matsubara et al. |
| 6,509,651 B1 * | 1/2003 | Matsubara et al. ......... 257/461 |
| 6,514,782 B1 | 2/2003 | Wierer, Jr. et al. |
| 6,614,821 B1 | 9/2003 | Jikutani et al. |
| 2001/0032985 A1 | 10/2001 | Bhat et al. |

(Continued)

FOREIGN PATENT DOCUMENTS

JP 54-055390 5/1979

(Continued)

OTHER PUBLICATIONS

U.S. Appl. No. 10/899,000, filed Aug. 23, 2004.

(Continued)

*Primary Examiner*—Evan Pert
*Assistant Examiner*—Victor A. Mandala, Jr.
(74) *Attorney, Agent, or Firm*—McDermott Will & Emery LLP

(57) ABSTRACT

A light emitting device includes a nitride semiconductor substrate with a resistivity of 0.5 Ω·cm or less, an n-type nitride semiconductor layer and a p-type nitride semiconductor layer placed more distantly from the nitride semiconductor substrate than the n-type nitride semiconductor layer at a first main surface side of the nitride semiconductor substrate, and a light emitting layer placed between the n-type nitride semiconductor layer and the p-type nitride semiconductor layer, wherein one of the nitride semiconductor substrate and the p-type nitride semiconductor layer is mounted at the top side which emits light and the other is placed at the down side, and a single electrode is placed at the top side. Therefore, there is provided a light emitting device which has a simple configuration thereby making it easy to fabricate, can provide a high light emission efficiency for a long time period, and can be easily miniaturized.

162 Claims, 24 Drawing Sheets

U.S. PATENT DOCUMENTS

| | | | |
|---|---|---|---|
| 2003/0207146 A1* | 11/2003 | Sasaki et al. | 428/627 |
| 2004/0012032 A1* | 1/2004 | Toda et al. | 257/103 |
| 2004/0041256 A1* | 3/2004 | Takehara et al. | 257/712 |
| 2004/0048068 A1* | 3/2004 | Yano et al. | 428/411.1 |
| 2005/0048068 A1* | 3/2004 | Yano et al. | 428/411.1 |
| 2004/0180470 A1* | 9/2004 | Ramano et al. | 438/106 |
| 2004/0251471 A1 | 12/2004 | Dwilinski et al. | |
| 2004/0261692 A1* | 12/2004 | Dwilinski et al. | 117/84 |
| 2005/0029539 A1* | 2/2005 | Toda et al. | 257/103 |
| 2005/0062060 A1* | 3/2005 | Nagai et al. | 257/100 |
| 2005/0087753 A1* | 4/2005 | D'Evelyn et al. | 257/98 |
| 2006/0157717 A1* | 7/2006 | Nagai et al. | 257/81 |

FOREIGN PATENT DOCUMENTS

| | | |
|---|---|---|
| JP | 54-55390 | 5/1979 |
| JP | 05-251739 | 9/1993 |
| JP | 06-291368 | 10/1994 |
| JP | 10-097200 | 4/1998 |
| JP | 10-097201 | 4/1998 |
| JP | 10-117016 | 5/1998 |
| JP | 10-223021 | 8/1998 |
| JP | 10-335701 | 12/1998 |
| JP | 11-054801 | 2/1999 |
| JP | 11-74558 | 3/1999 |
| JP | 11-074558 | 3/1999 |
| JP | 11-186662 | 7/1999 |
| JP | 11-191533 | 7/1999 |
| JP | 11-220176 | 8/1999 |
| JP | 11-233893 | 8/1999 |
| JP | 11-317546 | 11/1999 |
| JP | 2000-012900 A | 1/2000 |
| JP | 2000-044400 | 2/2000 |
| JP | 2000-44400 | 2/2000 |
| JP | 2000-49374 | 2/2000 |
| JP | 2000-049374 | 2/2000 |
| JP | 2000-049374 A | 2/2000 |
| JP | 2000-077713 | 3/2000 |
| JP | 2000-223743 | 8/2000 |
| JP | 2000-223751 | 8/2000 |
| JP | 2000-286457 | 10/2000 |
| JP | 2001-237458 | 8/2001 |
| JP | 2001-326425 A | 11/2001 |
| JP | 2002-16311 | 1/2002 |
| JP | 2002-026394 | 1/2002 |
| JP | 2002-353516 | 6/2002 |
| JP | 2002-319705 | 10/2002 |
| JP | 2002-353516 | 12/2002 |
| JP | 2003-008083 | 1/2003 |
| JP | 2003-46124 | 2/2003 |
| JP | 2003-046124 | 2/2003 |
| JP | 2003-069075 | 3/2003 |
| JP | 2003-69075 | 3/2003 |
| JP | 2003-086843 | 3/2003 |
| JP | 2003-101081 | 4/2003 |
| JP | 2003-101081 A | 4/2003 |
| JP | 2003-110152 | 4/2003 |
| JP | 2003-124115 A | 4/2003 |
| JP | 2003-165799 A | 6/2003 |
| JP | 2003-183100 A | 7/2003 |
| JP | 2003-218401 | 7/2003 |
| JP | 2005-210053 | 8/2005 |

OTHER PUBLICATIONS

U.S. Appl. No. 10/923,046, filed Aug. 23, 2004.
SEI World, 2002, vol. 298, pp. 3 (English Translation of p. 3).
"Advantages of Our Gallium Nitride Substrate" SEI World, Jul. 2002, vol. 298, pp. 3.
SEI World, May 2003, vol. 308, pp. 3.
SEA World, Jul. 2002, vol. 298, p. 3, Sumitomo Electric.
SEA World, May 2003, vol. 308, p. 3, Sumitomo Electric.

* cited by examiner

380nm LIGHT OUTPUT

GaN SUBSTRATE
(COMPARISON SAMPLE L,
SUBSTRATE THICKNESS: 1mm)

380nm LIGHT INPUT

380nm LIGHT OUTPUT

380nm LIGHT INPUT (INVENTION SAMPLE J, GaN SUBSTRATE
INVENTION SAMPLE K
SUBSTRATE THICKNESS 100 μm)

EXEMPLARY OFF-ANGLE DISTRIBUTION
IN GaN SUBSTRATE (20mm × 20mm)

PITCH 3 μm

TOTAL REFLECTIVITY 86%

TOTAL REFLECTIVITY 67%

40% REFLECTION AT Ni/Au

LIGHT EMITTING DEVICE

BACKGROUND OF THE INVENTION

1. Field of the Invention

The invention relates to light emitting devices and more particularly to light emitting devices formed from nitride semiconductors. Hereinafter, "a light emitting device" refers to "a light emitting element" or "a mounted light emitting element construction equipped with a light emitting element", unless otherwise mentioned.

2. Description of the Background Art

White light emitting diodes (LED) have been widely utilized for illumination for the display devices of portable information terminals, etc., including portable phones. In the case of using LEDs as the light source of the display device of a portable information terminal, it is required to enhance the light emission performance. Therefore, there has been suggested a configuration for preventing light emitting unevenness in fabricating a side-view type LED equipped with a GaN-type light emitting device which has been assembled using a sapphire substrate and n-down (p-top) mounted (see Japanese Laid-Open Patent Publication No. 2000-223751). According to this suggestion, there is disclosed that two electrodes at opposite corners of the rectangular shape, in a plane view of the light emitting device from the light extracting side (top side), are placed such that they are lied along the thickwise direction of the side-view type LED, namely they stand at the corners.

Further, there is a possibility that LEDs will be utilized for illumination for large spaces or large areas. There is a need to increase the light output efficiency of LEDs either for large area illumination or for application to portable information terminals.

FIG. 51 illustrates the construction of a GaN-type LED which has been currently suggested (see Japanese Laid-Open Patent Publication No. 2003-8083). In this GaN-type LED, an n-type GaN layer 102 is provided on a sapphire substrate 101, and a quantum well construction 103 is formed between n-type GaN layer 102 and a p-type GaN layer 104. Light emission occurs at this quantum well construction 103. On p-type GaN layer 104, a p-electrode 105 is formed such that it is in ohmic-contact therewith. Further, on n-type GaN layer 102, an n-electrode 106 is formed such that it is in ohmic-contact therewith.

These p-electrode 105 and n-electrode 106 are connected to a mounting member 109 through solder balls 107, 108. Mounting member (submount member) 109 is formed from a Si substrate and is provided with a circuit for protecting the light emitting device from surge voltages from the outside. Namely, considering that main factors of circuit failures for III semiconductors such as Ga, Al and In are surge voltages such as transient voltages or electrostatic discharge, an electric power shunting circuit for protecting the light emitting device is formed from Zener diodes, in order to prevent the light emitting device from being subjected to large forward currents and reverse currents. The protection from surge voltages will be described in detail later.

The aforementioned GaN-type LED is characterized in that (a1) p-type GaN layer 104 is down-mounted and (a2) n-electrode layer 106 is formed on n-type GaN layer 102. This GaN-type LED has a significantly complicated construction as can be seen in FIG. 51. The reason that (a2) the n-electrode layer is formed on n-type GaN layer 102, which makes the construction complicated, is that sapphire substrate 101 is an insulator and the n-type electrode can not be provided on the sapphire substrate.

For light emitting devices using GaAs-type, GaP-type, and GaN-type compound semiconductors, as well as the aforementioned light emitting device using a sapphire substrate, there has often been suggested that a circuit for protecting the light emitting device from transient voltages and electrostatic discharge is provided in conjunction with the light emitting device (see Japanese Laid-Open Patent Publication Nos. 2000-286457, 11-54801, and 11-220176). Particularly, GaN-type compound semiconductors have small reverse withstand voltages such as about 50 V, and also have forward withstand voltages of only about 150 V. Therefore, it is considered important to provide aforementioned electric power shunting circuit for protection. Namely, the aforementioned GaN-type device, etc., is formed on a submount Si substrate and on the Si substrate a protection circuit including Zener diodes is provided. A plurality of suggestions of protection circuits as described above is proof of that main factors of circuit failures for III semiconductors such as Ga, Al and In are surge voltages such as transient voltages or electrostatic discharge.

Besides the aforementioned light emitting device provided with a protection circuit, there has been known an example where a GaN-type light emitting device is formed on a conductive SiC substrate. Namely, there has been widely known LEDs configured to have a laminated-layer construction as follows to emit light from the p-type GaN layer: (an n-electrode on the back surface of a SiC substrate/ SiC substrate/n-type GaN layer/quantum well laminated-layer construction (light emitting layer)/p-type GaN layer/ p-electrode).

On the other hand, the aforementioned GaN-type LED using a sapphire substrate illustrated in FIG. 51 has a complicated construction, which unavoidably increases the fabrication cost. Since it is necessary that LEDs are inexpensive in order to develop demand in various illumination applications, the aforementioned construction is not preferable. Further, since p-electrode 105 and n-electrode 106 are placed on the down-mounting surface side, the areas of the electrodes, particularly the area of the p-electrode, is restricted. In order to flow large currents to provide high outputs, it is desirable that the p-electrode has a large area. However, the construction illustrated in FIG. 51 restricts the areas, thus restricting the light output. Further, in view of discharging heat generated in association with currents, it is not preferable that the two electrode layers are placed on one surface.

Further, there is a large resistance to currents flowing in the direction parallel to n-type GaN layer 102, which may cause heat generation and, therefore, increases in the power consumption. Particularly, in the case where the thickness of the n-type GaN layer is reduced in order to shorten the film formation processes, the yield of exposure of the n-type GaN film is degraded, in addition to the aforementioned heat generation and power consumption increases.

Further, it can be said for light emitting devices in general that the heat radiating area is restricted and also the heat resistance (the temperature rise due to unit energy introduced per unit area) is large, and therefore the injected current per single light emitting device can not be made large. Particularly, in the case of using a sapphire substrate, the area of the p-electrode is restricted as previously described and it is usually to perform heat designing with little margin.

Further, since the aforementioned GaN-type LED using a sapphire substrate restricts the heat radiating area, it unavoidably becomes necessary to utilize a configuration including intricate comb-shaped p-electrode and n-electrode for increasing the contact area therebetween. It is not easy to manufacture these comb-shaped electrodes, thereby certainly increasing the manufacture cost.

As previously described, the design of heat conditions is basically important for light emitting devices. When an attempt is made to generate high outputs, the aforementioned heat conditions introduce restrictions thereto, and therefore it is unavoidably required to use complicated electrodes in order to alleviate them as much as possible.

Further, there is a problem as follows. When a GaN-type light emitting device formed on a sapphire substrate is down-mounted and the back surface of the sapphire substrate is used as the light emitting surface, light with a predetermined incident angle or greater will be subjected to total reflection at the boundary between the GaN layer and the sapphire substrate after propagating through the GaN layer and is not emitted to outside, since GaN has a refractive index of about 2.4 and the sapphire substrate has a refractive index of about 1.8. Namely, light with an incident angle θ equal to or higher than sin−1(1.8/2.4)≈4.2° will be confined within the GaN layer and will not be emitted to the outside. This reduces the light emitting efficiency at the main surface of the sapphire substrate. This problem of the light emitting efficiency is important. However, there are still other problems. The aforementioned light subjected to total reflection will propagate through the GaN layer and then is emitted from the side portions of the GaN layer. The energy density of the light emitted from the side portions will be high, since the ratio of the amount of the aforementioned totally-reflected light is considerable and also the GaN layer has a small thickness. This will damage resin which is placed at the side portions of the GaN layer and thus irradiated with the light. This will induce a problem of shortening the life of the light emitting device.

Further, with a GaN-type LED having a construction of (an n-electrode on the back surface of a SiC substrate/SiC substrate/n-type GaN layer/quantum well laminated-layer construction (light emitting layer)/p-type GaN layer/p-electrode) which emits light from the p-layer side, light can not be efficiently emitted to the outside because of the high light absorption at the p-electrode. If an attempt is made to reduce the coverage ratio of the p-electrode, namely increase the opening ratio, in order to increase the amount of emitted light, currents can not be flowed through the entire p-type GaN layer since the p-type GaN layer has a high electric resistance. Therefore, light emission can not be activated through the entire quantum well construction, thereby decreasing the light emission output. Furthermore, the electric resistance will be increased, which will induce problems of heat generation and power supply capacity. Also, if an attempt is made to increase the thickness of the p-type GaN layer in order to uniformly flow currents through the entire p-type GaN layer, this will restrict the output since this p-type GaN layer will absorb a large amount of light.

SUMMARY OF THE INVENTION

It is an object of the present invention to provide light emitting devices which have a simple configuration thereby making it easy to fabricate, can provide a high light emission efficiency for a long time period, and can be easily miniaturized.

A light emitting device according to the present invention includes a nitride semiconductor substrate with a resistivity of 0.5 Ω·cm or less, an n-type nitride semiconductor layer and a p-type nitride semiconductor layer placed more distantly from the nitride semiconductor substrate than the n-type nitride semiconductor layer at a first main surface side of the nitride semiconductor substrate, and a light emitting layer placed between the n-type nitride semiconductor layer and the p-type nitride semiconductor layer. One of the nitride semiconductor substrate and the p-type nitride semiconductor layer is mounted at the top side which emits light and the other is placed at the down side, and a single electrode is placed at the top side.

In the aforementioned light emitting device, a single electrode is placed at the top side for emitting light, which enables extracting a large amount of light without causing the electrode to interfere the light emission. Further, it is necessary to place only a single electrode, which enables reducing the thicknesses of LEDs, particularly the thicknesses of side-view type LEDs. This enables miniaturization of portable information terminals including portable phones. A pad electrode may be placed in combination with a single electrode. When these electrodes are formed in a single area in a plane view, they are regarded as a single electrode.

With the aforementioned placement, when the p-electrode side is down-mounted, the back surface side of the n-type nitride semiconductor substrate serves as the light emitting surface. Therefore, in the case of using a GaN substrate as the n-type nitride semiconductor substrate, a small n-electrode can be provided since the GaN substrate has a lower electric resistance, which enables generating higher light outputs with the same electric power injection. Namely, in the case where the p-electrode side is down-mounted, the n-electrode is provided on the back surface (second main surface) of the nitride semiconductor substrate having a low electric resistance, and therefore even when the n-electrode is provided with a low coverage ratio namely a large open ratio, currents can be flowed through the entire nitride semiconductor substrate. This may reduce the ratio of light absorbed at the emitting surface, thereby increasing the light emission efficiency. It goes without saying that light may be emitted from the side surfaces not only from the second main surface. This is applied to the following light emitting devices.

Also, when the current is not significantly large, the p-type nitride semiconductor layer side may be used as the light emitting surface.

Further, the excellent conductivity of the GaN substrate eliminates the necessity of providing a protection circuit against surge voltages and also significantly enhances the withstand voltage.

Further, complicated manufacture processes are not required, thereby reducing the manufacture cost.

The light emitting device is based on the premise that the aforementioned nitride semiconductor substrate is of an n-conductive type. Further, the nitride semiconductor "substrate" refers to a plate-type member having an appropriate thickness which can be independently carried and is distinguished from a "film" and "layer" which are difficult to independently carry without changing their shapes. This is applied to a GaN substrate and an AlN substrate which will be described later.

A light emitting device according to the present invention includes a nitride semiconductor substrate GaN substrate with a dislocation density of $10^8/cm^2$ or less, an n-type $Al_xGa_{1-x}N$ layer (x is within the range of 0 to 1) which is an n-type nitride semiconductor layer and a p-type $Al_xGa_{1-x}N$ layer (x is within the range of 0 to 1) placed more distantly from the GaN substrate than the n-type $Al_xGa_{1-x}N$ layer at a first main surface side of said GaN substrate and a light emitting layer placed between the n-type $Al_xGa_{1-x}N$ layer and the p-type $Al_xGa_{1-x}N$ layer. An n-electrode is provided in contact with a second main surface of the GaN substrate which is the main surface at the opposite side from the first main surface, and a p-electrode is provided in contact with the p-type $Al_xGa_{1-x}N$ layer, one of the n-electrode and the p-electrode is mounted at the top side which emits light and the other is mounted at the down side, and the electrode placed at the top side is constituted from a single electrode.

With this construction, a single electrode is placed at the top side for emitting light, which enables extracting a large amount of light without causing the electrode to interfere the light emission. Further, it is necessary to place only a single electrode, which enables reducing the sizes of LEDs, and particularly reducing the thicknesses of LEDs. This enables miniaturization of portable information terminals.

It is easy to lower the electric resistance of the GaN substrate. Therefore, an excellent crystallinity due to the dislocation density of the GaN substrate which is $10^8/cm^2$ or lower, and a high opening ratio due to the p-down mounting, in addition to the effects and advantages of the aforementioned light emitting device, can increase the light output from the second main surface.

It goes without saying that when there is no need to flow large currents, the light emitting device can be p-top mounted (n-down mounted) to provide advantages of increased withstand voltages, suppressed heat generation, elimination of the necessity of providing a protection circuit against surge voltages and reduction in the manufacture cost.

Further, the continuity of the refractive index can be maintained, which prevents the occurrence of the aforementioned problem of total reflection.

A light emitting device includes a nitride semiconductor AlN substrate with a heat conductivity of 100 W/(m·K) or more, an n-type $Al_xGa_{1-x}N$ layer (x is within the range of 0 to 1) which is an n-type nitride semiconductor layer and a p-type $Al_xGa_{1-x}N$ layer (x is within the range of 0 to 1) placed more distantly from the AlN substrate than the n-type $Al_xGa_{1-x}N$ layer at a first main surface side of the AlN substrate, and a light emitting layer placed between the n-type $Al_xGa_{1-x}N$ layer and the p-type $Al_xGa_{1-x}N$ layer. An n-electrode is provided in contact with a second main surface of the AlN substrate which is the main surface at the opposite side from the first main surface, and a p-electrode is provided in contact with the p-type $Al_xGa_{1-x}N$ layer, one of the n-electrode and the p-electrode is mounted at the top side which emits light and the other is mounted at the down side, and the electrode placed at the top side is constituted from a single electrode.

AlN has a significantly high heat conductivity and an excellent heat radiating ability. Therefore, heat can be transferred from the aforementioned p-type $Al_xGa_{1-x}N$ layer to a lead frame, etc., to suppress temperature rises in the light emitting device. Further, heat can be also radiated from the aforementioned AlN substrate, thereby contributing to the suppression of temperature rises. The light emitting device is based on the premise that the aforementioned AlN substrate is a conductive AlN substrate into which impurities have been injected to provide conductivity. In addition to the improvement of performance achieved by the aforementioned high heat conductivity, the effects achieved by the aforementioned light emitting device according to the present invention can be obtained.

A light emitting device according to the present invention other than the aforementioned device includes a nitride semiconductor substrate with a resistivity of 0.5 Ω·cm or less, an n-type nitride semiconductor layer and a p-type nitride semiconductor layer placed more distantly from the nitride semiconductor substrate than the n-type nitride semiconductor layer at a first main surface side of the nitride semiconductor substrate, and a light emitting layer placed between the n-type nitride semiconductor layer and the p-type nitride semiconductor layer. The nitride semiconductor substrate is mounted at the down side and the p-type nitride semiconductor layer is mounted at the top side which emits light.

With the aforementioned construction, the light emitting device can be p-top mounted (n-down mounted) to provide advantages of increased withstand voltages, suppressed heat generation, elimination of the necessity of providing a protection circuit against surge voltages and reduction in the manufacture cost. Further, the continuity of the refractive index can be maintained, which prevents the occurrence of the aforementioned problem of total reflection. As previously describe, the aforementioned light emitting device may be either a light emitting element (chip) itself or a mounted light emitting element construction equipped with a light emitting element.

A light emitting device according to the present invention other than the aforementioned devices includes a GaN substrate with a dislocation density of $10^8/cm^2$ or less, an n-type nitride semiconductor layer and a p-type nitride semiconductor layer placed more distantly from the GaN substrate than the n-type nitride semiconductor at a first main surface side of the GaN substrate, and a light emitting layer placed between the n-type nitride semiconductor layer and the p-type nitride semiconductor layer. The GaN substrate is mounted at the down side and the p-type nitride semiconductor layer is provided at the top side which emits light.

The aforementioned construction enables providing high light emission efficiency at high current range, which is specific to low dislocation densities. Further, similarly to the aforementioned p-top mounted light emitting device, this construction can provide advantages of increased withstand voltages, suppressed heat generation, elimination of the necessity of providing a protection circuit against surge voltages and reduction in the manufacture cost. Further, the continuity of the refractive index can be maintained, which prevents the occurrence of the aforementioned problem of total reflection. Similarly to aforementioned, this light emitting device may be either a light emitting element (chip) itself or a mounted light emitting element construction equipped with a light emitting element.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Next, embodiments of the present invention will be described using the drawings.

First Embodiment

In the first embodiment, side-view type LEDs were fabricated using light emitting devices p-top (n-down) mounted on GaN substrates and including an n-electrode formed on the back side of the GaN substrate according to the present embodiment. Further, side-view type LEDs were fabricated using conventional light emitting devices. Then, comparison was made therebetween in terms of the size, light output and luminance.

(Invention Sample A)

Figure 1:
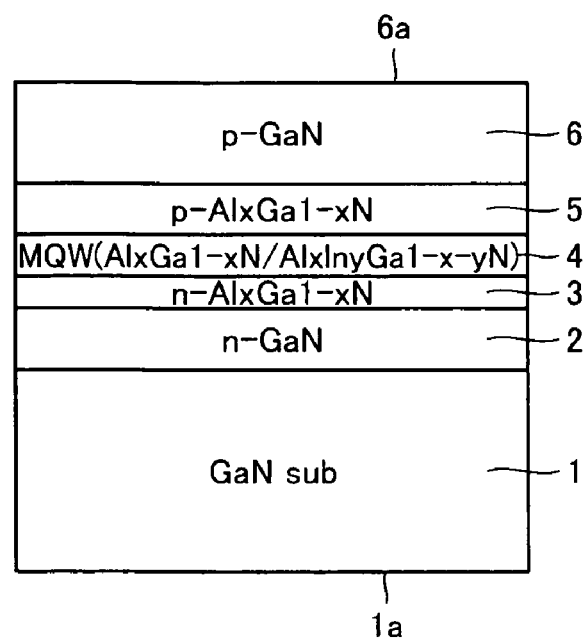
FIG. 1 is a view illustrating the laminated-layer construction of an invention sample A according to a first embodiment of the present invention.

Referring to FIG. 1, there is formed a laminate construction of an n-type GaN layer 2/an n-type $Al_xGa_{1-x}N$ layer 3/a multi quantum well layer (active layer) 4 consisting of $(Al_xGa_{1-x}N/Al_xIn_yGa_{1-x-y}N)_m$/an p-type $Al_xGa_{1-x}N$ layer 5/an p-type GaN layer 6 which have been formed on the surface (first main surface) of a GaN substrate 1 by epitaxial film formation in order from the bottom side. The multi quantum well layer may be formed from $(Ga_xN/In_xGa_{1-x}N)_m$. The number of laminated sets is usually 3, but may be more. The light emitting surface is the surface of the p-type GaN layer 6 and p-electrodes which will be described later will be formed on this surface 6a. Further, an n-electrode will be formed on the back side 1a of the GaN substrate.

Next, the fabrication method of the aforementioned light emitting device of the aforementioned invention sample A will be described.

(1) A GaN off substrate deviated by 0.5° from the c-plane was used. The GaN substrate had a resistivity of 0.01 Ω·cm, a dislocation density of $1E7/cm^2$ and a thickness of the substrate was 400 µm. The thickness of the aforementioned GaN substrate was decreased to 200 µm before the formation of the n-electrode which will be described subsequently.

(2) A GaN buffer layer (not shown in FIG. 1)/Si-doped n-type GaN layer 2/Si-doped n-type clad $Al_{0.2}Ga_{0.8}N$ layer 3/three sets of MQW (Multi-Quantum Well) layer 4 consisting of GaN and $In_{0.15}Ga_{0.85}N$/Mg-doped p-type clad $Al_{0.2}Ga_{0.8}N$ layer 5/Mg-doped p-type GaN layer 6 were epitaxially grown on the Ga surface of a GaN substrate by MOCVD (Metal Organic Chemical Vapor Deposition) (FIG. 1).

(3) The internal quantum efficiency was 50%, which was calculated for convenience by comparing the PL (Photo Luminance) intensity at a low temperature of 4.2 K and an emission wavelength of 450 nm and the PL intensity at a room temperature of 298K and an emission wavelength of 450 m.

(4) This wafer was subjected to an activation process to lower the resistance of Mg-doped p-type layer 5. Mg-doped p-type $Al_{0.2}Ga_{0.8}N$ layer 5 and Mg-doped p-type GaN layer 6 had carrier concentrations of $5E17/cm^3$ and $1E18/cm^3$ respectively which were determined by Hall measurement.

(5) As P-electrodes, transparent electrodes 12 of 300 µm☐ were formed by forming Ni having a thickness of 4 nm and Au having a thickness of 4 nm on p-type GaN layer 6 to form a two-layers construction with a pitch L2 of 350 µm (see FIG. 2 and FIG. 3) by photolithography technique and vapor deposition. This was subjected to a heating process to lower the contact resistance to 5E-4 Ω·cm².

Further, by photolithography technique and vapor deposition, pad electrodes (not shown) with a diameter of 100 µm were formed at the centers of transparent electrodes 12 with a pitch of 350 µm.

Figure 2:
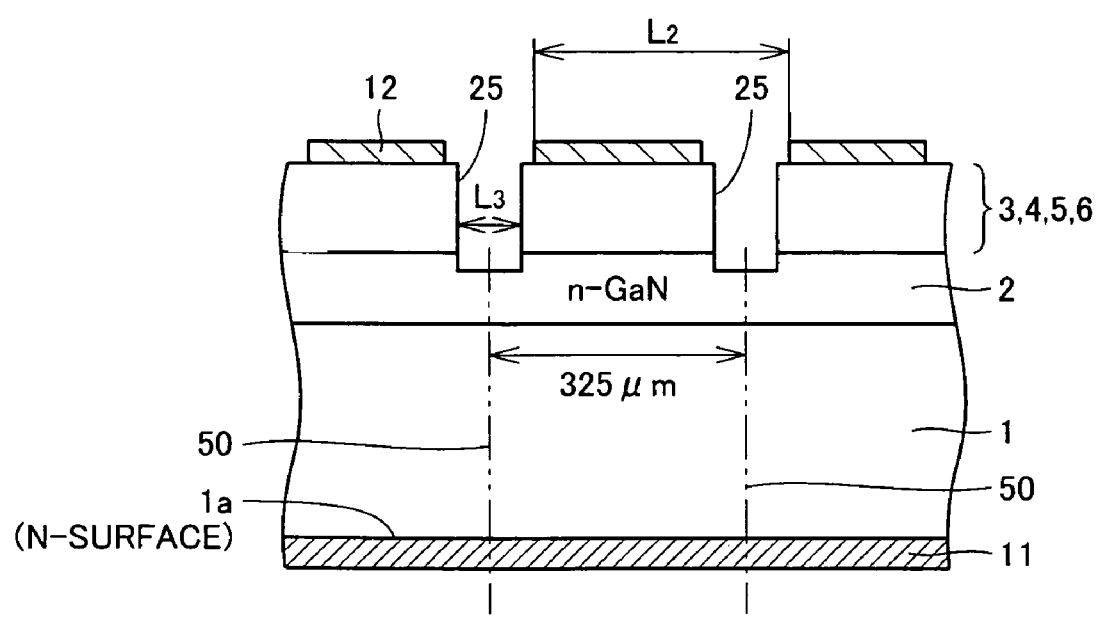
FIG. 2 is a view illustrating device separation slots provided in a wafer during the fabrication of invention sample A.

(6) Referring to FIG. 2, an n-electrode 11 was formed over the entire surface of N-surface 1a of GaN substrate 1. As the n-electrode, a laminated layer construction of Ti 20 nm/Al 100 mm/Ti 200 nm/Au 200 nm was formed in this order on the GaN substrate. The n-electrodes had a diameter D and were placed at the centers of the devices with a pitch L2. This was subjected to a heating process in an inert atmosphere to reduce the contact resistance to below 1E-5 Ω·cm².

Figure 3:
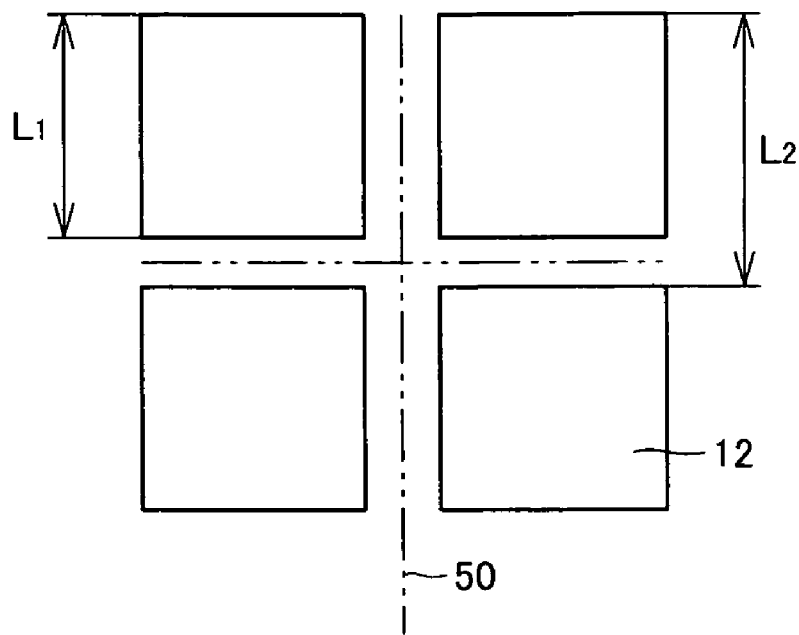
FIG. 3 is a plane view of FIG. 2.

(7) This wafer was etched from the Mg-doped p-type layer to the Si-doped n-type layer, using Cl-type gas, by photolithography technique and RIE, as illustrated in FIG. 2 and FIG. 3 to form device separating slots 25 with a width L3 and a predetermined shape.

(8) Then, the construction was scribed to separate this along cleavage planes 50. The chipped constructions were made to be light emitting devices. The resultant light emitting devices had a size of 325 µm☐. Since the MQW light emitting portion had an area of 0.09 mm² and the p-side pad electrode had a diameter of 100 µm, the ratio of the portion of the light extracting surface which was not covered with the p-pad electrode (opening ratio) was 91%.

(Side View-Type LED)

Figure 4:
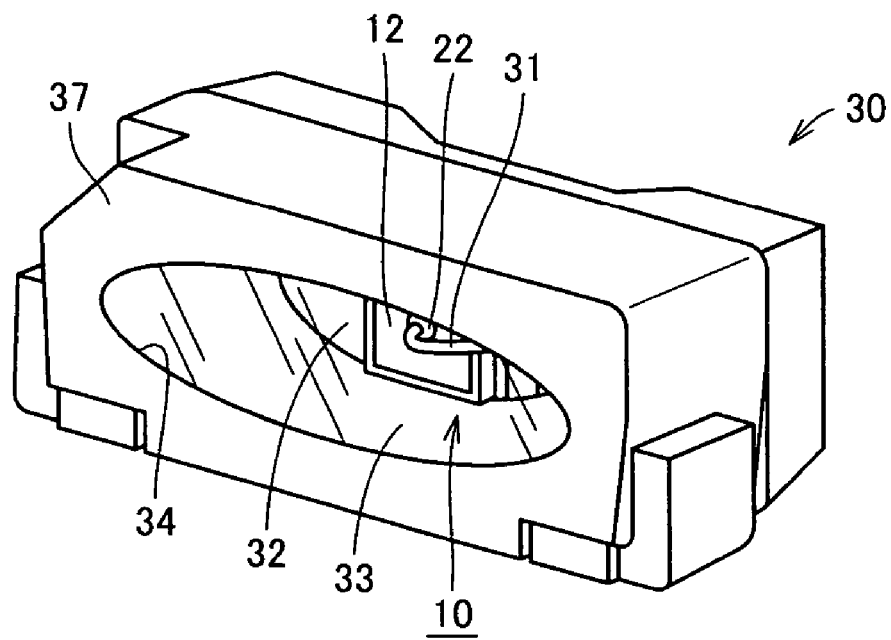
FIG. 4 is a perspective view illustrating a side-view type LED equipped with a light emitting device of invention sample A.
Figure 5:
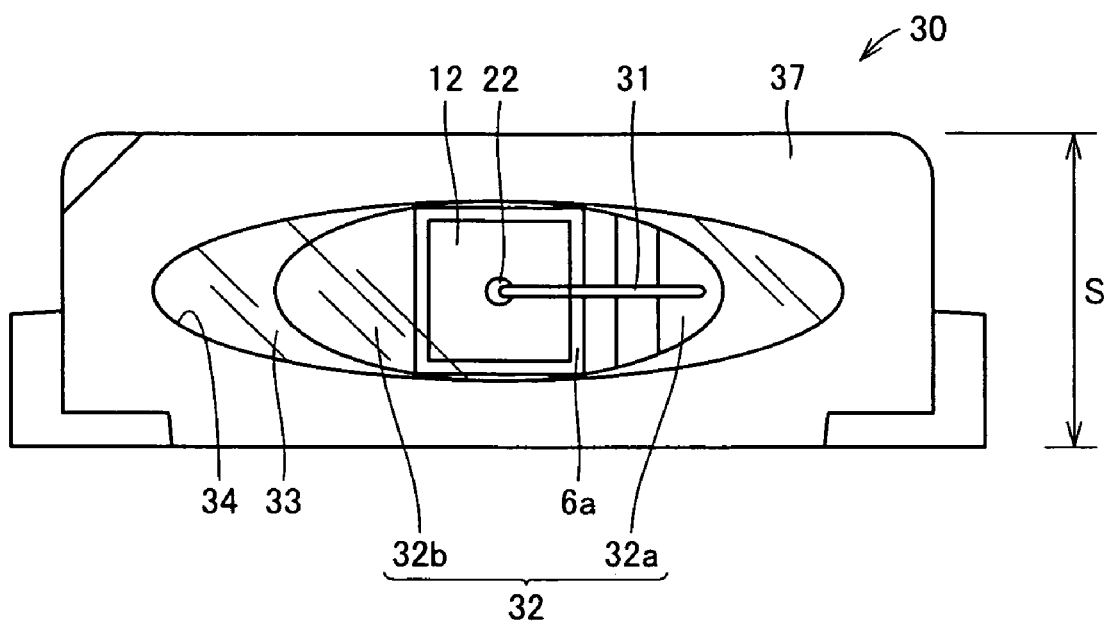
FIG. 5 is a front view of the side-view type LED of FIG. 4.

Referring to FIG. 4 and FIG. 5, this side-view type LED is equipped with a light emitting device (chip) fabricated according to the aforementioned fabricating method. Light emitting device 10 is placed such that the sides of the rectangular shape are lied horizontally. An Au line 31 is electrically connected to p-side pad electrode 22 placed at the center of the rectangular shape. The other end of Au line 31 is electrically connected to an electrode of a lead portion 32b protruded towards the light emitting surface. The n-electrode provided on the back surface of the GaN substrate is contacted with and electrically connected to a chip placing portion 32a of the lead frame. Lead frame 32 is provided with a concave-shaped reflective mirror for reflecting light emitted backward from the chip frontward. Preferably, chip 10 is placed at the focal point of the concave-shaped curved surface.

In the case where this side-view type LED is employed as a illumination light source of the display screen of a portable information terminal, the thickness or the height S will weigh.

(9) As previously described, the aforementioned light emitting device was mounted at the center of the lead frame including the reflective mirror such that light would be extracted from the p-layer side. P-type pad electrode 22 was placed at the center of the device and there was no need to provide the n-electrode on the same side as the p-type pad electrode, namely the top side. Therefore, thickness S of the LED lamp after mounted could be made to be 0.5 mm, even in consideration of the space required for wire bonding.

(10) In mounting, in order to enhance heat radiation from the light emitting device, the light emitting device was mounted such that the entire surface of the GaN substrate was in contact with the mounting portion through an adhesive. An Ag-type adhesive with a high heat conductivity was employed as the adhesive, and a CuW-type lead frame with a high heat conductivity was selected as the lead frame. With this way, the resultant heat resistance was 8° C./W.

(11) Further, a fluorescent material was mounted on the n-electrode side and then the chip and Au line 31 were resin-sealed with an epoxy resin 33 to form a white-light lamp. For example, this lamp was designed such that the fluorescent material would generate yellow fluorescence, on receiving blue light emitted from the chip to emit white light from the entire construction. As the fluorescent material, a fluorescent material which generated 180 lm per 1 W of light output of 450 nm was employed. Resin 33 facing with a side window 34 opened at a side surface of a cabinet 37 had an elliptical curved shape and had a curved surface which allowed light emitted from the chip to spread in the direction of the longer diameter of the side window and prevented the light from spreading in the direction of the shorter diameter.

(Comparison Sample B)

Figure 6:
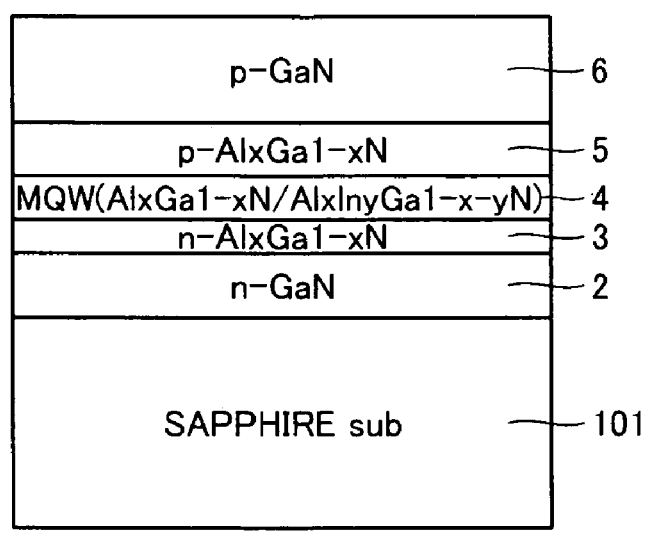
FIG. 6 is a view illustrating the laminated-layer construction of a comparison sample B according to the first-embodiment of the present invention.

Referring to FIG. 6, a conventional side-view type LED is equipped with a light emitting device of this comparison sample B. The laminated-layer construction of the light emitting device of comparison sample B is the same as that of invention sample A and is an n-type GaN layer 2/an n-type $Al_xGa_{1-x}N$ layer 3/a multi quantum well layer (active layer) 4 consisting of $(Al_xGa_{1-x}N/Al_xIn_yGa_{1-x-y}N)_m$/a p-type $Al_xGa_{1-x}N$ layer 5/a p-type GaN layer 6 which have been formed on a sapphire substrate 101. The multi quantum well layer may be formed from $(Ga_xN/In_xGa_{1-x}N)_m$. The light emitting surface is surface 6a of p-type GaN layer 6 similarly to invention sample A and p-electrodes will be formed on this surface 6a. However, since sapphire substrate 101 is an insulator, an n-electrode can not be provided on the sapphire substrate. Therefore, the edge portion of the laminate construction is cut away from surface 6a to the inside of n-type GaN layer 2 to expose n-type GaN layer 2 and then an n-electrode is provided on the exposed surface of n-type GaN layer 2.

Next, the fabrication method of the aforementioned light emitting device of comparison sample B will be described in detail.

(1) An insulating off sapphire substrate 101 deviated by 0.2° from the c-plane was used. The thickness of the substrate was 400 μm. Similarly to invention sample A, the thickness was decreased to 200 μm before the formation of the electrodes.

(2) to (4) The same processes as (2) to (4) of invention sample A.

Figure 7:
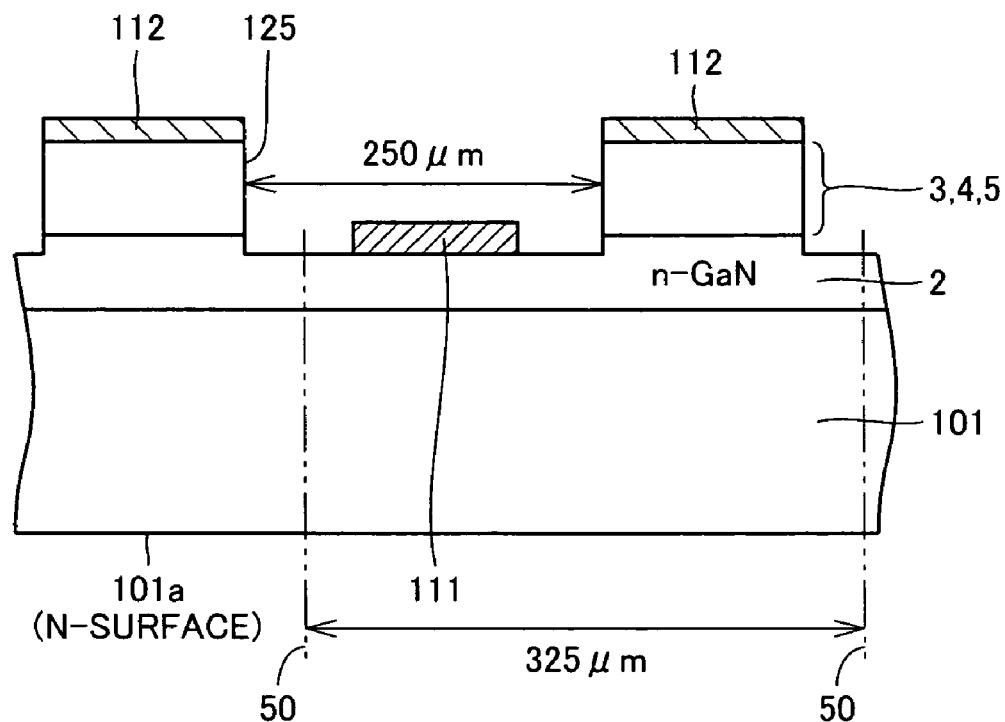
FIG. 7 is a view illustrating device separation slots provided in a wafer during the fabrication of comparison sample B.
Figure 8:
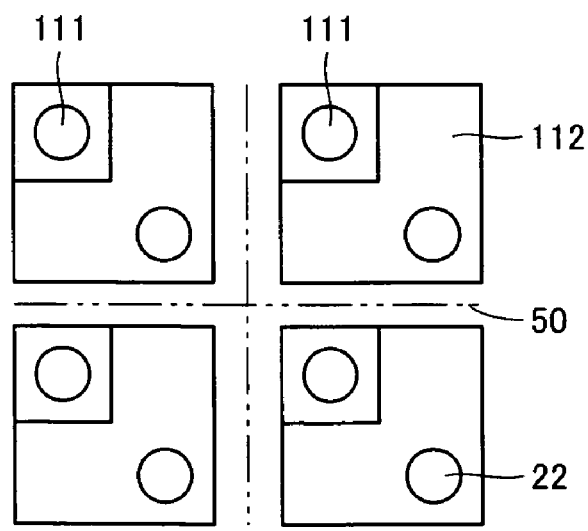
FIG. 8 is a plane view of FIG. 7.

(5) In comparison sample B, the substrate is an insulator and the N-electrode must be provided on the same side as the p-electrode, namely the grown-film side. Thus, the wafer having the laminated-layer construction of FIG. 6 was etched from Mg-doped p-type layer 6 to Si-doped n-type layer 2 using Cl-type gas with photolithography technique and RIE (Reactive Ion Etching) to expose n-type GaN layer 2 for forming an n-electrode and form slots 125 for device separation similar to those of invention sample A (see FIG. 7 and FIG. 8). The devices had a size of 325 μm□ and p-electrodes 112 were formed on p-type GaN layer 6. The exposed portion of n-type GaN 2 had a shape of 150 μm□ per single device, in a plane view. On the exposed n-type GaN layer, n-electrodes 111 having a diameter of 100 μm were formed by photolithography technique and vapor deposition. The thickness, the heating process and the contact resistance were the same as those of invention sample A.

(6) and (7) The p-electrodes were formed as follows. In the device having a size of 325 μm□, the transparent electrode layer 112 was formed on the portion of p-type GaN layer 6 corresponding to the L-shaped portion other than the exposed portion 150 μm□ in the portion of 300 μm□, which was the portion other than the separation allowance required for device separation. The thickness, the heating process and the contact resistance were the same as those of the invention sample A. P-side pad electrodes having a diameter of 100 μm were formed near the centers of the transparent electrode layers.

(8) Then, the construction was scribed into predetermined shapes and the chipped constructions were made to be light emitting devices. The resultant light emitting devices had a size of 325 μm□. Since the MQW light emitting portion had an area of 0.0675 mm² and the p-side pad electrode had a diameter of 100 μm, the ratio of the portion of the light extracting surface which was not covered with the p-pad electrode (opening ratio) was 88%.

(Side View-Type LED)

Figure 9:
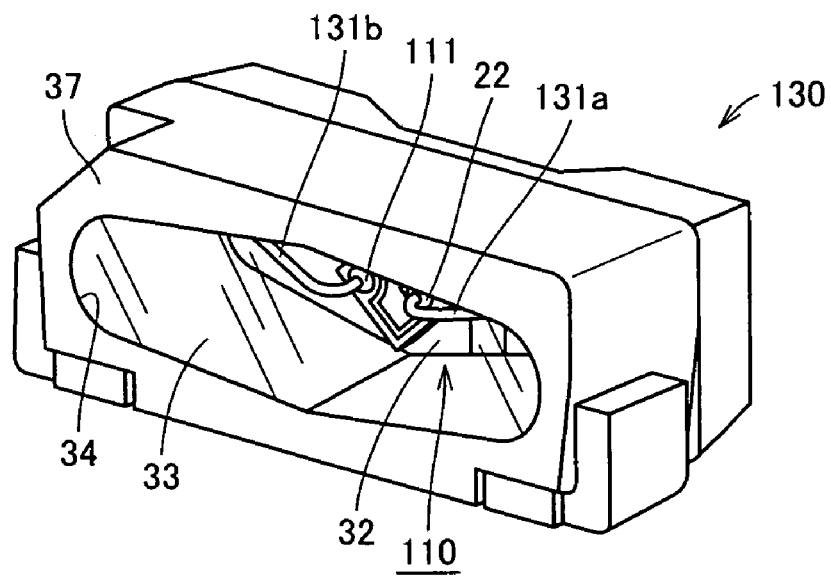
FIG. 9 is a perspective view illustrating a side-view type LED equipped with a light emitting device of comparison sample B.
Figure 10:
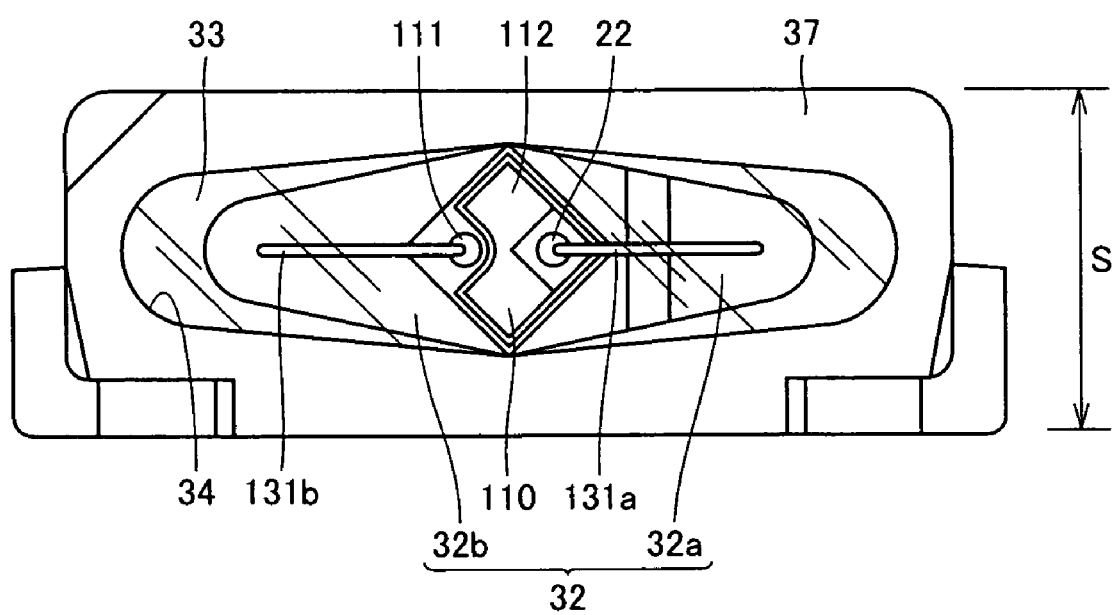
FIG. 10 is a front view of the side-view type LED of FIG. 9.

Referring to FIG. 9 and FIG. 10, this side view type LED 130 is equipped with a light emitting device (chip) 110 fabricated according to the aforementioned fabricating method. Light emitting device 10 is placed such that the diagonal line of the rectangular shape is lied horizontally. An Au line 31a is electrically connected to p-side pad electrode 22 placed at the center of the rectangular shape and an Au line 31b is electrically connected to n-electrode 111. The other end of Au line 31a is electrically connected to an electrode (not shown) of a lead portion 32b of lead frame 32 which was protruded towards the light emitting surface. The other end of Au line 31b is electrically connected to an electrode of a chip mounting portion 32a of the lead frame. Lead frame 32 is provided with a concave-shaped reflective mirror for reflecting light emitted backward from the chip frontward. Preferably, chip 10 is placed at the focal point of the concave-shaped curved surface.

(9) The light emitting device was mounted at the center of the lead frame including the reflective mirror such that light would be extracted from the p-side layer, as previously described. In this case, since the n-electrode and the p-electrode were both placed at the top side, the chip was installed such that it was inclined by 45° with respect to the longitudinal direction of the LED lamp, in order to provide a space for wire bonding of the respective electrodes. Therefore, even though the chip was mounted similarly to invention sample A, the thickness of the lamp was increased by the amount caused by the inclination of 45°, namely by 0.14 mm, and thickness S became 0.64 mm.

(10) In mounting, similarly to invention sample A, in order to enhance heat radiation from the light emitting device, the light emitting device was mounted such that the entire surface of the sapphire substrate of the light emitting device was in contact with the mounting portion. The adhesive and the lead frame material were the same as those of invention sample A. Concerning the heat resistance due to the difference of the substrate, the heat resistance was 10.4° C./W, which was 1.3 times that of invention sample A and the heat resistance was degraded.

(11) The same process as that of invention sample A to form a white-light lamp.

(Experiment and Result)

Figure 11:
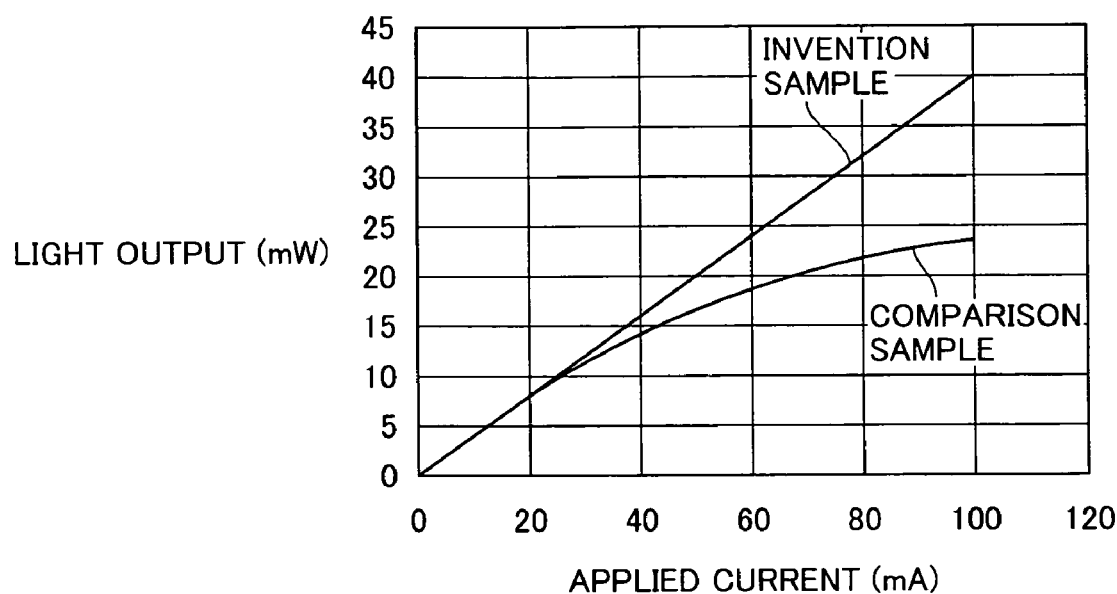
FIG. 11 is view illustrating the relation between the applied current and the light output, according to the first embodiment.
Figure 12:
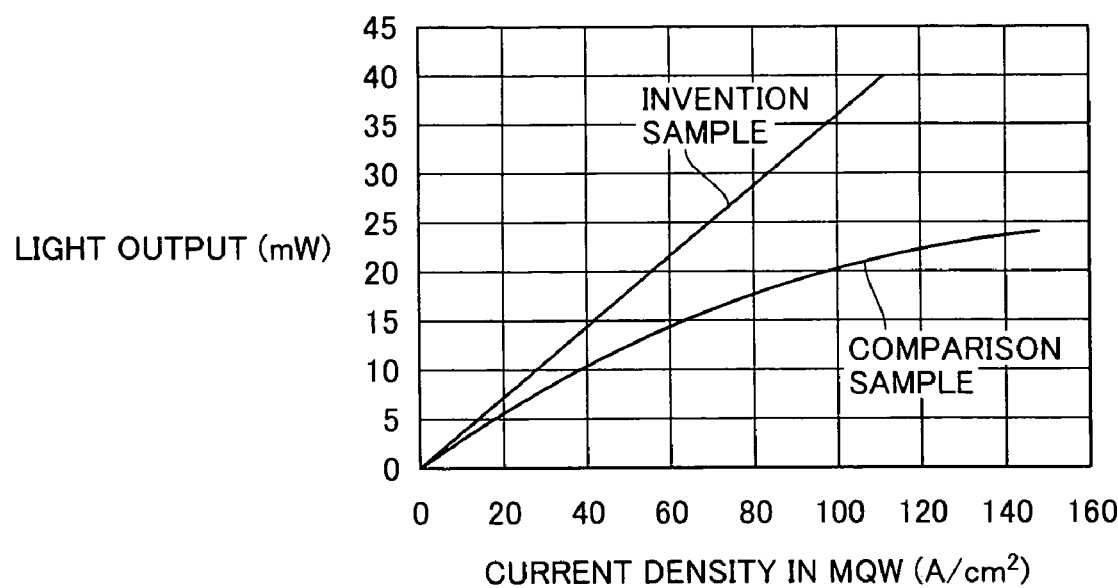
FIG. 12 is view illustrating the relation between the current density in the MQW and the light output, according to the first embodiment.

In order to make comparison in term of the output of blue light, invention sample A and comparison sample B were mounted in an integrating-sphere in the state where a fluorescent material was not installed (but resin-sealing was applied) and then a predetermined current was applied thereto to cause light emission. The emitted light was collected by a detector and the light output values output from the detector are illustrated in FIG. 11 and FIG. 12. In relatively ideal conditions where the current is injected into the MQW layer without leaking, there are relatively few non-radioactive recombinations in the MQW layer and the temperature rise in the device due to heat generation is low, the light output value proportionally increases with increasing applied current. For example, when a current of 20 mA was injected, invention sample A and comparison sample B both generated an output of 8 mW. Further, a fivefold current, namely 100 mA, was applied thereto, invention sample A generated a fivefold output, namely 40 mW, while comparison sample B generated an output of only 24 mW (FIG. 11).

As a reason for this, the following reason can be considered. Namely, invention sample A had a relatively large heat generating area as compared with comparison sample B and therefore generated a smaller amount of heat per unit area for the same current injection (the current density in the MQW light emitting portion of invention sample A was 111 A/cm$^2$, while the current density in the MQW light emitting portion of comparison sample B was 148 A/cm$^2$, when the injected current was 100 mA). Further, a GaN substrate having a heat conductivity higher than that of the sapphire substrate of comparison example B was employed. Further, the n-electrode was provided on the N-surface side of the GaN substrate, which prevented the occurrences of portions having extremely high current densities.

On the other hand, if the aforementioned features of invention sample A are conversely studied, comparison sample B had a smaller heat radiating area than that of invention sample A. Furthermore, in comparison sample B, the n-electrode was formed on the exposed n-type GaN layer, and this significantly increased the density of currents flowing through the n-type GaN layer along the layer, which further increased the heat generation.

Further, even though the mechanism has not been clarified, the use of a GaN substrate having a relatively low dislocation density could improve the crystallinity of the epitaxially-grown films such as the MQW, which prevented reduction of the light emitting efficiency for large injected currents.

Thus, in order to isolate the influences of heat, tests using pulse currents were performed similarly under the condition where no fluorescent material was installed and resin-sealing was applied. Here, the applying time was set to 1 μm. The applied current was 100 μA, and as the duty ratio was gradually decreased from 100%, the output was measured. The outputs of both invention sample A and comparison sample B were increased with decreasing duty ratio. However, when the duty ratio was from 5% to 1%, the outputs of the both samples were constant and saturated: Therefore, it was determined that the influences of heat were eliminated.

Figure 13:
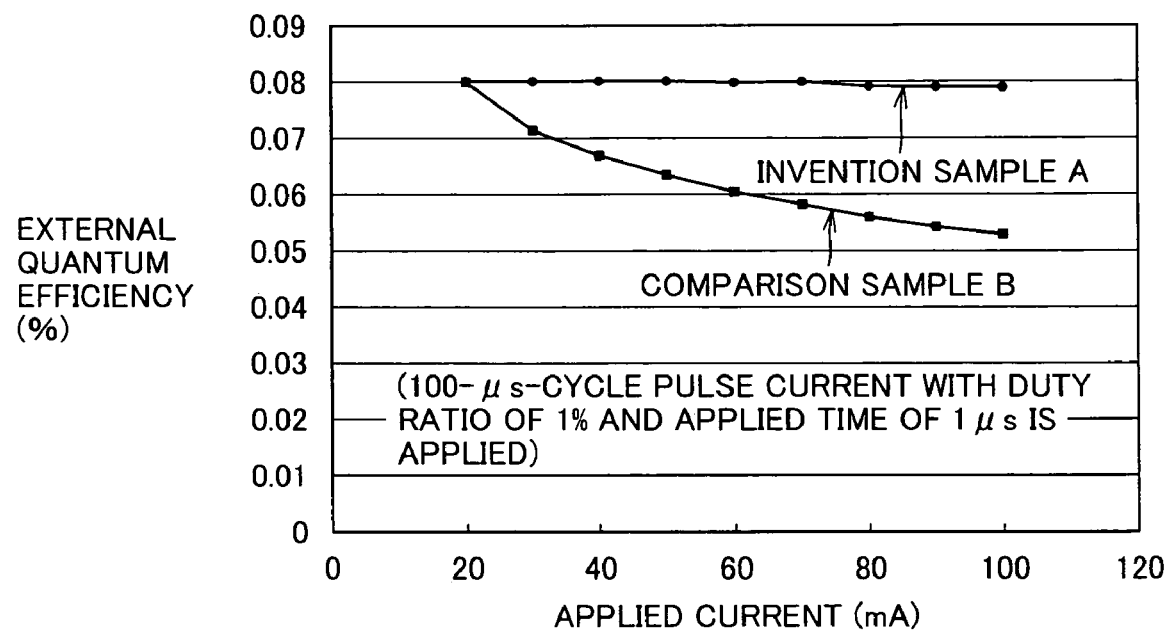
FIG. 13 is a view illustrating comparison of the external quantum efficiency when the influences of heat generation are eliminated.

Based on this result, the applied pulse current value was gradually changed with a duty ratio of 1% and the external quantum efficiency was calculated from the outputs. The result of the calculation is illustrated in FIG. 13. In FIG. 13, the external quantum efficiency of comparison sample B decreased with increasing current. As compared with this, the external quantum efficiency of invention sample A was substantially constant until the current reached 100 mA.

As previously described, even if the chip size of comparison sample B is increased to provide the same heat radiating area as that of invention sample A and further comparison sample B is p-down-mounted in order that there is no difference in heat radiation through the substrate, comparison sample B can not generate high outputs at high currents, since such high outputs are caused by the crystallinity of the epitaxially-grown films formed on a substrate having a low dislocation density which is specific to invention sample A.

Further, in invention sample A, unlike comparison sample B, the n-electrode and the p-electrode are placed at the opposite positions and thus there is no possibility of electrical short-circuits. On the other hand, in comparison sample B, the n-electrode and the p-electrode are placed on the same side and therefore it may become necessary to provide a film for electrically insulating the p-electrode and the n-electrode from each other in order to prevent short-circuits therebetween. The invention sample does not require it, which may prevent additional increases in the manufacture cost.

The aforementioned results of the light outputs have been merely illustrated as an example for a light emission wavelength of 450 nm. Even if the light emission wavelength and the layer construction are changed, invention sample A can provide equivalent effects as compared with the comparison sample. Further, it goes without saying that an $Al_xGa_{1-x}N$ substrate may be employed, instead of a GaN substrate, to provide similar effects, provided that it has equivalent characteristics as the substrate of a light emitting device.

Figure 14:
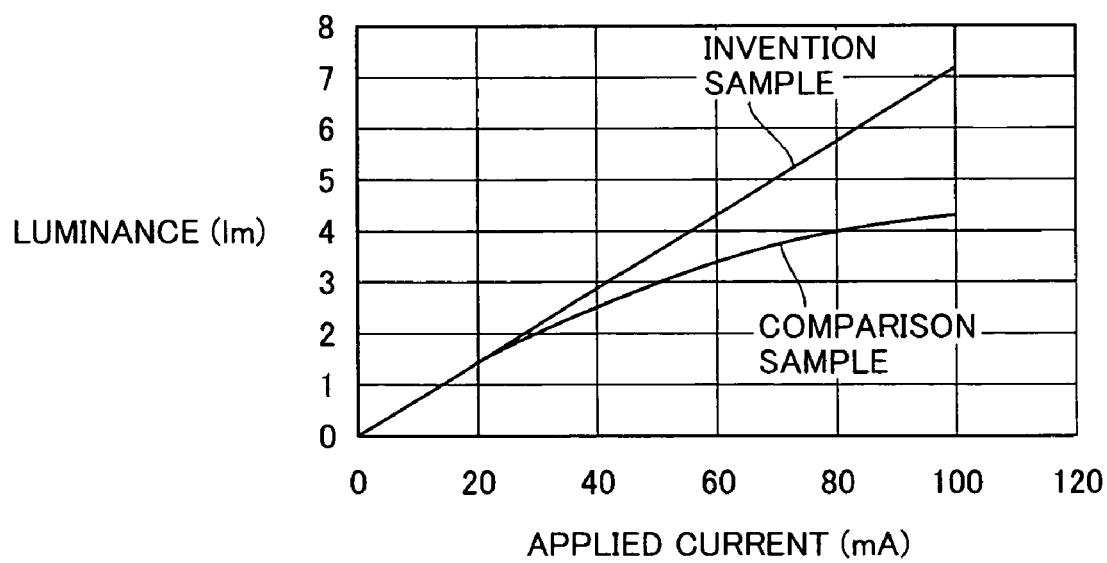
FIG. 14 is a view illustrating the relation between the applied current and the luminance of a white LED equipped with a fluorescent material according to the first embodiment.
Figure 15:
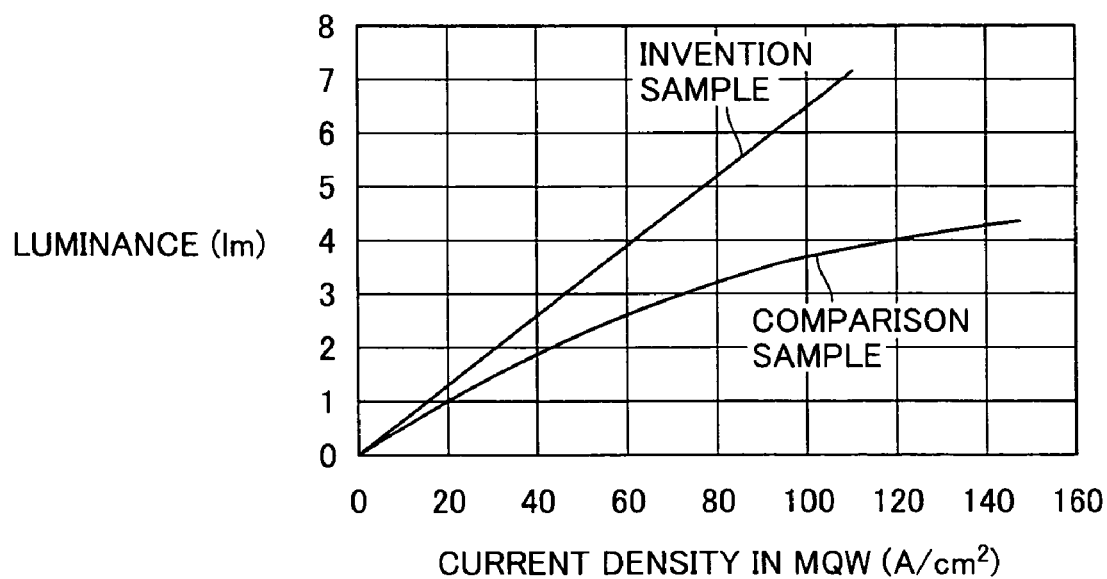
FIG. 15 is a view illustrating the relation between the current density in the MQW and the luminance of a white LED equipped with a fluorescent material according to the first embodiment.

Next, FIG. 14 and FIG. 15 illustrate the result of measurements of the luminance which is equivalent to the light output, for invention sample A and comparison sample B. As illustrated in FIG. 14, when a current of 100 mA was applied, invention sample A generated a luminance of 7.2 lm while comparison sample B generated a luminance of 4.3 lm.

As described, the invention sample can reduce the thickness and size of a side-view type LED lamp and provide higher outputs as compared with comparison sample B, even though the invention sample and comparison sample B have the same chip size. Even if an attempt is made to reduce the chip size of comparison sample B in order to reduce the thickness of the lamp, an etching space for forming the n-electrode and a fixed area of the p-pad electrode are required, and as a result, the opening ratio will be significantly decreased, which will prevent the generation of sufficient light outputs or luminances.

Further, in the case of comparison sample B, even if an attempt is made to place sides of the chip in parallel with the longitudinal direction of the side-view type LED, the thickness of the side-view type LED can not be reduced to a value equivalent to that attained by invention sample A since there are the p-electrode at one of opposite corners of the chip and the n-electrode at the other corner, thereby requiring an additional space for wire bonding.

Next, electrostatic withstand voltage tests were performed for the aforementioned invention sample A and comparison sample B. The electrostatic withstand voltage tests were performed by placing the light emitting device and an electrostatically-charged condenser such that they were opposed to each other, then causing electric discharge therebetween and measuring the voltage therebetween when electric discharge was caused.

As a result, a breakdown occurred in comparison sample B at an electrostatic voltage of 100 V. On the other hand, a breakdown did not occur in invention sample A until the electrostatic voltage reached about 8000 V. Therefore, it was proven that the electrostatic withstand voltage of invention sample A was about 80 times that of comparison sample B.

Second Embodiment

The second embodiment of the present invention was characterized in that an invention sample C, an invention sample D and a comparison sample E were p-down-mounted and the back surface of the n-type layers or the n-type semiconductor substrate was used as a light emitting surface. Invention sample D had a dislocation density of 1E9/cm², which was out of the range of dislocation density of light emitting devices according to the present invention employing a nitride semiconductor substrate having a reduced dislocation density. However, invention sample D was included in other types of light emitting devices according to the present invention. In the present embodiment, a sapphire substrate was employed to form comparison sample E and an attempt was made to provide an n-electrode and a p-electrode on the laminated-layers side of the sapphire substrate and down-mount these two electrode. However, an n-electrode having the same size as that of invention samples C, D could not be formed and therefore the fabrication thereof was discontinued. Comparisons were made mainly between invention sample C and invention sample D and thus influences of the dislocation density were examined.

(Invention Sample C)

Figure 16:
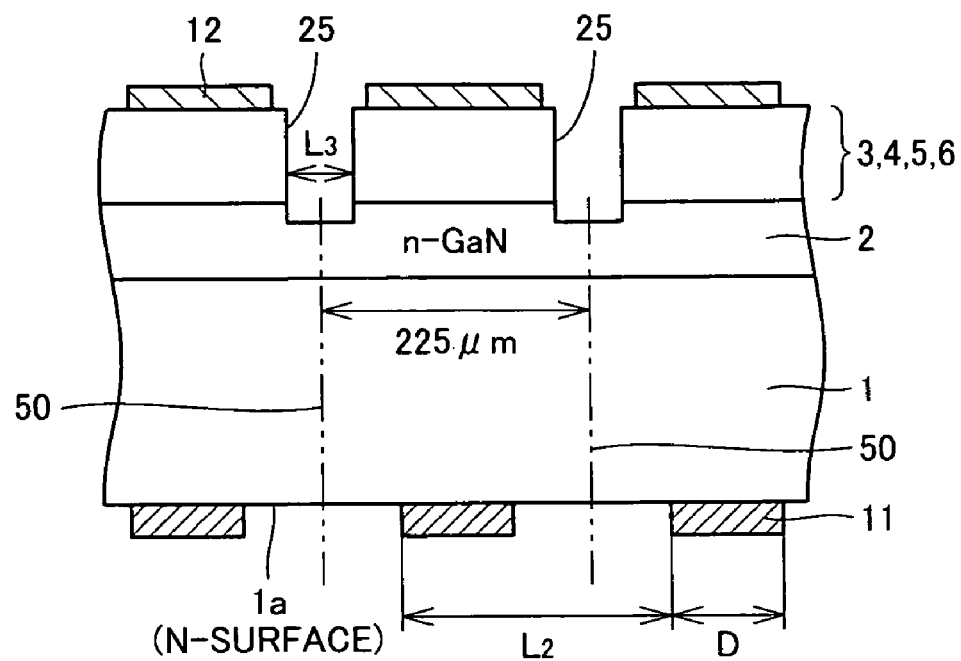
FIG. 16 is a view illustrating the laminated-layer construction of an invention sample C according to a second embodiment of the present invention.
Figure 17:
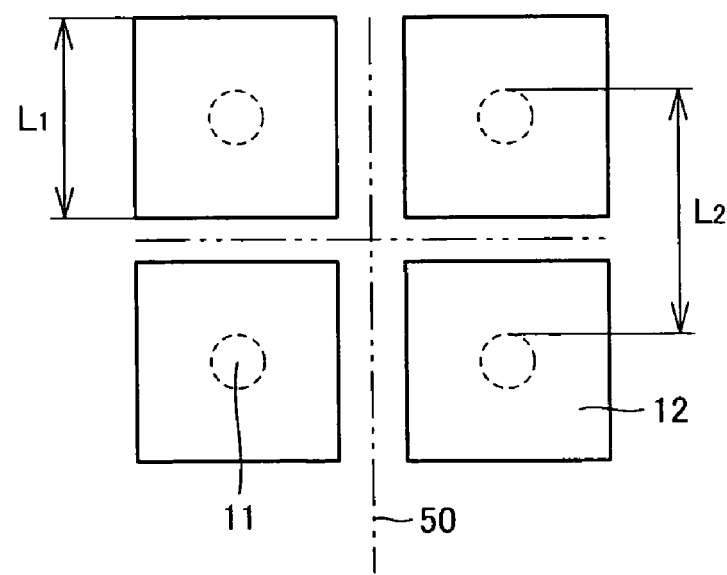
FIG. 17 is a plane view of FIG. 16.

Referring to FIG. 16 and FIG. 17, invention sample C will be described.

(1) A GaN off substrate deviated by 0.5° from the c-plane was used. The GaN substrate had a resistivity of 0.01 Ω·cm, a dislocation density of 1E6/cm² and a thickness of 400 μm. The thickness was decreased to 200 μm before the formation of electrodes similarly to invention sample A.

(2) to (4) The same processes as those of invention sample A were applied.

(5) On the N-surface of the GaN substrate, n-electrodes with a diameter of 100 μm were formed at the centers of the devices with a pitch of 250 μm, by photolithography technique and vapor deposition. As the n-electrode, a laminate construction of Ti 20 nm/Al 100 nm/Ti 20 nm/Au 200 nm was formed in this order on the GaN substrate. This was subjected to a heating process in an inert atmosphere to reduce the contact resistance to below 1E−5 Ω·cm².

(6) As a p-electrode, Ni having a thickness of 4 nm and Au having a thickness of 4 nm were formed in order on the entire surface of the p-type GaN layer to form a two-layers construction. This was subjected to a heating process in an inert atmosphere to change the contact resistance to 5E−4 Ω·cm².

(7) This wafer was etched from the Mg-doped p-type layers to the Si-doped n-type layers, using Cl-type gas, by photolithography technique and RIE to form device separating slots with a predetermined shape.

(8) Then, the construction was scribed into predetermined shapes and the chipped constructions were made to be light emitting devices. The resultant light emitting devices had a size of 225 μm□. Since the MQW light emitting portion had an area of 0.04 mm² and the n-pad electrode had a diameter of 100 μm the ratio of the portion of the light extracting surface which was not covered with the n-pad electrode (opening ratio) was 80% (see FIG. 16 and FIG. 17).

(Side View-Type LED)

Figure 18:
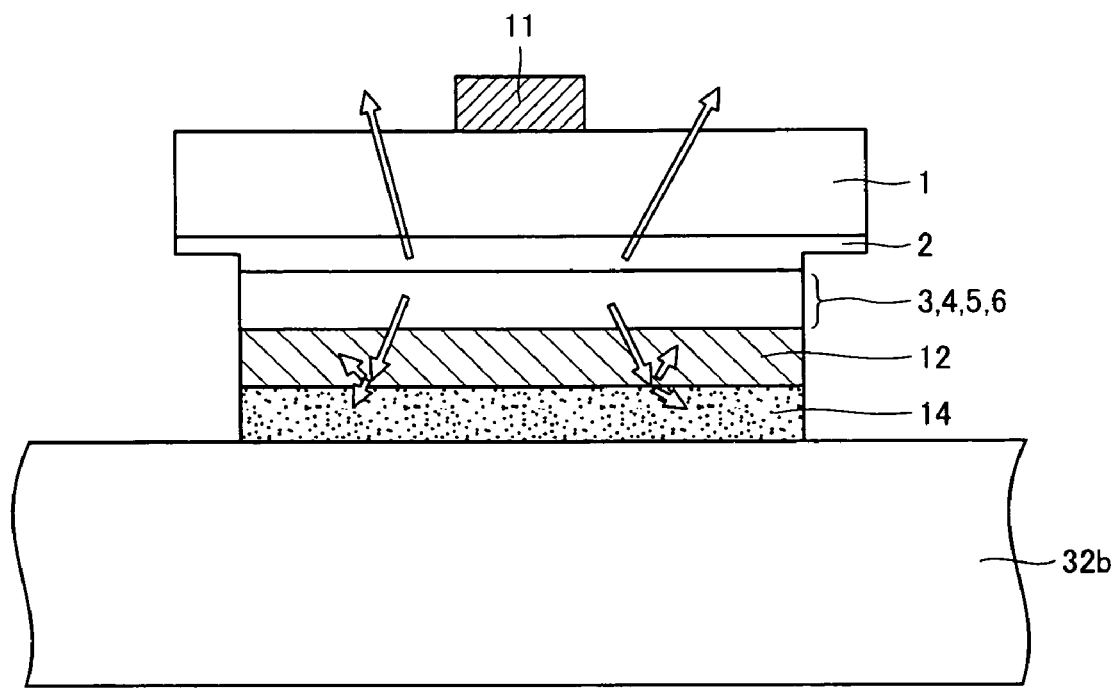
FIG. 18 is a view illustrating the mounted construction of invention sample C according to the second embodiment of the present invention.
Figure 19:
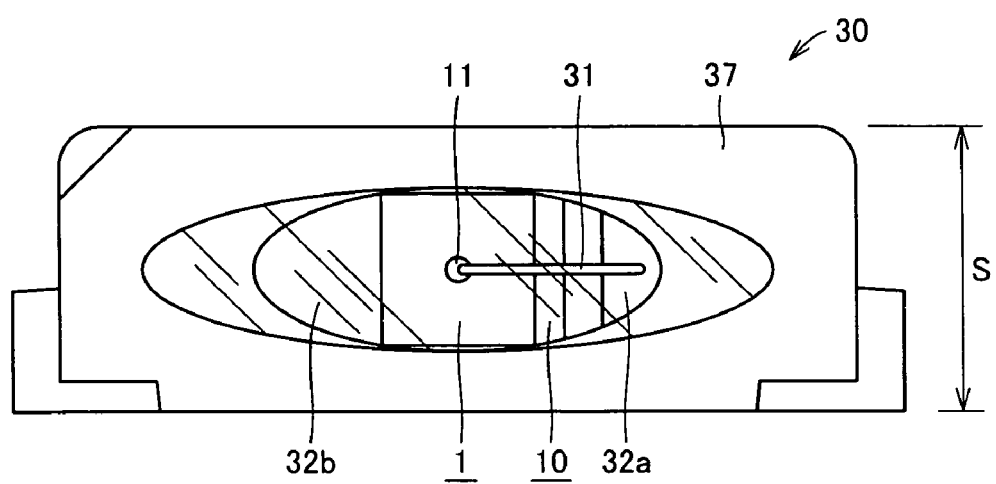
FIG. 19 is a front view of the side-view type LED of invention sample C.

(9) This light emitting device was p-down mounted at the center of lead frame mounting portion 32a provided with a reflective mirror to form a side-view type LED such that light would be extracted from the n-layers side as illustrated in FIG. 18 (see FIG. 19). A conductive adhesive 14 was employed to mount this device onto the lead frame. N-pad electrode 11 was placed at the center of the device. There was no need to provide both the p-electrode and the n-electrode on the top side as comparison sample B and therefore the thickness of the side-view type LED lamp after mounting the light emitting device could be decreased and thus the aforementioned thickness S could be made to be 0.4 mm, even in consideration of the space required for wire bonding.

(10) In mounting, in order to enhance heat radiation from the light emitting device, the light emitting device was mounted such that the entire surface of the GaN substrate was in contact with the mounting portion. An Ag-type adhesive with a high heat conductivity was employed as the conductive adhesive 14, and a CuW-type lead frame with a high heat conductivity was employed as the lead frame. As a result, the resultant heat resistance was 9° C./W.

(11) Further, a fluorescent material was mounted on the n-electrode side and then the device was resin-sealed with an epoxy resin to form a white light emitting lamp. A fluorescent material capable of generating a luminance of 180 lm per 1 W of the light output of 450 nm was employed.

(Invention Sample D)

(1) A GaN off substrate deviated by 0.5° from the c-plane was used. The GaN substrate had a resistivity of 0.01 Ω·cm, a dislocation density of 1E9/cm² and a thickness of 400 μm. The thickness was decreased to 200 μm similarly to invention samples A, C.

(2) to (11) The same processes as those of invention sample C were performed.

(Comparison Sample E)

(1) An insulating sapphire off substrate deviated by 0.2° from the c-plane was used. The substrate had a dislocation density of 1E7/cm² and a thickness of 400 μm. Similarly to invention samples A, C and D, the thickness was decreased to 200 μm.

(2) to (4) The same processes as those of invention sample A.

(5) In comparison sample E, the substrate was an insulator and it was necessary to provide an n-electrode on the same side as the p-electrode, namely on the laminated-layer-construction side. Thus, the wafer which had been subjected to the aforementioned processes was etched from the Mg-doped p-type layers to the Si-doped n-type layers using Cl-type gas by photolithography technique and RIE to expose the n-type GaN layer for forming the N-electrode and form device separation slots similar to those of comparison sample B. The size of the devices was 225 μm□ and the exposed n-type GaN portion had a size of 150 μm□ per a single device. On the exposed n-type GaN layer, an N-electrode having a diameter of 100 μm was formed by photolithography technique and vapor deposition. The thickness, the heating process and the contact resistance were the same as those of the comparison sample B.

(6) The p-electrodes were formed as follows. In the device having a size of 225 μm□, a transparent electrode was formed on the portion of the p-type GaN layer corresponding to the L-shaped portion other than the exposed portion of 150 μm□ in the portion of 200 μm□, which was the portion other than the separation allowance required for device separation. The thickness, the heating process and the contact resistance were the same as those of invention sample A. The thickness, the heating process and the contact resistance were the same as those of comparison sample B. An attempt was made to provide a pad electrode having a diameter of 100 μm near the center of the top of the L-shaped transparent electrode. However, there was only a space of 50 μm□ and therefore chips having the same electrode pattern as that of comparison sample B could not be fabricated.

(Experiment and Result)

Under the condition where a fluorescent material was not placed and only resin-sealing was applied, similarly to the first embodiment, measurements of the light output were performed. As a result, invention sample C and invention sample D both generated an output of 7 mW for an applied current of 20 A and generated an output of 17.5 mW and an output of 10.5 mW, respectively, for an applied current of 50 mA. Invention sample C had a dislocation density about three orders of magnitude lower than that of invention sample D and because of the lower dislocation density, invention sample C could generate higher light emission outputs than those of invention sample D. Since invention sample C and invention sample D caused equivalent heat generation and heat radiation, this difference was not induced by influences of heat. In order to verify this, a 100 μm-cycle-pulse current with a duty ratio of 1% and an applying time of 1 μs was applied thereto and comparisons were made. As a result, for an applied current of 50 mA, they generated an output of 17.5 mW and an output of 10.5 mw, similarly. Therefore, even though the mechanism has not been clarified, the light emission output difference at a high current was caused from the aforementioned dislocation density difference, not from influences of heat.

Also, when the light emission wavelength and the layer construction were changed and when a fluorescent material was mounted to make them to be white light LEDs, invention sample C generated 1.26 lm for an applied current of 20 mA and 3.15 lm for an applied current of 50 mA, while invention sample D generated 1.26 lm for an applied current of 20 mA and 1.89 lm for an applied current of 50 mA. Namely, similarly to previously described, the result of the experiments showed that there were provided effects of the lower dislocation density.

Further, it was impossible to provide, in comparison sample E, electrodes having the same diameter as those of invention samples A, C and comparison sample B, since there was not a space required for providing them as previously described. Even if the size of the exposed portion of the n-type GaN layer and the sizes of the n-electrode and the p-pad electrode are reduced and an n-electrode having the same size as that of invention samples C, D can be formed, there will be caused problems of heat generation at the electrodes, heat generation due to excessive current densities in the MQW and difficulty of ensuring the opening ratio of the p-electrode, which will prevent the generation of light outputs equivalent to those of invention sample C and invention sample D.

Third Embodiment

In the third embodiment, performance such as the light output was examined for an invention sample F which was a light emitting device provided by applying a non-mirror-surface treatment to the aforementioned invention sample C and for a light emitting device provided with a reflective layer between the light emitting layer and the mounting portion (lead frame, etc.).

(Invention Sample F)

Figure 20:
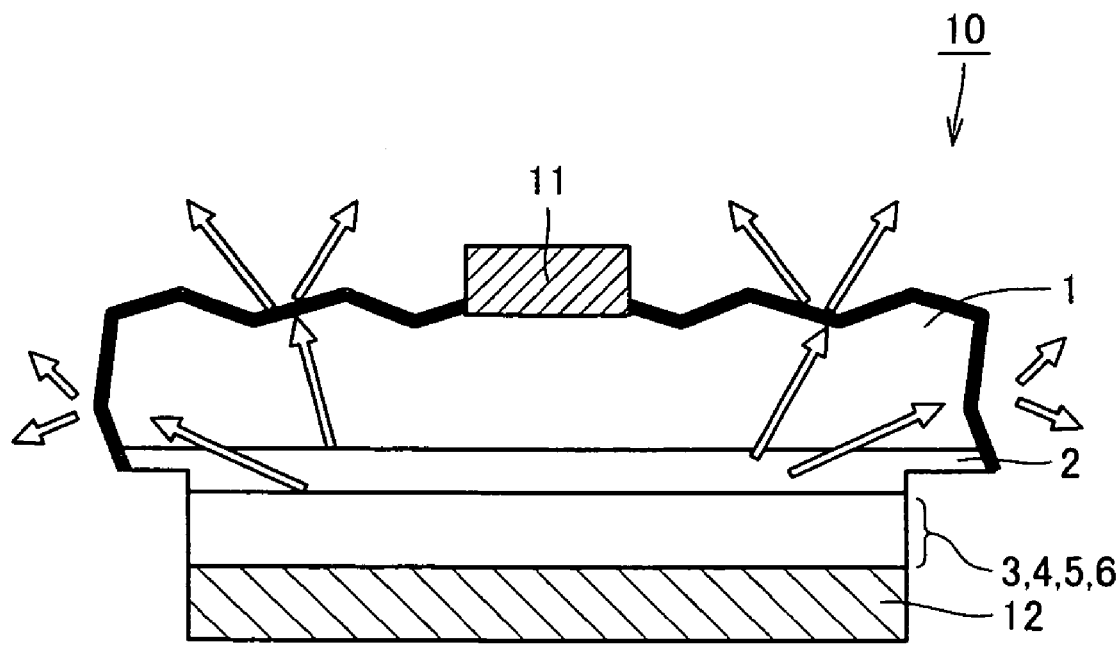
FIG. 20 is a view illustrating an image of light extraction in an invention sample F according to a third embodiment.
Figure 21:
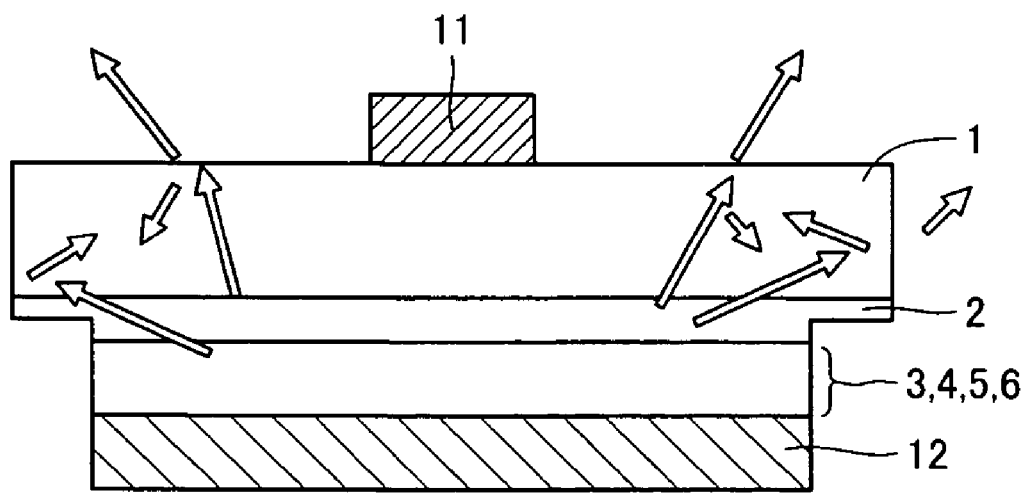
FIG. 21 is a view illustrating an image of light extraction in a light emitting device which has not been subjected to a non-mirror-surface treatment.

Referring to FIG. 20, a non-mirror-surface treatment has been applied to the back surface of the GaN substrate forming a light emitting surface and the side surfaces of the GaN surface and the side surfaces of the laminated-layer construction. Namely, the N-surface of the GaN substrate and the end surfaces of the device were made to be non-mirror surfaces. For comparison, FIG. 21 illustrates an image of light being emitted from light emitting device 10 having mirror surfaces.

As the method for forming non-mirror surfaces, there are methods using dry etching such as RIE or wet etching and methods using mechanical polishing. The present invention employed a method using wet etching with KOH solution as the etchant. For invention sample F, KOH solution with a concentration of 4 mol/l (mol/dm$^2$) was sufficiently agitated with the temperature maintained at 40° C. and then the wafer was immersed in the ultrasonic cleaning machine for 30 minutes to change the N-surface of the GaN substrate and the device end faces to mirror surfaces.

Fourth Embodiment

In the fourth embodiment, the influences of the reflective layer provided between the lead flame and the light emitting device of invention sample C were examined.

(Invention Sample G)

Figure 22:
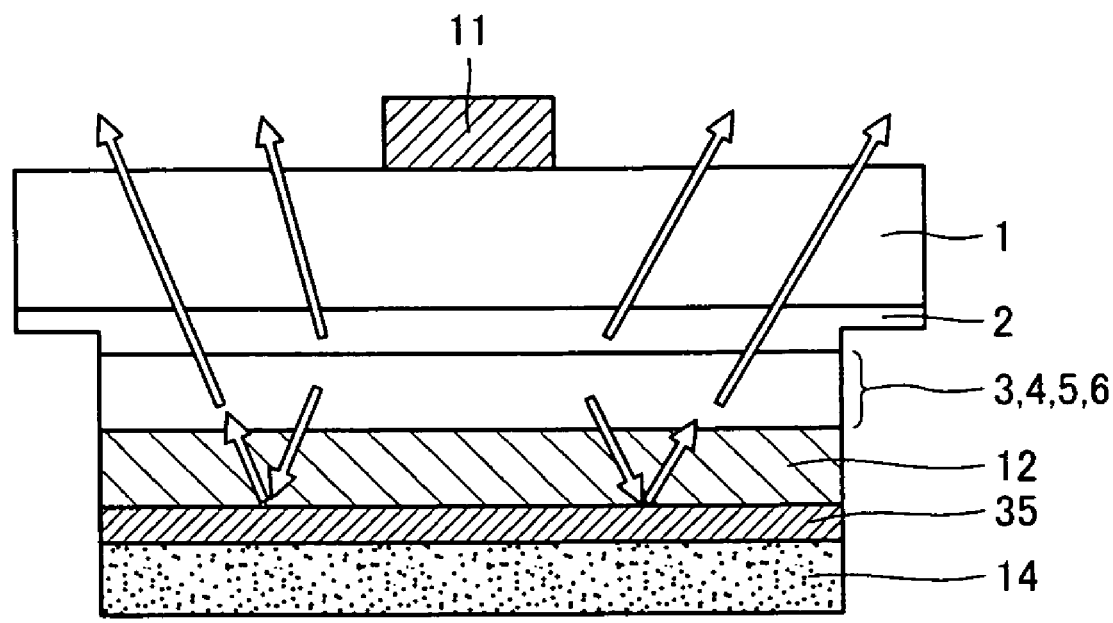
FIG. 22 is a view illustrating the mounted construction of invention samples G and H according to a fourth embodiment of the present invention.

The invention sample G is characterized in that a high reflective film 35 is placed under the p-electrode as illustrated in FIG. 22. As a p-electrode 12, Ni with a thickness of 4 nm, Au with a thickness of 4 nm and Ag with a thickness of 100 nm were formed in order to form three laminated layers on p-type GaN layer 6 during the film formation (when mounted, it was p-down mounted and thus was upside-down). This was subjected to a heating process in an inert atmosphere to lower the contact resistance to 5E–4 Ω·cm$^2$.

Further, an Ni film with a thickness of 4 nm and an Au film with a thickness of 4 nm, as those in the aforementioned three-layers-electrode, were attached to a glass plate and then subjected to the same heating process. Then, the transmittance was measured. When incident light with a wavelength of 450 nm was directed thereto from the Ni side, the transmittance was 70%. Further, an Ag film with a thickness of 100 nm was attached to a glass plate and the reflectivity was measured. When incident light with a wavelength of 450 nm was directed thereto, the reflectivity was 88%. Then, a Ni film with a thickness of 4 nm, an Au film with a thickness of 4 nm and an Ag film with a thickness of 100 nm were laminated in order on a glass plate to form a three-layers construction and then this three-layers construction was subjected to the aforementioned heating process. Then, the reflectivity was measured. When incident light with a wavelength of 450 nm was directed thereto, the reflectivity was 44%. This reflectivity agrees with the reflectivity calculated by assuming that the incident light with a wavelength of 450 nm passed through the Ni film with a thickness of 4 nm and the Au film with a thickness of 4 nm with a transmittance of 70%, then was reflected by the Ag layer with a reflectivity of 88% and then passed through the Ni film with a thickness of 4 nm and the Au film with a thickness of 4 nm with a transmittance of 70%, again.

(Invention Sample H)

The invention sample H is characterized in that a high reflective film is placed under the p-electrode similarly to invention sample G illustrated in FIG. 22. As a p-electrode 12, a Ni film with a thickness of 4 nm, an Au film with a thickness of 4 nm, an Al film with a thickness of 100 nm and an Au film with a thickness of 100 nm were formed in order on p-type GaN layer 6. This was subjected to a heating process in an inert atmosphere to lower the contact resistance to 5E–4 Ω·cm$^2$.

An Ni film with a thickness of 4 nm and an Au film with a thickness of 4 nm, as those in the aforementioned laminated layers, were attached to a glass plate and then subjected to the same heating process. Then, the transmittance was measured. The transmittance was 70% for incident light of 450 nm directed from the Ni side. Further, an Al film with a thickness of 100 nm was attached to a glass plate and the reflectivity was measured. The reflectivity was 84% for incident light of 450 nm. Then, a Ni film with a thickness of 4 nm, an Au film with a thickness of 4 nm and an Al film with a thickness of 100 nm were formed in this order on a glass plate to form a laminated-layers construction. Then, this laminated-layers construction was subjected to the same heating process as the aforementioned heating process and then the reflectivity was measured. The reflectivity was 42% for incident light of 450 nm. This reflectivity agrees with the reflectivity calculated by assuming that the incident light with a wavelength of 450 nm passed through the Ni film with a thickness of 4 nm and the Au film with a thickness of 4 nm with a transmittance of 70%, then was reflected by the Al layer with a reflectivity of 42% and then passed through the Ni film with a thickness of 4 nm and the Au film with a thickness of 4 nm with a transmittance of 70%, again.

(Invention Sample I)

Figure 23:
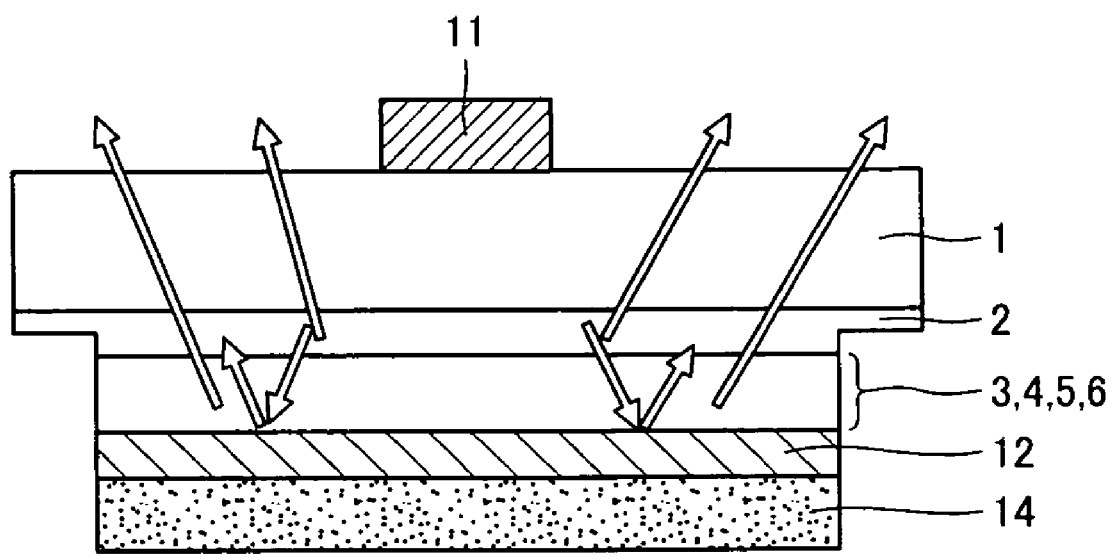
FIG. 23 is a view illustrating the mounted construction of an invention sample I according to the fourth embodiment of the present invention.

The invention sample I is characterized in that a material Rh having a high reflectivity is employed for the p-electrode in invention sample C (see FIG. 23). A p-electrode 12 was formed by depositing Rh having a high reflectivity and a thickness of 100 nm on the entire surface of p-type GaN layer 6, the Rh being in ohmic-contact with the p-type GaN layer. The contact resistance was 5E−4 $\Omega \cdot cm^2$.

A Rh film as the p-electrode was deposited on a glass plate and the transmittance was measured. The transmittance was 60% for incident light of 450 nm.

(Experiment and Result)

Similarly to the first and second embodiments, measurements of the light output were performed for the respective test samples. Invention samples F, G, H and I generated blue light of 8.1 mW, 8.4 mW, 8.4 mW and 9.1 mW for an applied current of 20 mA. Invention sample C including no reflective material generated 7 mW. Further, when a fluorescent material was mounted to generate white light, the respective samples generated a luminance of 1.45 lm, 1.51 lm, 1.51 lm and 1.64 lm for an applied current of 20 mA. Invention sample C including no reflective material generated 1.26 lm.

From the aforementioned results, invention sample F having non-mirror surfaces, invention samples G, H including a high reflective film under the p-electrode and invention sample I employing a high reflective material for the p-electrode could generate higher light outputs than invention sample C.

It goes without saying that non-mirror surfaces will provide equivalent effects for different light emission wavelengths. It has been clarified from experiments that in the case of using KOH solution, KOH solution with a concentration in the range from 0.1 to 8 mol/l (mol/dm$^3$) and a temperature in the range from 20 to 80° C. may be employed to provide equivalent effects.

It goes without saying that the reflective electrode will provide effects for any wavelength when the light emission wavelength is changed, even though the degree of effects can not be flatly described since the reflectivities of the Ag layer and the Al layer and the absorptances of the Au layer and the Ni layer will be changed. It is possible to employ, instead of Rh, an element having a work function and reflectivity equivalent to or more than those of Rh to provide effects equivalent to or more than those attained by Rh.

Fifth Embodiment

In the fifth embodiment of the present invention, various types of nitride semiconductor substrates were employed and a GaN substrate and an AlxGa1−xN substrate having a reduced thickness were employed. Influences of the nitride semiconductor substrate were examined. In order to examine the characteristics of a side-view type LED lamp having a small thickness and a large lateral length, influences of the shape of the light emitting surface of the GaN substrate having a reduced thickness were examined.

(Invention Sample J)

The invention sample J is characterized in that the thickness of the GaN substrate is reduced. Further, as will be described later, in addition to samples having a square light emitting surface, samples having a narrower light emitting surface were also examined.

(1) A GaN off substrate deviated by 0.5° from the c-plane was used. The GaN substrate had a resistivity of 0.01 $\Omega \cdot cm$, a dislocation density of 1E7/cm$^2$ and a thickness of 100 μm.

(2) A GaN buffer layer, a Si-doped n-type GaN layer, a Si-doped n-type clad $Al_{0.2}Ga_{0.8}N$ layer, three sets of MQW layer consisting of GaN and $In_{0.05}Ga_{0.95}N$, a Mg-doped p-type clad $Al_{0.2}Ga_{0.8}N$ layer, a Mg-doped p-type GaN layer were grown in order on the Ga-surface of the GaN substrate, by MOCVD.

(3) The internal quantum efficiency was 50%, which was calculated by comparing the PL intensity at a low temperature of 4.2 K and an emission wavelength of 380 nm and the PL intensity at a room temperature of 298K and an emission wavelength of 380 nm.

(4) to (7) The same processes as those the invention sample C were performed.

Figure 24A:
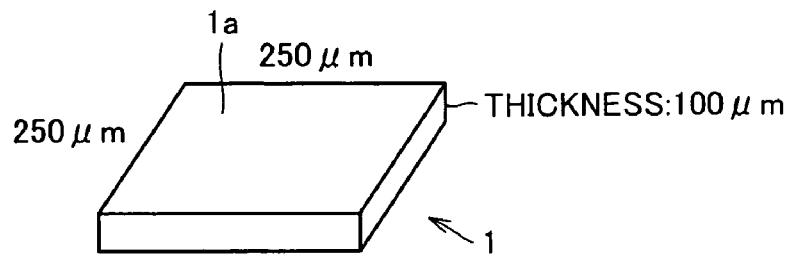
FIG. 24A is a view illustrating the shape of the nitride semiconductor substrate of invention samples J and K according to a fifth embodiment of the present invention, and a view illustrating a square shape.
Figure 24B:
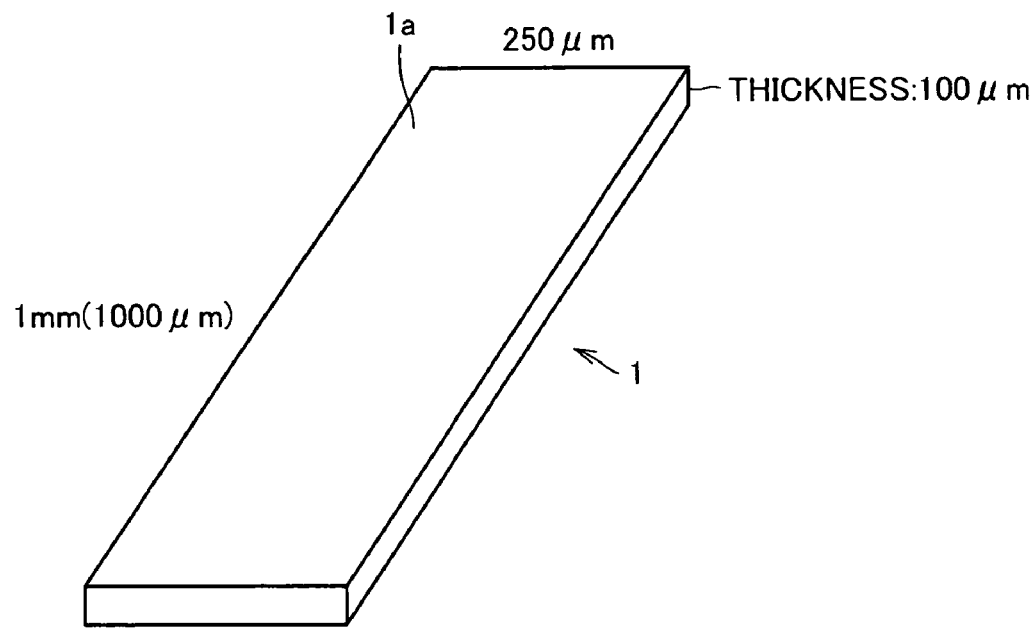
FIG. 24B is a view illustrating the shape of the nitride semiconductor substrate of invention samples J and K according to the fifth embodiment of the present invention, and a view illustrating a long rectangular shape.
Figure 25:
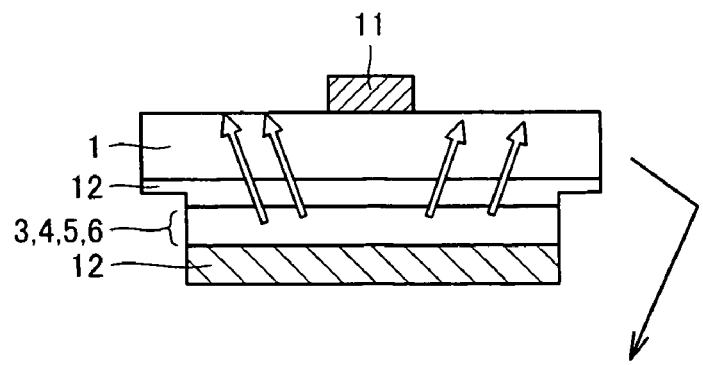
FIG. 25 is a view illustrating the mounted construction of invention samples J and K.

(8) The construction was scribed into predetermined shapes and the chipped constructions were made to be light emitting devices. As illustrated in FIG. 24 and FIG. 25, light emitting devices including a light emitting surface, namely back surface 1a of substrate 1, with a size of 250 μm□ and light emitting devices including a light emitting surface with a size of 250 μm×1 mm were fabricated. The areas of the MQW light emitting portions were the areas of the aforementioned substrate from which the device separation slots had been removed and were 0.051 mm$^2$ (225 μm□) and 0.22 mm$^2$ (225 μm×975 μm), respectively. Since the n-electrode had a diameter of 100 μm, the ratios of the portions of the light extracting surfaces which were not covered with the n-electrode (opening ratios) were 85% and 96%, respectively.

(Side View-Type LED)

Figure 26:
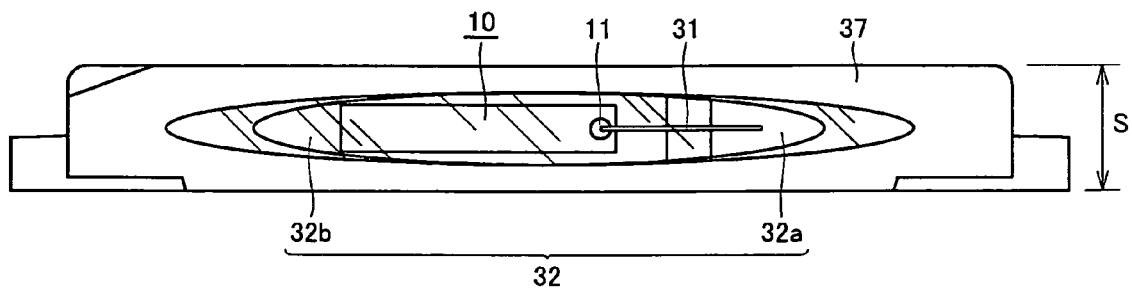
FIG. 26 is a front view of the side-view type LED equipped with the light emitting device of invention samples J and K.

(9) This light emitting devices were p-down mounted at the center of the lead frame including a reflective mirror such that light was extracted from the n-layers side (see FIG. 25 and FIG. 26). The n-electrode was placed at the center of the device and there was no need to provide a p-electrode on the top side. Therefore, the thickness of the side-view type LED lamp after mounting can be decreased and thus the thickness S could be made to be 0.425 mm, even in consideration of the space required for wire bonding. FIG. 26 is a view illustrating a side-view type LED equipped with a light emitting device formed on a substrate having a narrow surface with a size of 250 μm×1 mm.

(10) In mounting, the light emitting device was mounted using a high thermal conductive adhesive such that the entire surface of the GaN substrate was in contact with the mounting portion, in order to enhance heat radiation from the light emitting device. An Ag-type adhesive with a high heat conductivity was employed as the adhesive, and a CuW-type lead frame with a high heat conductivity was selected as the lead frame. With this way, the resultant heat resistance was 9° C./W.

(11) Further, a fluorescent material was mounted on the n-electrode side and this device was resin-sealed with an epoxy resin to form a white light emitting lamp. As the fluorescent material, a fluorescent material capable of generating 180 lm for 1 W of light output of 380 nm was employed.

(Invention Sample K)

The invention sample K is characterized in that an $Al_xGa_{1-x}N$ substrate is employed as a nitride semiconductor substrate.

(1) $Al_xGa_{1-x}N$ off substrates deviated by 0.5° from the c-plane were used. The substrates had a resistivity of 0.01 Ω·cm, a dislocation density of $1E7/cm^2$ and a thickness of 100 μm. The substrates had three types of Al compositions x=0.2, 0.5 and 1.

(2) to (11) The same processes as those for invention sample J were performed.

(Comparison Sample L)

(1) A GaN off substrate deviated by 0.5° from the c-plane was used. The substrate had a resistivity of 0.01 Ω·cm, a dislocation density of $1E7/cm^2$ and a thickness of 1 mm (1000 μm).

(2) to (11) The same processes as those of invention sample J were performed. It was difficult to scribe and then break this comparison sample L to make it chips as invention sample J, and therefore it was cut to make it chips.

(Experiment and Result)

Figure 27B:
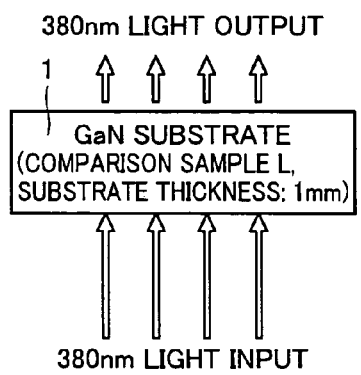
FIG. 27B is a view illustrating the method for measuring the transmittance of the nitride semiconductor substrate of comparison sample L according to the fifth embodiment.
Figure 27A:
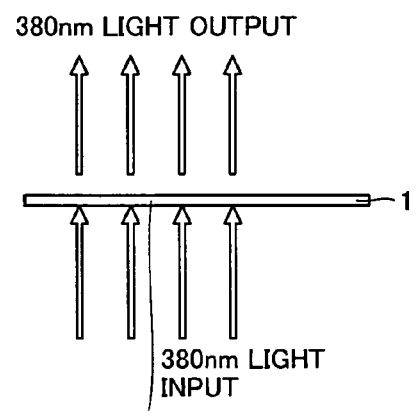
FIG. 27A is a view illustrating the method for measuring the transmittance of the nitride semiconductor substrate of invention samples J and K according to the fifth embodiment.
Figure 28:
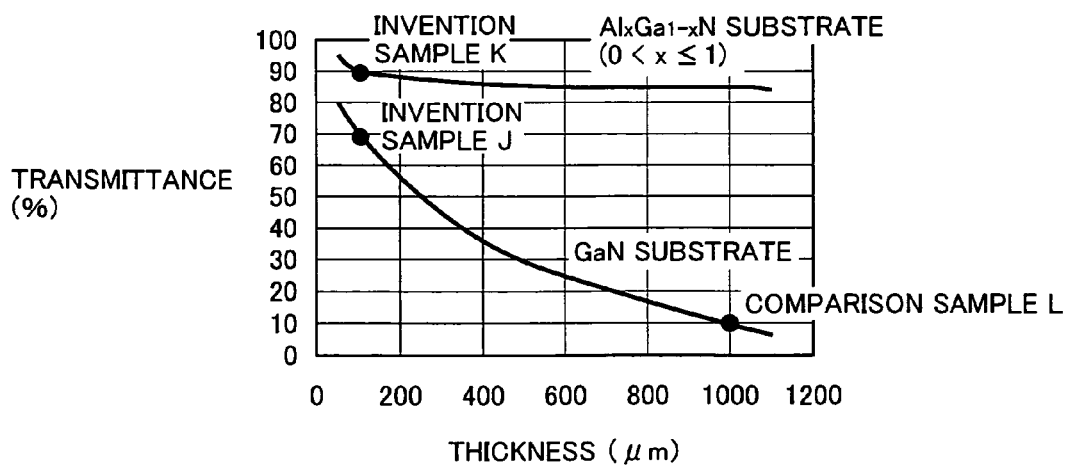
FIG. 28 is a view illustrating the transmittances of the respective nitride semiconductor substrates according to the fifth embodiment.

The respective substrates of invention sample J (a GaN substrate with a thickness of 100 μm) and invention sample K (AlxGa1-xN; x=0.2, 0.5 and 1.0) having a substrate thickness significantly smaller than that of the aforementioned first to third embodiments and comparison sample L having a significantly large substrate thickness (a GaN substrate with a thickness of 1000 μm) were prepared and measurements of the transmittance were performed for incident light with a wavelength of 380 nm as illustrated in FIG. 27A and FIG. 27B. For invention sample J and invention sample K, measurements were performed for the two types of light emitting surfaces, namely 250 μm□ and 250 μm×1 mm. As a result, as illustrated in FIG. 28, the transmittance of invention sample J was 70% (the transmittance was the same value for both the two types of the shapes of the light emitting surface), and the transmittance of invention sample K was 90% (the transmittance was the same value for both the two types of the shapes of the light emitting surface and all the three types of compositions x=0.2, 0.5 and 1.0), and the transmittance of comparison sample L was 10%.

Invention sample J, invention sample K and comparison sample L equipped with no fluorescent material and resin-sealed, and invention sample J, invention sample K and comparison sample L equipped with a fluorescent material to be formed as white LEDs were mounted in an integrating-sphere and then a predetermined current was applied thereto. The emitted light was focused into a detector and then output from the detector. Comparisons of the light output values output from the detector and the luminances were performed.

When a current of 20 mA was applied, invention sample J, invention sample K and comparison sample L generated 4.2 mW (the luminance was 0.76 lm: for both the two types of light emitting device sizes), 5.4 mW (the luminance was 0.97 lm: for both the two types of light emitting device shapes and all the three types of x) and 0.6 mW (the luminance was 0.11 lm). Further, when a current of 240 mA was applied, the light outputs of invention sample J and invention sample K having a size of 250 μm□ (a current density of 474 $A/cm^2$) decreased with time due to influences of heat and these samples could not generate light outputs commensurate with the current. However, invention sample J having a size of 250 μm□×1 mm generated 50 mW (9.1 lm) which was 12 times that generated for an applied current of 20 mA, and also invention sample K having a size of 250 μm□×1 mm generated 64 mW (11.6 lm) which was 12 times that generated for an applied current of 20 mA.

In the aforementioned results, the difference in the light output for an applied current of 20 mA was caused by the difference in the transmittance of the substrate. A GaN substrate has an extremely low light transmittance for the short wavelength range shorter than 400 nm and therefore for the wavelength range shorter than 400 nm, the use of an $Al_xGa_{1-x}N$ substrate enables extracting greater amounts of light. Further, reduction in the thickness of the GaN substrate also enables extracting greater amounts of light. However, in view of spreading currents uniformly through the n-type layers, excessively small thicknesses can not provide uniform light emission, which may prevent generating sufficient outputs, or concentrate light locally thereby locally degrading the resin. On the other hand, excessively large thicknesses will degrade the light extraction efficiency as previously described. Therefore, depending on the light emission wavelength, the thickness is preferably 50 μm to 500 μm. For example, it has been proven from experiments that in order to uniformly spread currents over about 1 mm as in a 250 μm□×1 mm chip, it is more desirable to set the thickness to 50 to 100 μm.

Further, the use of a GaN substrate having a small thickness as in the present embodiment reduces the manufacture cost of the GaN substrate, which enables the fabrication of low cost light emitting devices. It goes without saying that this results in reduction of the cost regardless of the light emission wavelength. Further, forming a light emitting surface of the chip with a rectangular shape as the invention samples having a size of 250 μm□×1 mm enables increasing the area while maintaining the thickness S of the side-view type LED at a small value, namely 0.425 mm. This enables generating high outputs commensurate with the area. It goes without saying that the lager the substrate thickness set for uniformly spreading currents through the n-type layers, the larger the longitudinal size can be set, as previously described.

Sixth Embodiment

Light emitting devices according to the sixth embodiment of the present invention are based on that the relation between the oxygen concentration of the GaN substrate and the resistivity and light transmittance has been grasped. The sixth embodiment is characterized in that based on the relation, there was established the relation between optimal GaN substrate thicknesses and oxygen concentrations for a predetermined light emitting area for light emitting devices p-down mounted, namely light emitting devices in which the GaN substrate serves as the light emitting surface. As previously described, in a p-down mounted light emitting device, the GaN substrate forms the light emitting surface, and therefore the oxygen concentration which largely affects the resistivity and the light transmittance will become particularly important.

Figure 29:
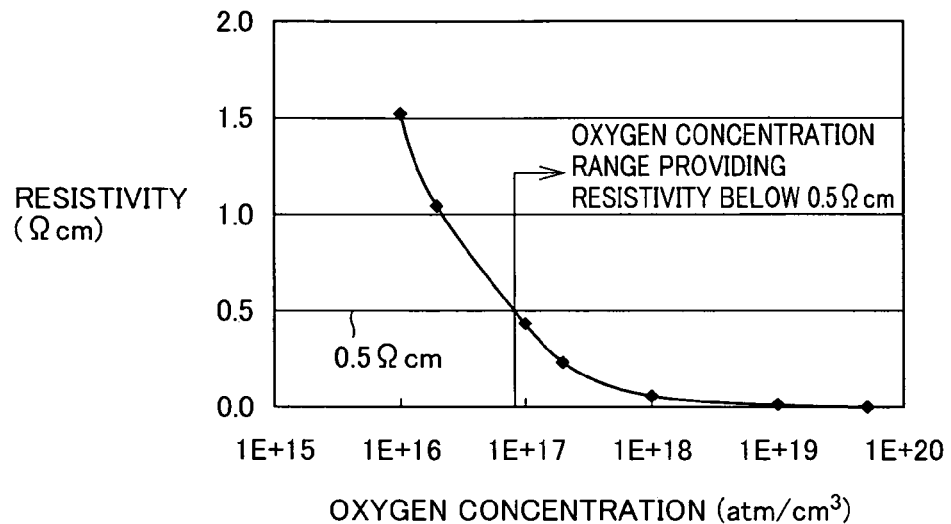
FIG. 29 is a view illustrating the influences of the oxygen concentration of a GaN substrate on the resistivity according to a sixth embodiment.
Figure 30:
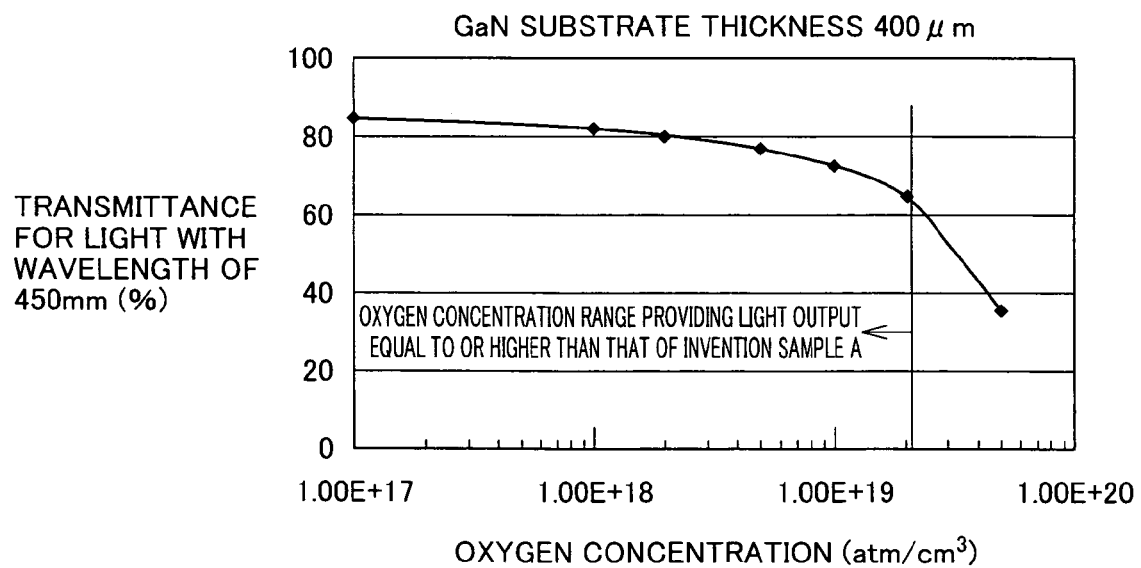
FIG. 30 is a view illustrating the influences of the oxygen concentration of a GaN substrate on the transmittance for light (with a wavelength of 450 nm) according to the sixth embodiment.

Referring to FIG. 29, resistivities equal to or lower than 0.5 Ω·cm can be realized by setting the oxygen concentration to $1E17/cm^3$ or more. Referring to FIG. 30, when the oxygen concentration is greater than $2E19/cm^3$, the transmittance for light with a wavelength of 450 nm sharply decreases. From FIG. 29 and FIG. 30, increasing the oxygen concentration is effective in reducing the resistivity of the GaN substrate and increasing the light emitting surface, but decreases the light transmittance. Therefore, for a GaN substrate for use in a light emitting device to be p-mounted, the setting of the oxygen concentration, the thickness and the light emitting plane size becomes significantly important.

Figure 31:
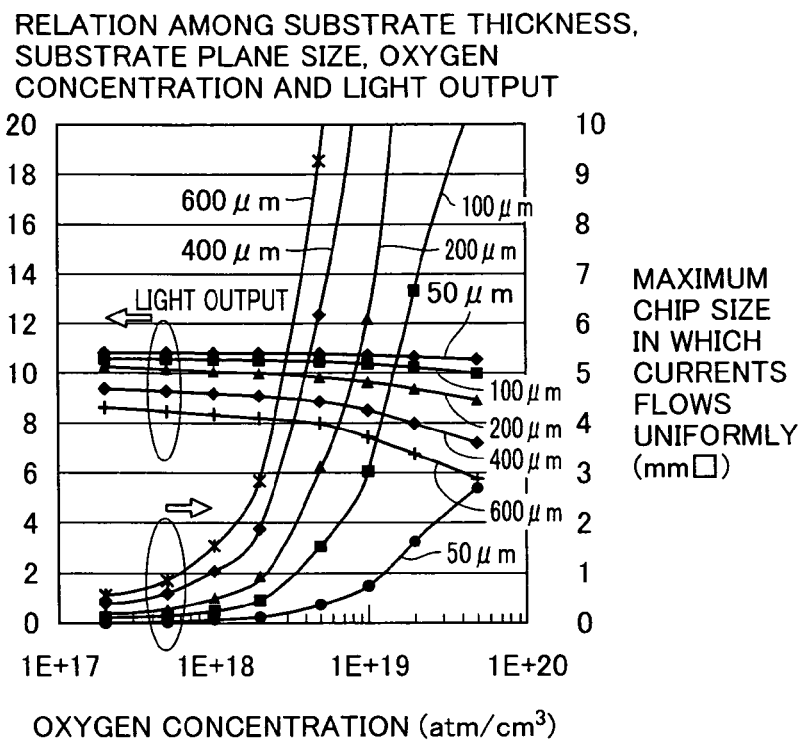
FIG. 31 is a view illustrating the light outputs and the plane sizes in which currents flow uniformly, for light emitting devices fabricated from GaN substrates having various thicknesses and oxygen concentrations.

Referring to FIG. 31, there is a tendency that the larger the thickness and also the higher the oxygen concentration, the lower the light output of the lamp becomes.

Referring to FIG. 31, for example, when the plane size in which currents flow uniformly is a square having a side length of 0.5 mm (a side length of 1 mm), in order to generate a light output of 7 mw with the size of invention sample C for an applied current of 20 mA, the oxygen concentration can be set to equal to or higher than $3E18/cm^3$ (equal to or higher than $7E18/cm^3$ for a square with a side length of 1 mm) for a GaN substrate having a thickness of 50 μm to ensure light outputs equal to or higher than 7 mw with the size as of invention sample C for an applied current of 20 mA while generating uniform light emission. Namely, if the current density is matched with the current density obtained when a current of 20 mA is applied to the light emitting layer of invention sample C having a square shape with a side length of 200 μm, the applied current 20 mA for the size of invention sample C corresponds to an applied current of 125 mA (50 mA) for a square with a side length of 0.5 mm (a side length of 1 mm). When a current of 125 mA (500 mA) is applied thereto, light outputs equal to or greater than 44 mW (175 mW) can be ensured in proportion to the applied current, while uniform light emission can be achieved.

Further, in the case of using a GaN substrate with a thickness of 200 μm, when the target performance is the same as that for a thickness of 50 μm, the oxygen concentration can be set to equal to or higher than $1E18/cm^3$ for a square with a side length of 0.5 mm ($2E18/cm^3$ for a square with a side length of 1 mm). In the case of a thickness of 200 μm, the oxygen concentration must be set to a value equal to or lower than $1E19/cm^3$ in order to provide light outputs equal to or higher than 7 mW with the size of invention sample C for an applied current of 20 mA.

Further, in the case of using a GaN substrate with a thickness of 400 μm, any oxygen concentration can not provide light equal to or higher than 7 mW with the size of invention sample C for an applied current of 20 mA, while oxygen concentrations equal to or greater than $5E17/cm^3$ can provide uniform current flows through a square area with a side length of 0.5 mm. However, oxygen concentrations equal to or lower than $1E19/cm^3$ can ensure light outputs equal to or higher than 6 mW with the size of invention sample C for an applied current of 20 mA, thereby preventing significant reduction in the light output while achieving uniform light emission.

Further, referring to FIG. 31, in the case where the GaN substrate has a thickness of 100 μm to 300 μm, there is a practically sufficient oxygen concentration range which enables flowing currents uniformly through a square with a side length of 0.5 mm and also generating outputs equal to or higher than 7 mW with the size of invention sample C for an applied current of 20 mA. For a thickness of 100 μm, an oxygen concentration range from $2E18/cm^3$ to $2E19/cm^3$ enables that. For a thickness of 300 μm, an oxygen concentration range from $6E17/cm^3$ to $5E18/cm^3$ enables that.

Similarly, referring to FIG. 31, in the case where the GaN substrate has a thickness of 200 μm to 300 μm, there is also a practically sufficient oxygen concentration range which enables flowing currents uniformly through a square with a side length of 2 mm and also generating outputs equal to or higher than 7 mW with the size of invention sample C for an applied current of 20 mA.

Next, a concrete embodiment will be described. The following test samples were employed in the embodiment.

(Invention Sample S1)

A GaN substrate having a thickness of 200 μm was employed wherein the GaN substrate had an oxygen concentration of $1E_{19}/cm^3$ and thus was n-typed. The GaN substrate had a resistivity of 0.007 Ω·cm and a transmittance of 85% for light with a wavelength of 450 nm. The aforementioned GaN substrate was assembled into light emitting devices under the same conditions as those of aforementioned invention sample C except the aforementioned portion. Namely, the plane size of the GaN substrate was made to be a square such that the light emitting surface becomes a square with a side length of 0.2 mm (refer to (1) in the second embodiment). (a2) The following laminated-layer construction was formed on the Ga-surface, which was the first main surface, of the GaN substrate by MOCVD. (A Si-doped N-type GaN layer/a Si-doped n-type $Al_{0.2}Ga_{0.8}N$ layer being a clad layer/a MQW layer consisting of three layers each consisting of two layer construction comprised of a GaN layer and an $In_{0.15}Ga_{0.85}N$ layer/a Mg-doped p-type $Al_{0.2}Ga_{0.8}N$ layer being a clad layer/a Mg-doped p-type GaN layer).

(Comparison Sample T1)

A GaN substrate with a thickness of 400 μm was employed wherein the GaN substrate had an oxygen concentration of $5E19/cm^3$ and thus was n-typed. The GaN substrate had a resistivity of 0.002 Ω·cm and a transmittance of 35% for light with a wavelength of 450 nm. The other conditions other than aforementioned portions were the same as those of invention sample S1.

(Comparison Sample T2)

A GaN substrate with a thickness of 400 μm was employed wherein the GaN substrate had an oxygen concentration of $2E16/cm^3$ and thus was n-typed. The GaN substrate had a resistivity of 1.0 Ω·cm and a transmittance of 90% for light with a wavelength of 450 nm. The other conditions other than aforementioned portions were the same as those for invention sample S1.

(Experiments and Result)

The aforementioned test samples were assembled into p-down-mounted light emitting devices and a current of 20 mA was applied thereto. Invention sample S1 generated a light output of 7 mW, while comparison sample T1 and comparison sample T2 generated a light output of 2.9 mw and a light output of 5 mW, respectively. It can be said that the light output 2.9 mW of comparison sample T1 was an output commensurate with the transmittance of the GaN substrate. For comparison sample T2, the condition of light emission was observed from the second main surface of the GaN substrate forming the light emission surface, and as a result, differences in the light emission intensity were found within the surface. Namely, the light emission intensity was extremely high around the n-electrode and the light emission intensity sharply decreased with increasing distance from the n-electrode. This was because the high resistivity of the GaN substrate prevented currents flowing through the n-electrode from sufficiently spreading through the surface of the light emitting device. This resulted in the occurrence of light emission only around the p-electrode where currents were concentrated. As a result, the light emission output from the entire light emitting device of comparison sample T2 was lower than that of invention sample S1.

Seventh Embodiment

The seventh embodiment of the present invention is characterized in that the dislocation bundle density of the GaN substrate in a p-down mounted light emitting device was restricted to increase the light output. By concentrating and collecting dislocations which generate unavoidably to discretely distribute dislocation bundles during the formation of the GaN substrate in order to improve the crystallinity of the most region, the crystallinity of the most region therebetween of the GaN substrate was improved. It was proven that when the dislocation bundle density exceeds a predetermined value (a dislocation bundle density of 4E2/cm$^2$), this will drastically affect the fabrication yield, beyond expectation since the GaN substrate is placed on the light emitting side in a p-down-mounted light emitting device.

Figure 32:
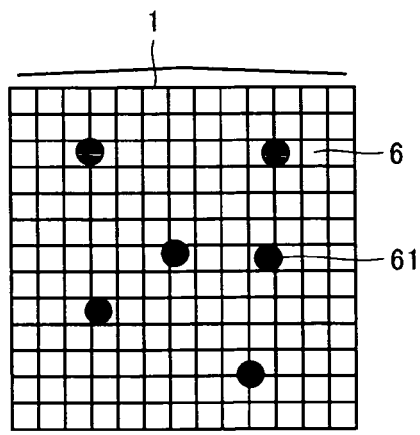
FIG. 32 is a view illustrating cores in the GaN substrate propagated to the epitaxial layers, according to a seventh embodiment.
Figure 33:
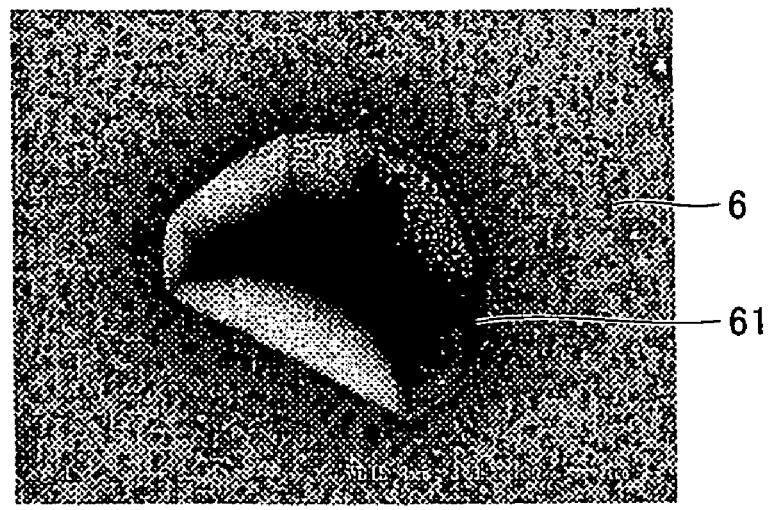
FIG. 33 is a view illustrating cores in the GaN substrate propagated to the epitaxial layers, the cores forming hole-type concave portions.

The aforementioned dislocation bundles in the GaN substrate are transferred to p-type GaN layer 6 which is an epitaxial film and appear on the epitaxial film as cores 61 as illustrated in FIG. 32. Therefore, the dislocation bundle density is substantially in agreement with the core density. Cores 61 become hole-type concave portions as illustrated in FIG. 33, depending on the film forming condition of the epitaxial films. The density of hole-type concave portions drastically affects the fabrication yield of p-down-mounted light emitting devices in which the GaN substrate serves as the light emitting surface.

The following test samples were employed.

(Invention Sample S2)

A GaN substrate having dislocation bundles was employed, wherein a single dislocation bundle was distributed per 500 μm×500 μm on average. This corresponds to a dislocation bundle density of 4E6/m$^2$ (4E2/cm$^2$). Other conditions were the same as those of invention sample S1.

(Comparison Sample T3)

A GaN substrate having dislocation bundles was employed, wherein a single dislocation bundle was distributed per 10 μm×10 μm. This corresponds to a dislocation bundle density of 1E10/m$^2$ (1E6/cm$^2$). Other conditions were the same as those of invention sample S2.

(Experiment and Result)

The aforementioned GaN substrates were assembled into a plurality of light emitting devices on the basis of actual production. A current of 20 mA was applied to the respective test samples and the yield of light emitting devices capable of generating light outputs equal to or more than 7 mW was determined. As a result, invention sample S2 provided a yield of 97%, while comparison sample T3 provided a yield of 75%. Namely, dislocation bundle densities equal to or lower than 4E6/m$^2$ can provide yields which enable production. When the dislocation bundle density exceeds the aforementioned density, it becomes impossible to continuously product light emitting devices on a commercial basis.

Light emitting device which generated a light output lower than 7 mW were disassembled and the chips were extracted therefrom and examined. The electrodes were removed from the extracted chips using proper acid solution and the chips were examined from the p-type semiconductor side thereof. As a result, in a plurality of chips, there were observed epitaxial films including portions which had not been grown at the portions of dislocation bundles in the GaN substrate. There were observed hole-type concave portions having a diameter of about 1 μm at the portions of the dislocation bundles. Such hole-type concave portions were not found in light emitting devices capable of generating light outputs equal to or higher than 7 mW.

Further, a current of 20 mA was applied to the aforementioned test samples in the state where the both electrodes had been formed. As a result, the light emitting devices having the aforementioned hole-type concave portions all had a driving voltage lower than 1 V. This was because the electrodes were embedded in hole-type concave portions thereby short-circuiting between the p-electrode side and the n-electrode side. This prevented currents from spreading through the active layer, thereby preventing sufficient currents from being supplied. This resulted in the low light outputs.

Since the yield depends on the dislocation bundle density, the larger the chip size, the lower the yield becomes. Comparison sample T3 had a light emitting surface with a size of 400 μm□, and therefore the yield was 75%. However, the inventors have discovered from experiments that when the chip size is 400 μm□, the yield is degraded to about 50%.

Eighth Embodiment (Eighth Embodiment (1))

Figure 34:
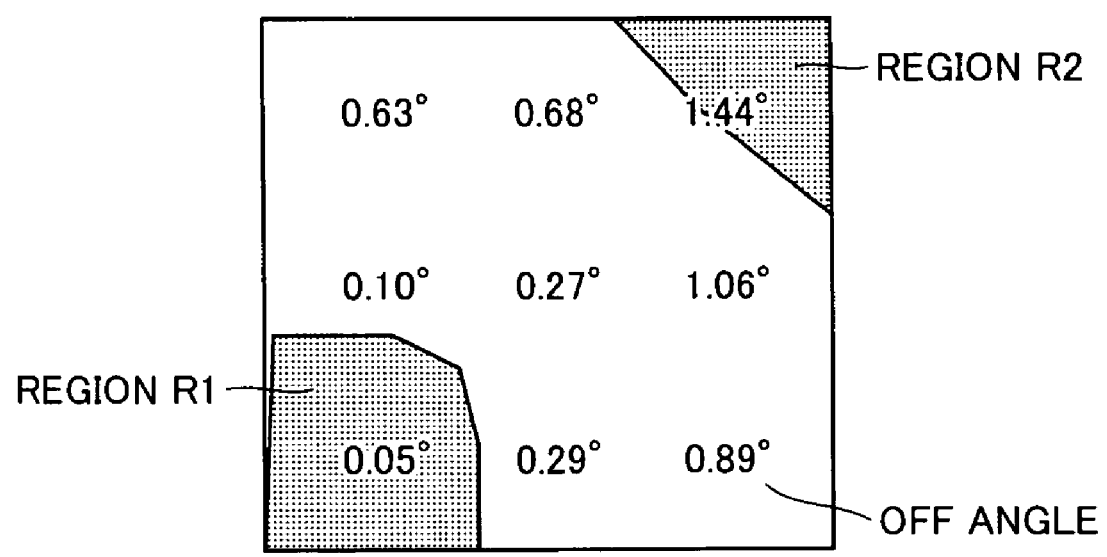
FIG. 34 is a view illustrating the off-angle distribution relative to the c-plane within a GaN substrate with a size of 20 mm×20 mm, according to an eighth embodiment.
Figure 35:
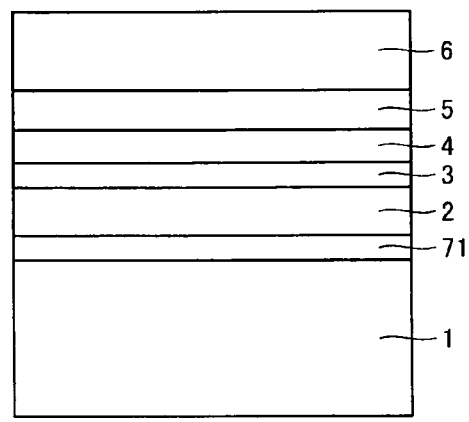
FIG. 35 is a view illustrating a buffer layer placed between the GaN substrate and the AlGaN clad layer, according to the eighth embodiment.

The eighth embodiment (1) of the present invention is characterized in that an n-type AlGaN buffer layer and an n-type GaN buffer layer are placed between the GaN substrate and the n-type AlGaN clad layer 3. Substrates usually have warpage and GaN substrates have particularly large warpage. Therefore, GaN substrates have off angles which largely vary within the substrate surface, as illustrated in FIG. 34. Referring to FIG. 34, if epitaxial films are formed on this GaN substrate, then the construction is divided into light emitting devices and then the light outputs of the light emitting devices are measured with the GaN substrate placed at the light emitting surface side (top side), light emitting devices formed on the region R1 lying at a corner and having a small off angle of 0.05° level and on the region R2 lying at a corner and having a large off angle of 1.5° level can not generate light outputs of 8 mW or higher for an applied current of 20 mA. This is because of the poor crystallinity of the epitaxial films formed on the GaN substrate. Therefore, as illustrated in FIG. 35, an attempt was made to place an n-type AlGaN buffer layer 71 having a lattice constant intermediate between those of the GaN substrate and AlGaN clad layer 3 and an n-type GaN buffer layer 2 between the GaN substrate and AlGaN clad layer 3, in order to alleviate the difference in the lattice constant. More specifically, the present embodiment is characterized in that n-type AlGaN buffer layer 71 is placed at the aforementioned position.

The following test samples were employed.

(Invention Sample S3)

A GaN substrate having off angles relative to the c-plane was employed, the off angles varying continuously from a region having an off angle of 0.05° to a region having an off angle of 1.5° within the surface of 20 mm×20 mm, as illustrated in FIG. 34. The GaN substrate had a resistivity of 0.01 Ω·cm, a dislocation density of 1E7/cm$^3$ and a thickness of 400 μm. By using the GaN substrate having the off-angle distribution, light emitting devices were fabricated from respective portions of the aforementioned GaN substrate having a size of 20 mm×20 mm according to the epitaxial-layer fabrication process for invention sample A of the first embodiment. As illustrated in FIG. 35, an Al$_{0.15}$Ga$_{0.85}$N buffer layer having a thickness of 50 μm was placed between GaN substrate 1 and n-type GaN layer 2.

(Comparison Sample T4)

A GaN substrate having off angles relative to the c-plane was employed, the off angles varying continuously from a region having an off angle of 0.05° to a region having an off angle of 1.5° within the surface of 20 mm×20 mm. The GaN substrate had a resistivity of 0.01 Ω·cm, a dislocation density of 1E7/cm$^3$ and a thickness of 400 µm. A plurality of light emitting devices were fabricated from respective portions of the GaN substrate according to the epitaxial-layer fabrication process for invention sample A of the first embodiment. In comparison sample T4, an n-type GaN layer was formed on GaN substrate 1 and an $Al_{0.15}Ga_{0.85}N$ buffer layer was not placed between the GaN substrate and the n-type GaN layer.

(Tests and Result)

Figure 36:
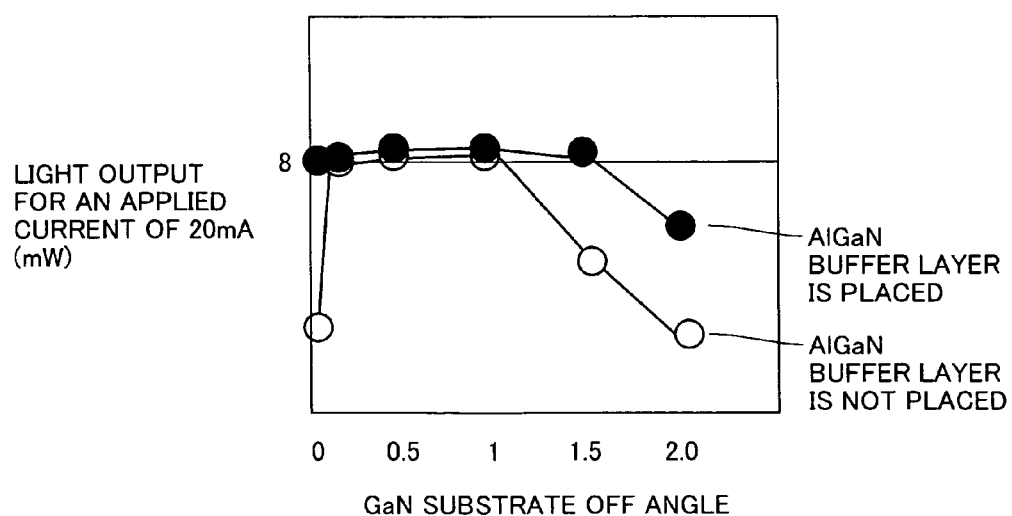
FIG. 36 is a view illustrating the widened off-angle range which allows generating light outputs equal to or higher than 8 mW, according to the eighth embodiment.

A current of 20 mA was applied to the light emitting devices. Invention sample S3 generated light outputs of 8 mW or more from the regions having off angles of 0.05 to 1.5° including the aforementioned regions R1, R2 in the GaN substrate having a size of 20 mm×20 mm (see FIG. 36). However, with comparison sample T4, only light emitting devices formed on the regions having off angles from 0.1° to 1.0° could generate light output of 8 mW or more. The regions having off angle levels of 0.05° and 1.5° generated light outputs below 8 mW. This was because invention sample S3 included the $Al_{0.15}Ga_{0.85}N$ buffer layer and this enabled formation of epitaxial layers having excellent crystallinity even though the GaN substrate with largely-varying off angles was employed.

(Eighth embodiment (2))

Figure 41:
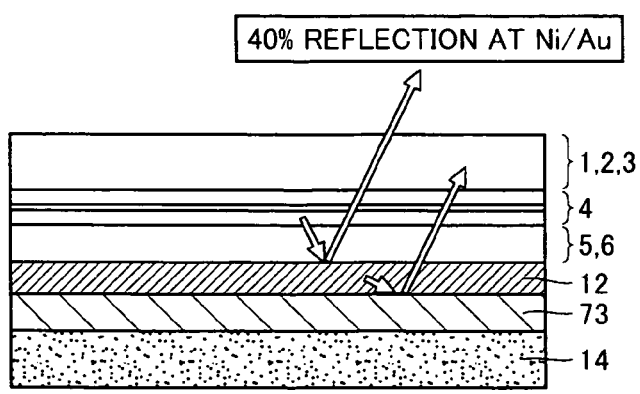
FIG. 41 is a view illustrating light emission and reflection in a comparison sample T6 according to the tenth embodiment of the present invention.

The eighth embodiment (2) is characterized in that an n-type AlGaN buffer layer and an n-type GaN buffer layer are placed between the GaN substrate and n-type AlGaN clad layer 3, similarly to the eighth embodiment (1), in order to eliminate hole-type concave portions as illustrated in FIG. 41 which generate when epitaxial films are formed on the portions of dislocation bundles in the GaN substrate as described in the tenth embodiment.

(Invention Sample S2-2)

Figure 43:
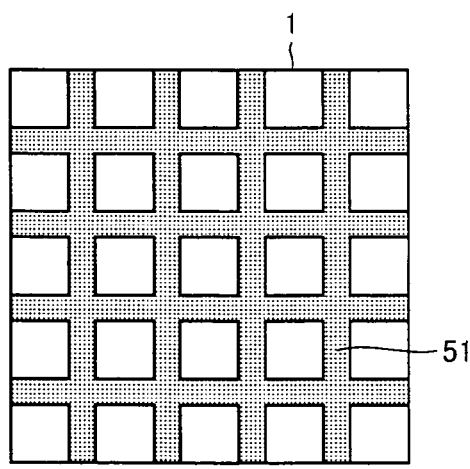
FIG. 43 is a view illustrating the main surface of a GaN substrate in which plate-type crystal inversion regions appear in a lattice shape, according to an eleventh embodiment of the present invention.

Similarly to comparison sample T3, a GaN substrate having a diameter of 2 inch and having dislocation bundles was employed, wherein one dislocation bundle was distributed per 10 µm×10 µm. This corresponds to a dislocation bundle density of 1E6/cm$^2$. As illustrated in FIG. 43, an $Al_{0.15}Ga_{0.85}N$ buffer layer having a thickness of 50 µm was placed between GaN substrate 1 and n-type GaN buffer layer 2. Other conditions were the same as those of invention sample S2.

(Tests and Result)

After the formation of the epitaxial layers, the epitaxial-layer-side surface of the wafer was observed with a differential interference microscope and SEM (Scanning Electron Microscope). As a result, no hole-type concave portion as in FIG. 41 was found. The entire GaN substrate having a diameter of 2 inch except the outer edge portion with a width of about 5 mm was assembled into light emitting devices. A single light emitting device was extracted from every 50 light emitting devices and a current of 20 mA was applied thereto. Thus, the yield of light emitting devices capable of generating a light output of 8 mW or more was determined. The resultant yield was 100%.

Ninth Embodiment

The ninth embodiment is characterized in that a p-type AlGaN layer having an increased conductivity is placed outside of MQW 4/p-type AlGaN clad layer 5/p-type GaN layer 6, and an Ag electrode layer having a high reflectivity was placed over the entire surface as the p-electrode on the down side. Therefore, no other electrode is provided in consideration of the work function. With this construction, the device has a high reflectivity at the down-side bottom portion, and this reduces light absorption which would occur in the case of using other metal electrodes, thereby increasing the light emitting efficiency.

The following test samples were employed.

Figure 37:
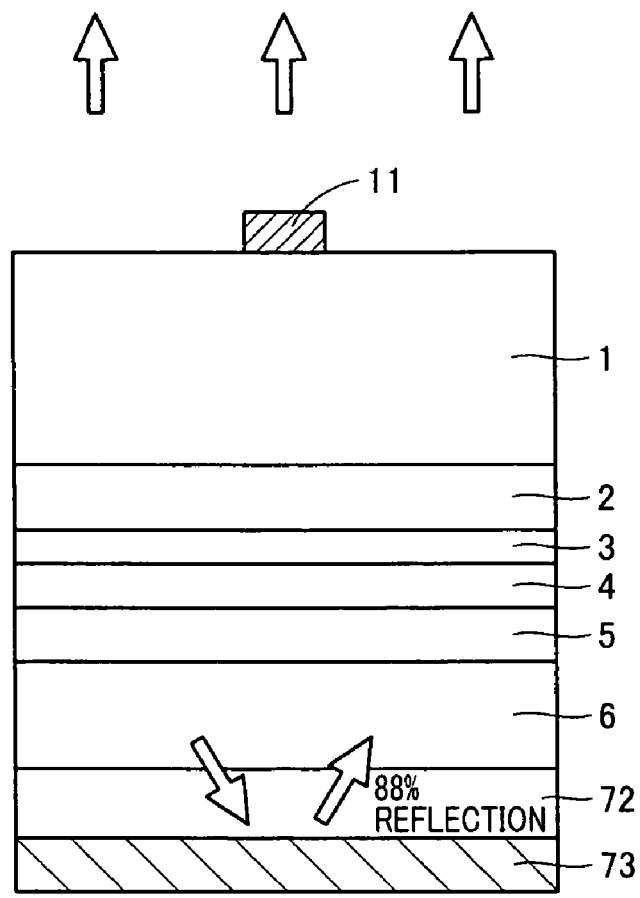
FIG. 37 is a view illustrating a light emitting device, according to a ninth embodiment of the present invention.

(Invention Sample S4 (see FIG. 37))

Similarly to the epitaxial laminated-layer construction of invention sample C, the following laminated-layer construction was formed on the Ga-surface, which is the first main surface, of a GaN substrate. (/MQW 4/Mg-doped p-type $Al_{0.2}Ga_{0.8}N$ layer 5 being a clad layer/Mg-doped p-type GaN layer 6/a Mg-doped InGaN layer 72 with a thickness of 5 nm).

The aforementioned laminated-layer construction is characterized in that a Mg-doped InGaN layer 72 with a thickness of 5 nm is provided in contact with Mg-doped p-type GaN layer 6. Further, in invention sample S4, an Ni/Au electrode layer was not formed as the p-electrode on the down side, and instead thereof an Ag layer 73 having a thickness of 100 nm was formed.

(Comparison Sample T5)

An Ag electrode layer having a thickness of 100 nm was further placed on the Ni/Au electrode layer, as the p-electrode placed at the down side.

(Tests and Result)

Invention Sample S4 included p-type InGaN layer 72 in contact with p-type GaN layer 6 and therefore had a low acceptor level, thus increasing the carrier concentration. Therefore, even though Ag reflective film 73 having a work function which was not significantly high was placed in contact with p-type InGaN layer 72 as the p-electrode, the contact resistance between Ag reflective film 73 and p-type InGaN layer 72 was not significantly increased. The driving voltage of the light emitting device of invention sample S4 was compared with the driving voltage of the light emitting device of comparison sample T5. As a result, the difference therebetween was smaller than 0.05 V and thus no significant difference was noticed.

Invention sample S4 generated a light output of 10.1 mW for an applied current of 20 mA, while comparison sample T5 generated 8.4 mW. Further, a lamp of the same construction as invention sample A (a GaN substrate and epitaxial laminated-layer construction) which was p-down mounted generated a light output of 7 mW.

The reason that invention sample S4 generated a higher light output as described above is as follows. Since an Ni/Au electrode layer was not provided and light from the light emitting layer towards the p-semiconductor layer side was reflected by the Ag layer with a reflectivity of 88% without being absorbed at an Ni/Au layer. On the other hand, in comparison sample T5, the reflectivity of light at the p-electrode layer=absorption of 70% at the Ni/Au×the reflectivity of Ag×re-absorption of 70%=44%. Thus, the reflectivity became low. As a result, with invention sample S4, the light output extracted to the outside reached 1.2 times that of comparison sample T5.

While an Ag film was employed as the p-electrode in the invention sample, any material may be employed provided that the material has a high reflectivity and a contact resistance with p-type InGaN layer 72 which is not significantly large. For example, Al or Rh may be employed.

Tenth Embodiment

Figure 38:
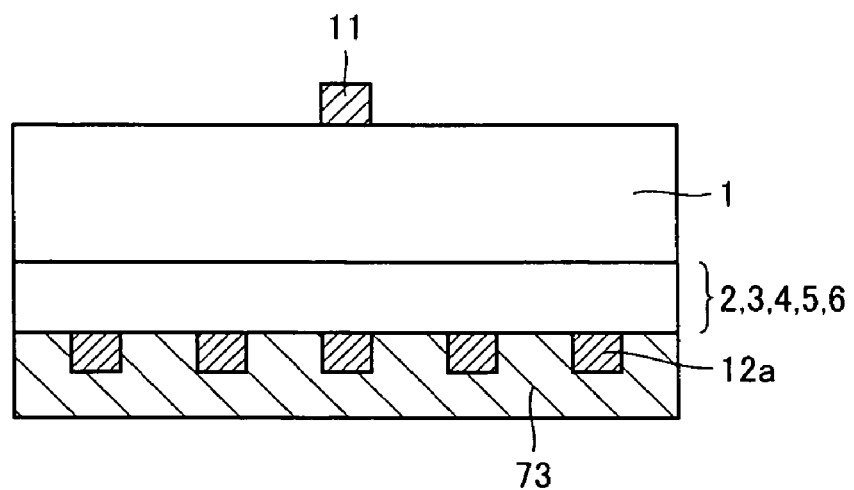
FIG. 38 is a cross sectional view focusing attention on the p-electrode of a light emitting device, according to a tenth embodiment of the present invention.
Figure 39:
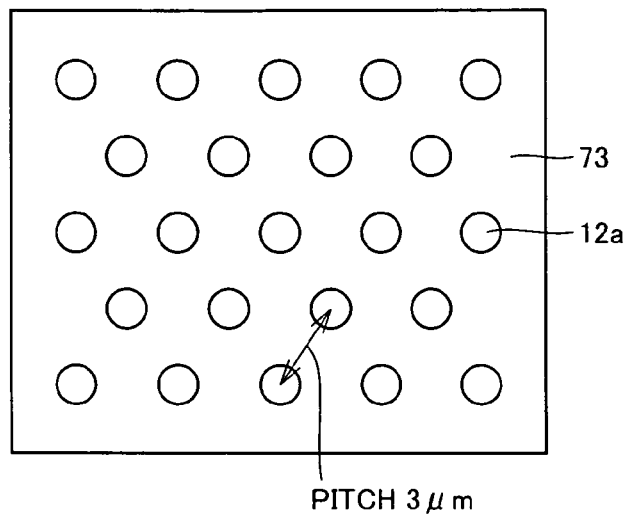
FIG. 39 is a view illustrating the light emitting device of FIG. 10, wherein the p-electrodes are transparently illustrated.

The tenth embodiment of the present invention is characterized in that Ni/Au layers having a low contact resistance with the p-type GaN layer were discretely placed and an Ag film is applied to fill the gaps, as the p-electrode at the down side, in order to increase the light output. Referring to FIG. 38 and FIG. 39, Ni/Au electrode layers 12a are discretely placed with a predetermined pitch on the down-side bottom surface of the epitaxial layers. An Ag layer 73 is placed to fill the gaps and cover the down-side bottom surface of the epitaxial layers and Ni/Au electrode layers 12a at the down-side bottom surface of the epitaxial layers.

Further, a typical pitch of discrete Ni/Au electrode layers 12a is 3 μm. The pitch of 3 μm is based on that the diameter of the area in which currents spread is 6 μm at best in a typical p-type GaN layer or p-type AlGaN clad layer because of the resistivities. Namely, by setting the pitch to 3 μm, currents from a single discrete electrode reach the adjacent discrete electrodes. In order to flow currents through the electrode layers without causing discontinuity, it is preferable to set the pitch to below 3 μm. However, if the pitch is excessively small, the effective amount of extracted light will be reduced by the discretely-placed Ni/Au electrode layers.

For example, with the construction of the p-electrode illustrated in FIG. 38 and FIG. 39, when the area ratio of the Ni/Au electrodes which are discretely placed is 20% the light reflectivity (calculation)=the reflectivity of 88%×the area ratio of 80%+the reflectivity of 40%×the area ratio of 20%=78% (calculation) is obtained. Based on this calculation, p-electrodes were actually fabricated and the light output was measured.

The following test samples were employed.

(Invention Sample S5)

Figure 40:
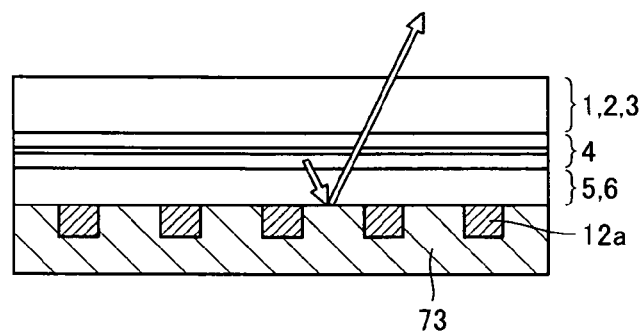
FIG. 40 is a view illustrating light emission and reflection in an invention sample S5 according to the tenth embodiment of the present invention.

An epitaxial-laminated layer construction was fabricated according to the same fabrication process as that for invention sample C of the second embodiment. In the fabrication process of the p-electrodes, an Ni layer having a thickness of 4 nm was formed on the p-type GaN layer and then an Au layer having a thickness of 4 nm was formed on the entire surface thereof. Next, patterning was applied thereto using a resist mask to form discretely-distributed Ni/Au electrodes (see FIG. 38 and FIG. 39). Then, this construction was subjected to a heating process in an inert gas atmosphere to change the contact resistance to 5E−4 Ω·cm². Subsequently, an Ag layer was formed over the entire surface to fill the gaps of the Ni/Au electrodes and cover the Ni/Au electrodes. The Ag layer was made as a reflective electrode. The area ratio of the discretely-distributed Ni/Au electrodes relative to the p-type GaN layer was 20% and the area ratio of Ag was 80%. Further, the pitch of Ni/Au electrodes 12 was set to 3 μm (see FIG. 40).

(Comparison Sample T6)

An epitaxial laminated-layer construction was fabricated on a GaN substrate according to the same fabrication process as that for invention sample C of the second embodiment. As a p-electrode, an Ni/Au layer was placed over the entire surface of the p-type GaN layer and then a heating process was applied thereto. Next, unlike the construction of invention sample C, an Ag layer was formed over the entire surface of the Ni/Au layer (see FIG. 41).

Figure 42:
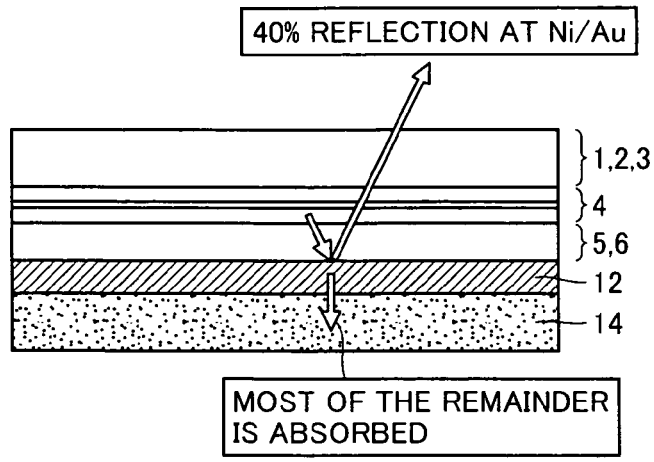
FIG. 42 is a view illustrating light emission and reflection in invention sample A for comparison in the tenth embodiment of the present invention.

FIG. 42 illustrates, for comparison, the behavior of reflection of light traveling toward the down side in a light emitting device of invention sample C.

(Tests and Result)

A current of 20 mA was applied to the respective light emitting devices fabricated as described above and the light outputs were measured. Invention sample S5 generated a light output of 10.1 mW, while comparison sample T6 generated 8.4 mW. The ratio of the light reflected at the p-electrode and then emitted from the emitting surface, out of the light propagated toward the mounting side (down side) from the active layer, reached 86% (see FIG. 40). As compared with this, the aforementioned ratio in comparison sample T6 was 67%. On the other hand, the aforementioned ratio in the light emitting device of invention sample C was 40% (FIG. 42).

In invention sample S5, 80% of the light propagated toward the down side was reflected at the Ag occupying 80% of the p-electrode with a reflectivity of 88% and then 20% of the light was reflected at the Ni/Au layers occupying 20% of the p-electrode with a reflectivity of above 40% (not simply a reflectivity of 40%). As a result, in invention sample S5, the aforementioned ratio was 86%. In comparison sample T6, light was further reflected at the Ag layer placed at the down side of the Ni/Au layer, and this reflection made the aforementioned ratio higher than that of invention sample C.

It goes without saying that comparison sample T6 belongs to the invention samples in a broad sense. Comparison sample T6 is merely defined as a comparison sample for convenience in order to describe the invention sample.

The aforementioned Ni/Au electrode layers may be replaced with Pt electrode layers or Pd electrode layers. Further, the Ag reflective electrode layer may be replaced with a Pt layer or Pd layer.

Similarly, when the area ratio of the Ni/Au electrodes was 10%, the light output for an applied current of 20 mA was 10.3 mW, When the area ratio of the Ni/Au electrodes was 40%, the light output for an applied current of 20 mA was 9.3 mW. Thus, the invention sample generated higher light outputs than that of comparison sample T6 depending on the area ratio. However, when the area ratio of the Ni/Au electrodes was 2%, which is lower than 10%, invention sample generated a light output of only 8.4 mW which was equivalent to that of comparison sample T6 and the inventors discovered from experiments that there was light emission unevenness, namely extremely high light emission around the Ni/Au electrodes.

Eleventh Embodiment

Figure 44:
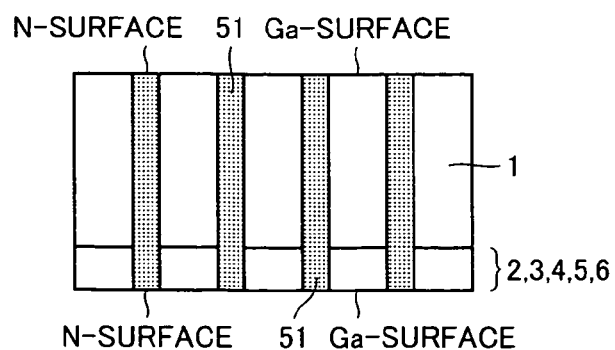
FIG. 44 is a cross sectional view of the GaN substrate illustrating the plate-type crystal inversion regions of FIG. 43.

The eleventh embodiment of the present invention is characterized in that a plurality of parallel plate-shaped crystal inversion regions propagated from the GaN substrate to the epitaxial layers are eliminated and the p-electrodes at the down side are placed at the respective gap regions of the plate-shaped crystal inversion regions. Plate-shaped crystal inversion regions are distributed in parallel to the thickwise direction of the GaN substrate and appear at the main surface of the GaN substrate in a stripe shape. The plate-shaped crystal inversion regions are propagated to epitaxial layers 2, 3, 4, 5, and 6. FIG. 43 and FIG. 44 illustrate plate-shaped crystal inversion regions placed in a lattice shape on the main surface.

Figure 45:
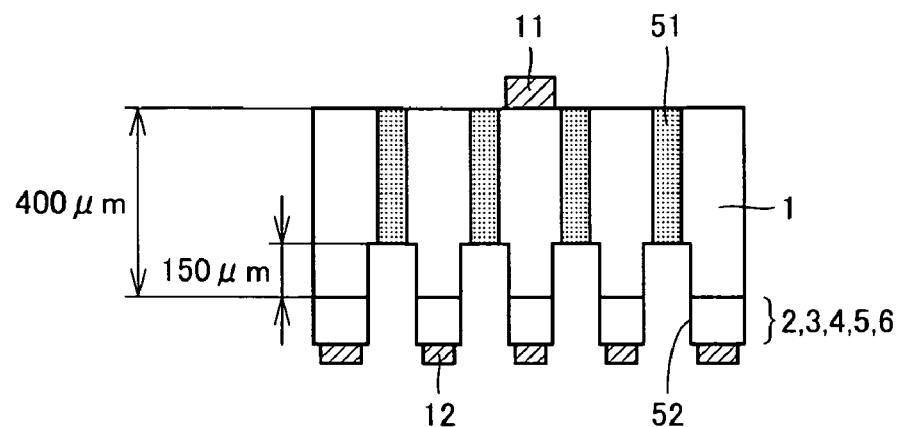
FIG. 45 is a cross sectional view illustrating invention sample S6 according to the eleventh embodiment.

The present invention is characterized in that the aforementioned plate-shaped crystal inversion regions in the epitaxial layers are removed to a predetermined depth in the first main surface side to separate the respective epitaxial layers and p-electrodes are provided on the respective separated epitaxial layers (see FIG. 45). Plate-shaped crystal inversion regions may be lattice-shaped crystal inversion regions consisting of plate-shaped crystal inversion regions intersecting with each other on the main surface as illustrated in FIG. 43 or may be parallel plate-shaped crystal inversion regions which are aligned and distributed in a single direction on the main surface as will be described later. Plate-shaped crystal inversion regions are regions in which dislocations are concentrated with a high density. Plate-shaped crystal inversion regions are similar to dislocation bundles or cores 61 illustrated in FIG. 32. However, while dislocation bundles have a string shape or a wide line shape, plate-shaped crystal inversion regions 51 have a thickness and are placed in a plane shape.

(Invention Sample S6)

In the GaN substrate illustrated in FIG. 43 and FIG. 44, the first main surface at the epitaxial-layer side had a surface orientation of (0001) surface, namely the c-plane. The plate-shaped crystal inversion regions which were surface-symmetrical to the first main surface were (000-1) surface, namely the -c-plane, and the c-axis was grown in the reverse direction. In the c-plane, the surface was a Ga-surface in which Ga atoms were arranged, while in the crystal inversion regions the surface was a N-surface in which N atoms were arranged. In invention sample S6, a GaN substrate including crystal inversion regions having a width of 30 μm and arranged with a pitch of 100 μm on the first main surface was employed. The crystal inversion regions were propagated to the epitaxial layers formed on the GaN substrate.

The laminated layer construction of invention sample S6 was fabricated using the aforementioned GaN substrate, according to the same fabrication process as that of invention sample C. In the fabrication process of the p-electrode, a mask pattern capable of covering only the crystal inversion regions which were propagated as illustrated in FIG. 44 was applied to the p-type GaN layer and p-electrode layers were fabricated only on the mask gap regions in the c-plane. Then, the mask pattern was removed.

Subsequently, the aforementioned GaN substrate was held in 8N (normal) KOH at 80° C. with a mask applied to the entire second main surface (back surface) to etch away the crystal inversion regions on the first main surface through the epitaxial layers such as the p-type GaN layer to the inside of the GaN substrate to form slots 52. Plate-shaped crystal inversion regions 51 were regions in which dislocations were concentrated with a high density and thus were easily etched by KOH. The etching depth in the GaN substrate was 150 μm from the boundary between the epitaxial layers and the GaN substrate inside the GaN substrate. Subsequently, the mask was removed and an insulating film was deposited to fill slots 52 (FIG. 45).

(Tests and Result)

The aforementioned invention sample S6 was assembled into a light emitting device and a current of 20 mA was applied thereto. As a result, the light emitting device generated a light output of 8.4 mW, which was 1.2 times the light output 7 mW of the light emitting device of invention sample C.

Figure 46:
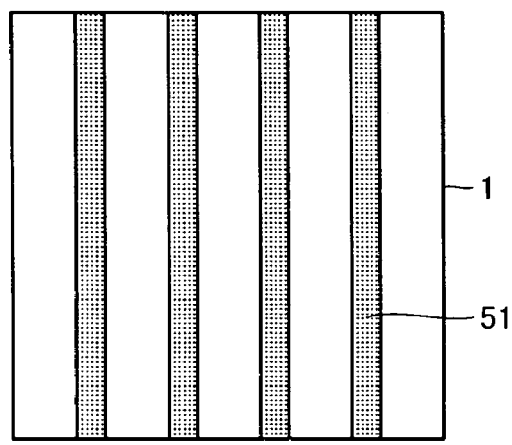
FIG. 46 is a plane view illustrating parallel-placed plate-type crystal inversion regions different from those of FIG. 43, included in the eleventh embodiment.
Figure 47:
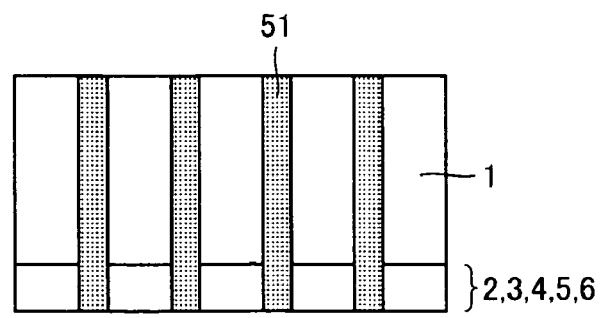
FIG. 47 is a cross sectional view of FIG. 46.

As previously described, while in invention sample S6 the plate-shaped crystal inversion regions were arranged in a lattice shape, plate-shaped crystal inversion regions are not required to have a lattice shape and may be plate-shaped crystal inversion regions arranged in parallel along a single direction on the main surface of the GaN substrate as illustrated in FIG. 46 and FIG. 47. Also, in the case of using a GaN substrate in which dot-shaped (actually, plane-shaped or small-round-shaped) crystal inversion regions are regularly placed, it is possible to generate light outputs higher than that of invention sample C similarly to invention sample S6, depending on the size and depth of the etching holes.

Twelfth Embodiment

The twelfth embodiment of the present invention is characterized in that a fluorescent plate 46 is placed above the semiconductor chip such that it faces with GaN substrate 1 and further this construction is sealed with a resin 15. There is a novelty in that the fluorescent plate is placed such that it faces with the GaN substrate serving as the emitting surface in the p-down mounted construction. Invention samples S7 and S8 illustrated in FIG. 48 and comparison sample T7 were utilized as test samples.

(Invention Sample S7)

Figure 48:
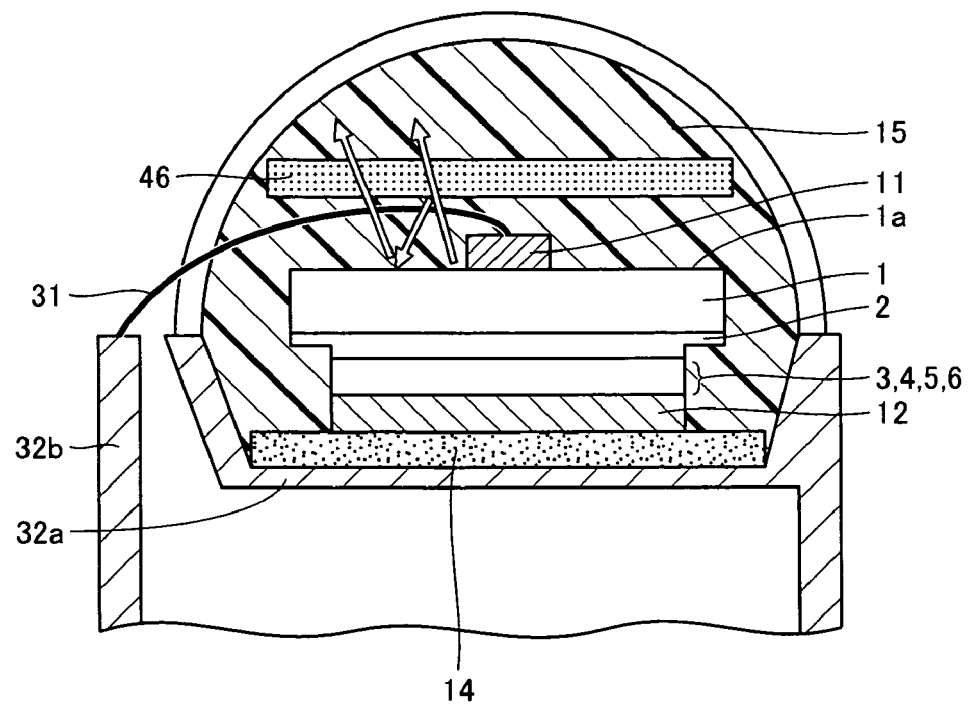
FIG. 48 is a cross sectional view illustrating light emission and reflection in an invention sample S7 according to a twelfth embodiment of the present invention.

In the process for forming the epitaxial laminated-layer construction of invention sample S7, basically, the same processes as the corresponding processes for invention sample C were performed. Then, the construction was scribed into predetermined shapes and the chipped constructions were made to be light emitting devices. The resultant light emitting devices had a size of 225 μm□. As illustrated in FIG. 48, a fluorescent plate 46 was placed above the chip which was p-down mounted such that it faced with the back surface of GaN substrate 1 and further the chip was sealed with an epoxy resin 15 to form a white light emitting device.

Fluorescent plate 46 was fabricated with the following fabrication method. A bulk-shaped ZnSSe crystal in which I (iodine) had been diffused by halogen transfer was fabricated and then this bulk-shaped ZnSSe crystal was heated in an atmosphere of Zn, Cu to diffuse Cu into the ZnS Se. Subsequently, this bulk ZnSSe crystal was polished to a thickness of 0.5 mm using a rough polishing disc and then cut into a shape which can be accommodated in the lead frame. The surface and the back surface of the fluorescent plate fabricated with the aforementioned method had a roughness $R_{max}$ of 1 μm.

(Invention Sample S8)

Figure 49:
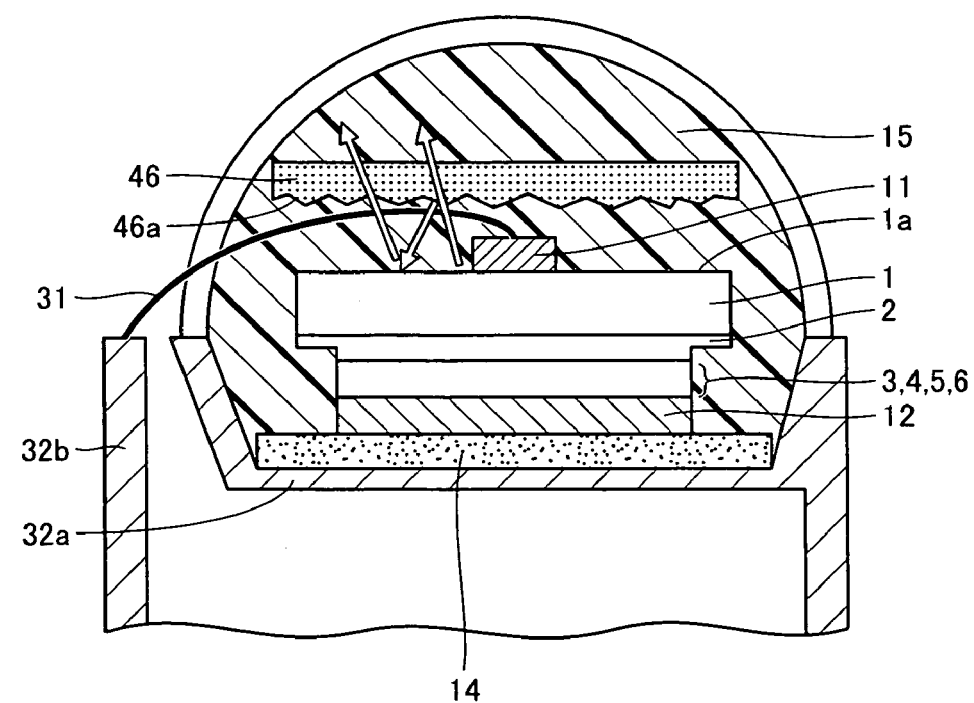
FIG. 49 is a cross sectional view illustrating light emission and reflection in an invention sample S8 of another embodiment, according to the twelfth embodiment of the present invention.

In invention sample S8, asperities were formed on surface 46a of fluorescent plate 46 to be faced with the GaN substrate (see FIG. 49). The height of asperities was set to 2 μm and the pitch of the asperities was set to 5 μm on average. The other constructions were the same as those of invention sample S7.

(Comparison Sample T7)

Figure 50:
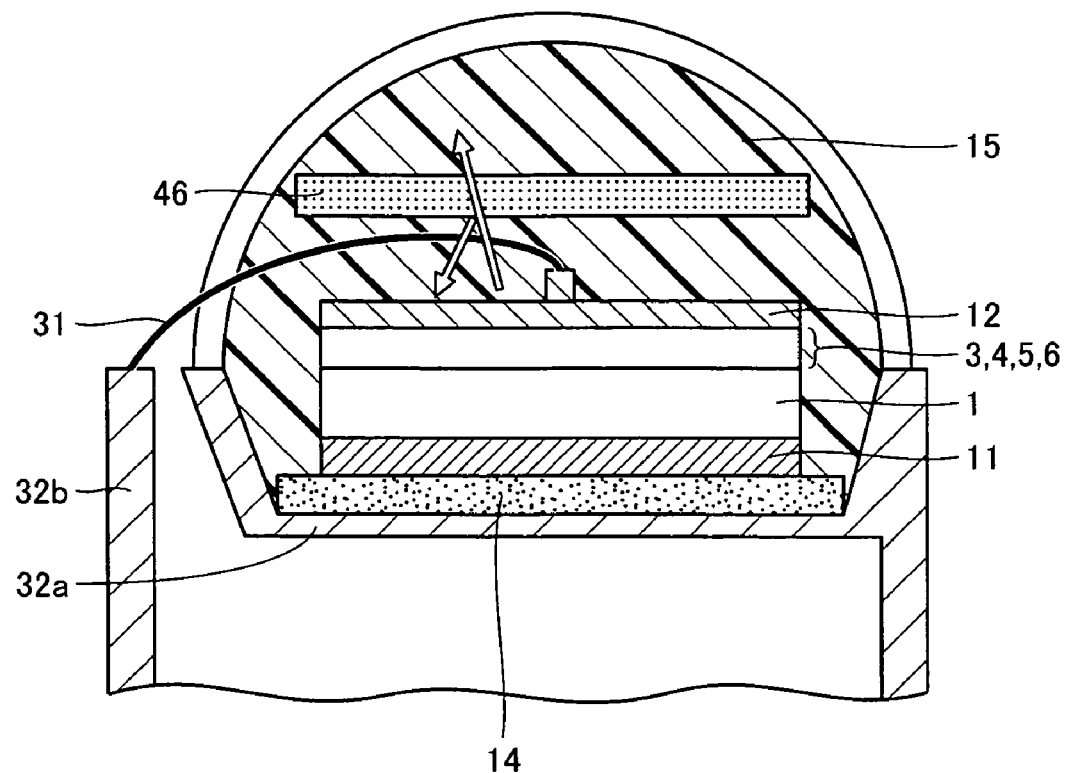
FIG. 50 is a cross sectional view illustrating light emission and reflection in a comparison sample T7.
Figure 51:
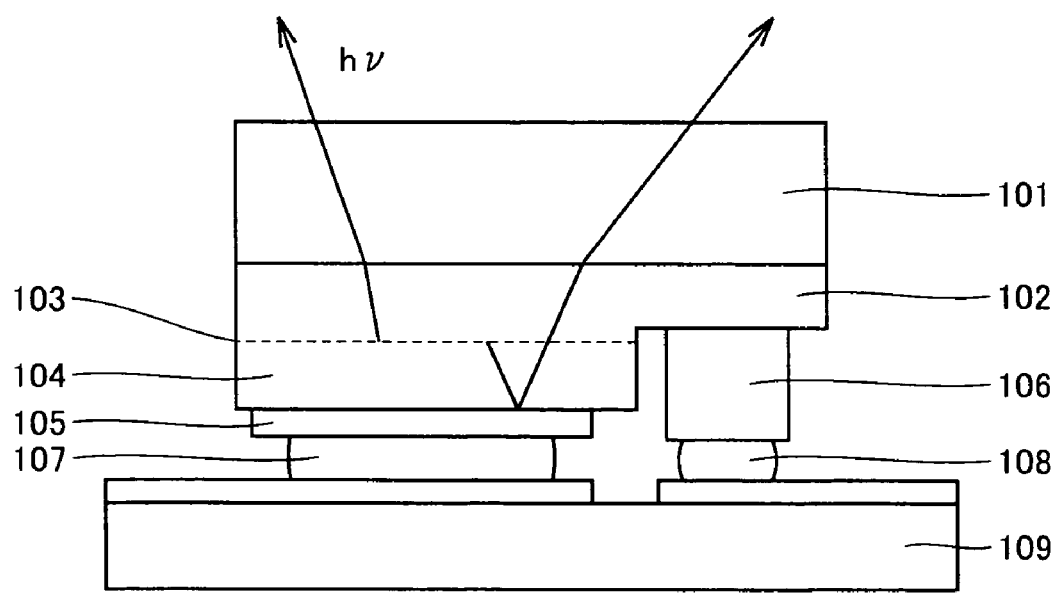
FIG. 51 is a view illustrating a conventional LED.

As illustrated in FIG. 50, a fluorescent plate 46 was placed above the chip which was p-top mounted such that it faced with the chip and further the chip was sealed with an epoxy resin 15 to form a white light emitting device.

(Tests and Result)

The aforementioned GaN substrates were assembled into light emitting devices and a current of 20 mA was applied thereto. The resultant light emission luminances were as follows. Invention sample S7 generated 1.39 lm and invention sample S8 generated 1.51 lm and thus the both samples could generate high luminances. On the other hand, comparison sample T7 generated a luminance of 1.05 lm. The above results show that placing a fluorescent plate such that it faces with the GaN substrate in a p-down-mounted device can ensure higher luminances than placing a fluorescent plate in a p-top-mounted device. Thus, it has been proven that the roughed surface of the fluorescent plate to be faced with the GaN substrate further increases the luminance.

Next, embodiments of the present invention will be enumerated even though some of them will overlap with the aforementioned embodiments.

The aforementioned GaN substrate is n-typed with oxygen-doping and has an oxygen concentration of 1E17 to 2E19 oxygen atoms/cm$^3$ and a thickness of 100 μm to 600 μm.

By setting the oxygen concentration to a value equal to or higher than 1E19 atoms/cm$^3$, the resistivity of the GaN substrate can be increased and therefore currents introduced from the p-electrode can be sufficiently spread through the GaN substrate, which enables sufficiently utilizing the width of the active layer to cause light emission. Further, by setting the oxygen concentration to a value equal to or lower than 2E19 atoms/cm$^3$, a transmittance equal to or higher than 60% can be ensured for light with a wavelength of 450 nm, thereby increasing the transmittance of the GaN substrate which serves as the light emitting surface. This enables ensuring the light output. The aforementioned oxygen concentration range is particularly effective for the GaN substrate thickness range from 100 μm to 600 μm.

Further, the aforementioned oxygen concentration may be in the range from 2E18 to 5E18 oxygen atoms/cm$^3$ and the thickness of the GaN substrate may be in the range from 100 μm to 600 μm. The both side lengths of the rectangular-shaped surface of the light emitting surface at the aforementioned second main surface may be equal to or smaller than 0.5 mm.

This configuration enables causing light emission over the entire light emitting surface and also generating sufficient light outputs.

Further, the aforementioned oxygen concentration may be in the range from 3E18 to 5E18 oxygen atoms/cm$^3$ and the thickness of the GaN substrate may be in the range from 200 μm to 300 μm. The both side lengths of the rectangular-shaped light emitting surface at the aforementioned second main surface may be equal to or smaller than 2 mm and the both side lengths of the rectangular-shaped surface of the light emitting surface at the aforementioned second main surface may be equal to or smaller than 0.5 mm.

This configuration enables causing light emission over the entire light emitting surface and also generating sufficient light outputs, even when the chip size is increased to 2 mm□ at maximum.

A GaN substrate having dislocation bundles distributed over the first main surface of the GaN substrate with a density equal to or lower than 4E6/cm$^3$ on average may be employed, wherein the dislocation bundles have been created by discretely concentrating dislocations which unavoidably generate during the formation of the GaN substrate into a string shape to distribute them along the substrate thickness direction in order to improve the crystallinity of the most region of the aforementioned GaN substrate.

This configuration enables fabrication of light emitting devices capable of generating light outputs equal to or higher than a predetermined value with a high fabrication yield.

The aforementioned dislocation bundles are distributed with a density equal to or lower than 4E2/cm$^2$ on average on the first main surface and the shorter side length of the light emitting surface at the aforementioned second main surface may be in the range from 200 μm to 400 μm.

When a miniaturized light emitting device as described above includes dislocation bundles, the performance of the device will be unavoidably degraded, thereby directly resulting in reduction in the yield. By reducing the density of dislocation bundles as described above, the reduction in the yield can be restricted to a practically acceptable range.

Between the aforementioned GaN substrate and the n-type Al$_x$Ga$_{1-x}$N layer (x is in the range from 0 to 1), an n-type AlGaN buffer layer is placed in contact with the GaN substrate, an n-type GaN buffer layer is placed in contact with the n-type AlGaN buffer layer and the n-type Al$_x$Ga$_{1-x}$N layer (x is in the range from 0 to 1) may be placed in contact with the n-type GaN buffer layer.

In the case of a hetero-epitaxial laminate-layer construction as described above, an n-type AlGaN buffer layer and an n-type GaN buffer layer may be placed between the GaN substrate and the n-type Al$_x$Ga$_{1-x}$N layer (x is in the range from 0 to 1) which is a clad layer for the active layer.

By adding the n-type AlGaN buffer layer as well as the n-type GaN buffer layer between the GaN substrate and the clad layer, a hetero-epitaxial laminate-layer construction with an excellent crystallinity can be formed.

The aforementioned laminated-layer construction may be advantageously employed particularly in the case where the GaN substrate includes a region with an off angle equal to or lower than 0.0° and a region with an off angle equal to or greater than 1.0°.

With this configuration, by adding the n-type AlGaN buffer layer as well as the n-type GaN buffer layer between the GaN substrate and the clad layer, a hetero-epitaxial laminate-layer construction with an excellent crystallinity can be formed, even when the GaN substrate has warpage and the off angle varies.

A p-type GaN buffer layer may be placed in contact with the aforementioned p-type Al$_x$Ga$_{1-x}$N layer (x is in the range from 0 to 1) at the down side thereof and a p-type InGaN contact layer may be placed in contact with the p-type GaN buffer layer.

With the aforementioned configuration, a p-type InGaN contact layer with an excellent electrical conductivity may be placed under the p-electrode layer, and this decreases the necessity of selecting the material of the p-electrode layer in consideration of the work function. This enables selecting the material of the p-electrode in consideration of the reflectivity, for example.

The aforementioned p-type InGaN contact layer may have a Mg concentration in the range of 1E18 atoms/cm$^3$ to 1E21 atoms/cm$^3$.

With the aforementioned configuration, a sufficient electrical conductivity can be ensured, thereby enabling spreading currents introduced from the p-electrode through the entire epitaxial films.

A p-electrode layer consisting of an Ag layer may be provided in contact with the aforementioned p-type InGaN contact layer.

With the aforementioned configuration, the reflectivity at the bottom of the light emitting device, namely the mounting portion can be increased to reduce the light loss, thereby increasing the light output.

The aforementioned GaN substrate may include plate-type crystal inversion regions extending continuously in the thickwise direction and over the GaN substrate surface. The plate-type crystal inversion regions in the GaN substrate and plate-type crystal inversion regions propagated through the n-type and p-type nitride semiconductor layers formed on the GaN substrate are removed from the p-type nitride semiconductor layers to the GaN substrate through the n-type nitride semiconductor layers. Further, in contact with the portions of the p-type nitride semiconductor layers which are left after removing them, p-electrodes may be provided for the respective portions of the p-type nitride semiconductor layers.

With this configuration, the light extracting surface can be widened to increase the light output.

First electrodes may be placed over the surface of the p-type nitride semiconductor layers in contact with the p-type nitride semiconductor layers and a second electrode formed from Ag may be provided such that the second electrode fills the gaps of the first electrodes and covers the p-type nitride semiconductor layers and the first electrodes.

This configuration enables sufficiently spreading currents introduced from the p-electrodes over the surface while increasing the reflectivity, thereby increasing the light output.

The coverage ratio of the aforementioned discretely-placed first p-electrodes relative to the surface of the p-type nitride semiconductor layers may be in the range from 10 to 40%.

This configuration enables sufficiently spreading introduced currents over the surface while ensuring the electrical conductivity. Coverage ratios lower than 10% can not enables flowing currents through the epitaxial layers without causing discontinuity. Also, with coverage ratios higher than 40%, the adverse effects of the discretely-placed p-electrodes on the light extracting efficiency can not be neglected.

A fluorescent plate may be placed apart from the aforementioned nitride semiconductor substrate such that it faces with the second main surface of the nitride semiconductor substrate.

By placing a fluorescent plate directly above the nitride semiconductor substrate forming the light emitting portion of a p-down-mounted device, light reflected at the back surface of the fluorescent plate can be then reflected at the surface of the nitride semiconductor toward the fluorescent plate. As a result, the light output can be increased.

The surface of the fluorescent plate to be faced with the second main surface of the nitride semiconductor substrate may be subjected to an asperities-forming process.

The aforementioned configuration can further increase the light extracting efficiency.

The aforementioned light emitting device may be sealed with resin and may include a fluorescent member at any portion of the light emitting device and any portion of the resin. The fluorescent member generates fluorescence on receiving light and thus white light will be emitted from the resin to the outside.

This configuration enables easily providing a white light emitting device having the aforementioned advantages of the present invention.

A single electrode at the top side may be placed at the center of the light emitting device, in a plane view of the respective layers.

The aforementioned configuration enables providing a sufficient space for wire bonding. Further, in the case of constructing a side-view type LED, the configuration can reduce the thickness of the side-view type LED.

Further, the aforementioned light emitting device may be constructed such that a side-view type LED equipped with the light emitting device will have a thickness equal to or smaller than 0.5 mm or equal to or smaller than 0.4 mm.

This enables miniaturizing the display devices of portable information terminals including, for example, portable phones.

The aforementioned light emitting device may have an electrostatic withstand voltage of 3000 V or more.

This configuration provides durability with respect to surge voltage from the outside, thereby maintaining stabled and high performance. Further, this configuration eliminates the necessity of providing a protection device for protecting the light emitting devise from the surge voltage from the outside. Namely, there is no need to provide a protection circuit for protecting the light emitting device from transient voltages or electrostatic discharge, which would be otherwise applied between the aforementioned nitride semiconductor substrate and the p-type nitride semiconductor layers. More specifically, there is no need to provide an electric power shunting circuit including Zener diodes for dealing with such transient voltages or electrostatic discharge.

Further, the aforementioned light emitting device may be constructed to cause light emission when a voltage of 4 V is applied thereto.

Use of a nitride semiconductor substrate having a high electrical conductivity and thus having a low electrical resistance enables injecting a sufficient current to cause light emission with a low applied voltage to cause light emission. This reduces the number of batteries to be mounted, thereby contributing reduction in the size, weight and cost of an illumination apparatus equipped with the light emitting device. Further, this is effective in saving the power consumption.

The aforementioned nitride semiconductor substrate may have a thickness in the range from 50 μm to 500 μm.

With this configuration, when flowing electrons from a dot-shaped n-electrode or small area n-electrode, the electrons increasingly spread with increasing distance from the surface of the GaN substrate or n-type nitride semiconductor substrate into the inside. Therefore, it is preferable that the GaN substrate or n-type nitride semiconductor substrate has a large thickness. If the aforementioned substrate has a thickness smaller than 50 μm, when the n-electrode has a small area, electrons can not sufficiently spread when they reach the active layer, which induces portions in the active layer which generate insufficient light emission or no light emission. By setting the thickness of the aforementioned substrate to 50 μm or more, currents sufficiently spread within the aforementioned substrate because of the low electric resistivity, thereby sufficiently increasing the light emitting portion in the active layer, even when the n-electrode has a small area. More preferably, the thickness is 75 μm or more. However, when the thickness is excessively large, the absorption at the substrate can not be neglected. Therefore, the thickness must be equal to or smaller than 500 μm. The thickness is preferably equal to or smaller than 400 μm and more preferably equal to or smaller than 300 μm.

The aforementioned electrode at the top side has an area ratio below 50% and therefore the opening ratio or the transparent portion is higher than 50%.

This configuration can increase the emitting efficiency of light from the light emitting surface. The greater the opening ratio, the smaller the amount of light absorbed by the n-electrode and thus the higher the light output. Therefore, the opening ratio is preferably 75% and more preferably 90%.

At least one of the sides of the aforementioned top-side surface may have a length of 350 μm. This configuration can reduce the height of the side-view type LED to below 0.5 mm.

Also, at least one of the sides of the aforementioned top-side surface may have a length of 250 μm. This configuration can reduce the height of the side-view type LED to below 0.4 mm.

Sides of the aforementioned top-side surface which are opposed to each other may both have a length of 400 μm or greater.

The aforementioned configuration can lengthen the light emitting surface while maintaining the distance between opposite sides of the rectangular shape at a fixed length, resulting in increased area and increased light output.

Sides of the aforementioned top-side surface which are opposed to each other may both have a length of 1.6 mm or smaller.

When the minimum thickness of the nitride semiconductor substrate is 50 μm and the light emitting device is p-down mounted, in order to inject currents from a single electrode at the center of the light emitting surface and distribute the currents through the entire surface of the light emitting layer in the longer side direction as well as in the shorter side direction, the length in the longer side direction can be set to 1.6 mm or smaller.

The aforementioned heat resistance may be equal to or lower than 30° C./W.

The light emitting efficiency of the light emitting device is degraded by temperature rises. Further, excessive temperature rises will damage the light emitting device. Therefore, the temperature resistance or heat resistance is an important design factor; Conventionally, the heat resistance has been set to 60° C./W (the aforementioned patent literature 1). However, as previously described, by setting the heat resistance to 30° C./W or less, it is possible to prevent reduction in the light emitting efficiency or damage of the light emitting device, even when sufficient electric power is introduced into the light emitting device. The half-reduction of the heat resistance was realized by using a GaN substrate having a low resistivity as previously described.

Further, the portion at which temperature rises most largely may have a temperature equal to or lower than 150° C. under continuous light emitting conditions.

With this configuration, the temperature at the portion at which temperature rises most largely, namely the light emitting layer, can be set to below 150° C., thereby ensuring a sufficiently high light emitting efficiency. Further, the life can be largely lengthened as compared with conventional light emitting devices.

The thickness of the aforementioned n-type nitride semiconductor layers may be set to 3 μm or less.

The n-type nitride semiconductor layers are epitaxially grown on the nitride semiconductor substrate. Therefore, if the thickness of the n-type nitride semiconductor layers is excessively large, the film forming process will require long time and also the material cost will be increased. By setting the thickness of the n-type nitride semiconductor layers to 3 μm or less, the cost can be significantly decreased. More preferably, the thickness is set to 2 μm or less.

The aforementioned p-type nitride semiconductor layers are down-mounted, and the portion of the second main surface (back surface) of the aforementioned nitride semiconductor surface which has not been covered with the electrode may have been subjected to a non-mirror-surface treatment.

This configuration can prevent light generated at the light emitting layer from being totally reflected at the second main surface, or the emitting surface, to be confined within the aforementioned substrate, thus reducing the efficiency. It goes without saying that the side surfaces of the laminated-layer construction may be subjected to the non-mirror-surface treatment.

The aforementioned surfaces which have been subjected to the non-mirror-surface treatment may be surfaces which were made to be non-mirror surfaces using potassium hydroxide (KOH) solution, sodium hydroxide (NaOH) solution, ammonia (NH$_3$) solution or other alkali solution.

With the aforementioned non-mirror-surface treatment, only the N-surface of the GaN substrate may be efficiently made to be a surface with asperities. The Ga-surface side is not etched.

The aforementioned surfaces which have been subjected to the non-mirror-surface treatment may be surfaces which were made to be non-mirror surfaces using at least one of sulfuric acid (H$_2$SO$_4$) solution, hydrochloric acid (HCl) solution, phosphoric acid (H$_3$PO$_4$) solution, hydrofluoric acid (HF) solution and other acid solution.

The aforementioned surfaces which have been subjected to the non-mirror-surface treatment may be surfaces which were made to be non-mirror surfaces using reactive ion etching: RIE). Therefore, non-mirror surfaces with an excellent area dimension accuracy can be provided with a dry process. Also, by combining photolithography technique with RIE which is a dry etching or wet etching using alkali solution, predetermined asperities intervals can be provided.

The electrode placed on the mounting-surface side may be formed from a material with a reflectivity equal to or higher than 0.5.

This configuration can prevent absorption of light at the mounting-surface side and increase the amount of light reflected toward the second main surface of the aforementioned substrate. It is desirable that this reflectivity is higher and is equal to or higher than 0.7.

A fluorescent member may be placed such that it covers the second main surface of the aforementioned nitride semiconductor substrate. Also, the nitride semiconductor substrate may include at least one of impurities and defects which generate fluorescence.

The aforementioned configuration enables forming a white light emitting LED.

The light emitting device of the present invention may include more than one aforementioned configuration of a light emitting device and these configurations of a light emitting device may be connected in serial.

The aforementioned configuration enables providing an illumination apparatus equipped with a plurality of the aforementioned high efficiency light emitting devices mounted on a lead frame, by utilizing a high current power supply.

Also, the light emitting device of the present invention may include more than one aforementioned configuration of a light emitting device and these configurations of a light emitting device may be connected in parallel.

The aforementioned configuration enables providing an illumination apparatus constituted by the aforementioned high efficiency light emitting devices, by utilizing a high current power supply.

An illumination apparatus may include light emitting devices of the present invention and a power supply circuit for causing the light emitting devices to generate light and in the power supply circuit, two or more parallel portions each including two or more light emitting devices connected in parallel are connected in parallel.

This configuration enables matching the capacity of the illumination apparatus to the capacity of the power supply while satisfying the light emitting condition of the respective light emitting devices. Further, the aforementioned power supply circuit may include a parallel/serial switching portion when the capacity of the illumination apparatus is made variable, and the wiring to be applied to the light emitting devices may be switched through the parallel/serial switching portion.

While the embodiments of the present invention have been described in the above description, the embodiments which have been disclosed above are merely illustrative and the scope of the present invention is not limited to these embodiments of the invention. The scope of the invention is defined by the description in the claims and includes equivalents to the description of the claims and all variations within the scope.

The light emitting device of the present invention employs a nitride semiconductor substrate having a high conductivity and therefore, regardless of p-down mounted or n-down mounted, (1) only a single electrode can be provided on the light emitting surface. Further, (2) by employing the aforementioned nitride semiconductor substrate with a high conductivity and also by p-down mounting, a miniaturized light emitting device can be provided. Further, in the case of p-down mounting, (3) the heat radiation can be improved, there is no need to provide a complicated electrode configuration and further higher output light emission can be generated. (4) The conductivity is improved and there is no need to provide protection circuit for protecting the light emitting device from transient voltages or electrostatic discharge. Further, light emission from a large area can be generated and the electrostatic withstand voltage is improved. (5) Since there is no significant discontinuity in the refractive index from the light emitting layer to the substrate, light is less prone to be totally reflected, thereby preventing efficiency reduction and resin degradation at the side surface, which would be otherwise caused by total reflection. (6) Since the construction is simplified, the light emitting device is easy to manufacture and has an excellent maintainability. Therefore, it is expected that the light emitting device will be widely utilized in the illumination apparatuses of portable information terminals including portable phones.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light emitting device comprising: a nitride semiconductor substrate with a resistivity of 0.5 Ω·cm or less; an n-type nitride semiconductor layer at a first main surface side of said nitride semiconductor substrate and a p-type nitride semiconductor layer placed more distantly from said nitride semiconductor substrate than said n-type nitride semiconductor layer at said first main surface side; and a light emitting layer placed between said n-type nitride semiconductor layer and said p-type nitride semiconductor layer at said first main surface side, wherein
one of said nitride semiconductor substrate and said p-type nitride semiconductor layer is mounted at the top side which emits light and the other is placed at the down side, and a single electrode is placed at the top side, and
said substrate is n-typed with oxygen-doping, and said substrate has an oxygen concentration in the range from 1E17 to 2E19 oxygen atoms/$cm^3$ and a thickness of 100 μm to 200 μm.

2. The light emitting device according to claim 1, comprising first p-electrodes placed discretely over the surface of the p-type nitride semiconductor layer in contact with said p-type nitride semiconductor layer, a second p-electrode formed from Ag, Al or Rh which fills the gaps of the first p-electrodes and covers said p-type nitride semiconductor layer and said first p-electrodes.

3. The light emitting device according to claim 2, wherein the coverage ratio of said first p-electrodes relative to the surface of said p-type nitride semiconductor layer is in the range from 10 to 40%.

4. The light emitting device according to claim 1, wherein said light emitting device is sealed with resin and includes a fluorescent member at any portion of said light emitting device and any portion of said resin, and said fluorescent member generates fluorescence on receiving said light and white light is emitted from said resin to the outside.

5. The light emitting device according to claim 1, wherein said single electrode at the top side is placed at the center of said light emitting device, in a plane view of said respective layers.

6. The light emitting device according to claim 1, wherein said light emitting device is constructed such that a side-view type LED equipped with the light emitting device has a thickness of 0.5 mm or less.

7. The light emitting device according to claim 1, wherein said light emitting device is constructed such that a side-view type LED equipped with the light emitting device has a thickness of 0.4 mm or less.

8. The light emitting device according to claim 1 having an electrostatic withstand voltage of 3000 V or more.

9. The light emitting device according to claim 1, wherein there is not provided a protection circuit for protecting said light emitting device from transient voltages or electrostatic discharge, which would be otherwise applied between said nitride semiconductor substrate and said p-type nitride semiconductor layer.

10. The light emitting device according to claim 1, wherein there is not provided an electric power shunting circuit including Zener diodes for dealing with said transient voltages or electrostatic discharge.

11. The light emitting device according to claim 1 which causes light emission when a voltage of 4 V or less is applied thereto.

12. The light emitting device according to claim 1, wherein said electrode at the top side has an area ratio below 50% and the opening ratio or the transparent portion is higher than 50%.

13. The light emitting device according to claim 1, wherein at least one of the sides of said top-side surface has a length of 350 μm or less.

14. The light emitting device according to claim 1, wherein sides of said top-side surface which are opposed to each other both have a length of 400 μm or greater.

15. The light emitting device according to claim 1, wherein sides of said top-side surface which are opposed to each other both have a length of 1.6 mm or greater.

16. The light emitting device according to claim 1, wherein at least one of the sides of said top-side surface has a length of 250 μm or less.

17. The light emitting device according to claim 1 constructed to have a heat resistance of 30° C./W or less.

18. The light emitting device according to claim 1, wherein the portion at which temperature rises most largely will have a temperature of 150° C. or less under continuous light emitting conditions.

19. The light emitting device according to claim 1, wherein said n-type nitride semiconductor layer has a thickness of 3 μm or less.

20. The light emitting device according to claim 1, wherein said p-type nitride semiconductor layer is down-mounted, and the portion of the second main surface, which serves as the light emitting surface, of said nitride semiconductor substrate which has not been covered with said electrode has been subjected to a non-mirror-surface treatment.

21. The light emitting device according to claim 1, wherein said surfaces which have been subjected to the non-mirror-surface treatment are surfaces which were made to be non-mirror surfaces using potassium hydroxide (KOH) solution, sodium hydroxide (NaOH) solution, ammonia (NH$_3$) solution or other alkali solution.

22. The light emitting device according to claim 1, wherein said surfaces which have been subjected to the non-mirror-surface treatment are surfaces which were made to be non-mirror surfaces using at least one of sulfuric acid (H$_2$SO$_4$) solution, hydrochloric acid (HCl) solution, phosphoric acid (H$_2$PO$_4$) solution, hydrofluoric acid (HF) solution and other acid solution.

23. The light emitting device according to claim 1, wherein said surfaces which have been subjected to the non-mirror-surface treatment are surfaces which were made to be non-mirror surfaces using Reactive Ion Etching (RIE).

24. The light emitting device according to claim 1, wherein said electrode placed on the mounting side is formed from a material with a reflectivity of 0.5 or more.

25. The light emitting device according to claim 1, wherein a fluorescent plate is placed such that it covers the second main surface of said nitride semiconductor substrate.

26. The light emitting device according to claim 1, wherein a fluorescent plate is placed apart from said nitride semiconductor substrate such that it faces with the second main surface of said nitride semiconductor substrate.

27. The light emitting device according to claim 1, wherein the surface of said fluorescent plate to be faced with the second main surface of said nitride semiconductor substrate has been subjected to an asperities-forming process.

28. The light emitting device according to claim 1, wherein said nitride semiconductor substrate include at least one of impurities and defects which generate fluorescence.

29. A light emitting device comprising more than one said light emitting device according to claim 1, wherein these light emitting devices are connected in serial or parallel.

30. A light emitting device comprising said light emitting devices according to claim 1 and a power supply circuit for causing the light emitting devices to generate light, wherein in said power supply circuit, two or more parallel portions each including two or more said light emitting devices connected in parallel are connected in parallel.

31. A light emitting device comprising a nitride semiconductor substrate GaN substrate with a dislocation density of 10$^8$/cm$^2$ or less, an n-type Al$_x$Ga$_{1-x}$N layer (x is within the range of 0 to 1) which is an n-type nitride semiconductor layer at a first main surface side of said GaN substrate and a p-type Al$_x$Ga$_{1-x}$N layer (x is within the range of 0 to 1) placed more distantly from said GaN substrate than said n-type Al$_x$Ga$_{1-x}$N layer at said first main surface side, and a light emitting layer placed between said n-type Al$_x$Ga$_{1-x}$N layer and said p-type Al$_x$Ga$_{1-x}$N layer at said first main surface side, wherein an n-electrode is provided in contact with a second main surface of said GaN substrate which is the main surface at the opposite side from said first main surface, and a p-electrode is provided in contact with said p-type Al$_x$Ga$_{1-x}$N layer, one of said n-electrode and said p-electrode is mounted at the top side which emits light and the other is mounted at the down side, and the electrode placed at the top side is constituted from a single electrode, and said substrate is n-typed with oxygen-doping, and said substrate has an oxygen concentration in the range from 1E17 to 2E19 oxygen atoms/cm$^3$ and a thickness of 100 µm to 200 µm.

32. The light emitting device according to claim 31, wherein said GaN substrate is mounted at the top side.

33. The light emitting device according to claim 31, wherein said GaN substrate is mounted at the top side, and said GaN substrate has an oxygen concentration in the range from 2E18 to 5E18 oxygen atoms/cm$^3$, the both side lengths of the rectangular-shaped surface of the light emitting surface at said second main surface are 0.5 mm or less.

34. The light emitting device according to claim 31, wherein said GaN substrate is mounted at the top side, and said GaN substrate has an oxygen concentration in the range from 3E18 to 5E18 oxygen atoms/cm$^3$, and the both side lengths of the rectangular-shaped surface of the light emitting surface at said second main surface are 2 mm or less.

35. The light emitting device according to claim 31, wherein dislocation bundles are distributed over the first main surface of said GaN substrate with a density of 4E6/cm$^3$ or less on average, wherein the dislocation bundles have been created by discretely concentrating dislocations which unavoidably generate during the formation of the GaN substrate into a string shape to distribute them along the substrate-thickwise direction in order to improve the crystallinity of the most region of said GaN substrate.

36. The light emitting device according to claim 31, wherein said dislocation bundles are distributed over said first main surface with a density of 4E2/cm$^3$ or less on average, and the shorter side length of the light emitting surface at said second main surface is within the range from 200 µm to 400 µm.

37. The light emitting device according to claim 31, wherein between said GaN substrate and said n-type Al$_x$Ga$_{1-x}$N layer (x is in the range from 0 to 1), an n-type AlGaN buffer layer is placed in contact with said GaN substrate, an n-type GaN buffer layer is placed in contact with said n-type AlGaN buffer layer and said n-type Al$_x$Ga$_{1-x}$N layer (x is in the range from 0 to 1) is placed in contact with said n-type GaN buffer layer.

38. The light emitting device according to claim 37, wherein said GaN substrate includes a region with an off angle of 0.10° or less and a region with an off angle of 1.0° or more.

39. The light emitting device according to claim 31, wherein a p-type GaN buffer layer is placed in contact with said p-type Al$_x$Ga$_{1-x}$N layer (x is in the range from 0 to 1) at the down side thereof and a p-type InGaN contact layer is placed in contact with the p-type GaN buffer layer.

40. The light emitting device according to claim 39, wherein said p-type InGaN contact layer has a Mg concentration in the range of 1E18 atoms/cm$^3$ to 1E21 atoms/cm$^3$.

41. The light emitting device according to claim 39, wherein a p-electrode layer formed from Ag, Al or Rh is provided in contact with said p-type InGaN contact layer.

42. The light emitting device according to claim 31, wherein said GaN substrate includes plate-type crystal inversion regions extending continuously in the thickwise direction and in a single direction within the GaN substrate surface, said plate-type crystal inversion regions in the GaN substrate and plate-type crystal inversion regions propagated to said n-type and p-type nitride semiconductor layers formed on said GaN substrate are removed from said p-type nitride semiconductor layer side to the inside of said GaN substrate through said n-type nitride semiconductor layer, and, in contact with the portions of the p-type nitride semiconductor layer which are left after removing them, p-electrodes are provided for the respective portions of the p-type nitride semiconductor layer.

43. The light emitting device according to claim 42, wherein said plate-type crystal inversion regions are removed using KOH solution.

44. The light emitting device according to claim 31 comprising first p-electrodes placed discretely over the surface of the p-type nitride semiconductor layer in contact with said p-type nitride semiconductor layer, a second p-electrode formed from Ag, Al or Rh which fills the gaps of the first p-electrodes and covers said p-type nitride semiconductor layer and said first p-electrodes.

45. The light emitting device according to claim 44, wherein the coverage ratio of said first p-electrodes relative to the surface of said p-type nitride semiconductor layer is in the range from 10 to 40%.

46. The light emitting device according to claim 31, wherein said light emitting device is sealed with resin and includes a fluorescent member at any portion of said light emitting device and any portion of said resin, and said fluorescent member generates fluorescence on receiving said light and white light is emitted from said resin to the outside.

47. The light emitting device according to claim 31, wherein said single electrode at the top side is placed at the center of said light emitting device, in a plane view of said respective layers.

48. The light emitting device according to claim 31, wherein said light emitting device is constructed such that a side-view type LED equipped with the light emitting device has a thickness of 0.5 mm or less.

49. The light emitting device according to claim 31, wherein said light emitting device is constructed such that a side-view type LED equipped with the light emitting device has a thickness of 0.4 mm or less.

50. The light emitting device according to claim 31 having an electrostatic withstand voltage of 3000 V or more.

51. The light emitting device according to claim 31, wherein there is not provided a protection circuit for protecting said light emitting device from transient voltages or electrostatic discharge, which would be otherwise applied between said nitride semiconductor substrate and said p-type nitride semiconductor layer.

52. The light emitting device according to claim 31, wherein there is not provided an electric power shunting circuit including Zener diodes for dealing with said transient voltages or electrostatic discharge.

53. The light emitting device according to claim 31 which causes light emission when a voltage of 4 V or less is applied thereto.

54. The light emitting device according to claim 31, wherein said electrode at the top side has an area ratio below 50% and the opening ratio or the transparent portion is higher than 50%.

55. The light emitting device according to claim 31, wherein at least one of the sides of said top-side surface has a length of 350 µm or less.

56. The light emitting device according to claim 55, wherein sides of said top-side surface which are opposed to each other both have a length of 400 µm or greater.

57. The light emitting device according to claim 55, wherein sides of said top-side surface which are opposed to each other both have a length of 1.6 mm or greater.

58. The light emitting device according to claim 31, wherein at least one of the sides of said top-side surface has a length of 250 µm or less.

59. The light emitting device according to claim 31 constructed to have a heat resistance of 30° C./W or less.

60. The light emitting device according to claim 31, wherein the portion at which temperature rises most largely will have a temperature of 150° C. or less under continuous light emitting conditions.

61. The light emitting device according to claim 31, wherein said n-type nitride semiconductor layer has a thickness of 3 µm or less.

62. The light emitting device according to claim 31, wherein said p-type nitride semiconductor layer is down-mounted, and the portion of the second main surface, which serves as the light emitting surface, of said nitride semiconductor substrate which has not been covered with said electrode has been subjected to a non-mirror-surface treatment.

63. The light emitting device according to claim 62, wherein said surfaces which have been subjected to the non-mirror-surface treatment are surfaces which were made to be non-mirror surfaces using potassium hydroxide (KOH) solution, sodium hydroxide (NaOH) solution, ammonia ($NH_3$) solution or other alkali solution.

64. The light emitting device according to claim 62, wherein said surfaces which have been subjected to the non-mirror-surface treatment are surfaces which were made to be non-mirror surfaces using at least one of sulfuric acid ($H_2SO_4$) solution, hydrochloric acid (HCl) solution, phosphoric acid ($H_3PO_4$) solution, hydrofluoric acid (HF) solution and other acid solution.

65. The light emitting device according to claim 62, wherein said surfaces which have been subjected to the non-mirror-surface treatment are surfaces which were made to be non-mirror surfaces using reactive ion etching (RIE).

66. The light emitting device according to claim 31, wherein said surfaces which have been subjected to the non-mirror-surface treatment are surfaces which were made to be non-mirror surfaces using reactive ion etching (RIE).

67. The light emitting device according to claim 31, wherein said electrode placed on the mounting side is formed from a material with a reflectivity of 0.5 or more.

68. The light emitting device according to claim 31, wherein a fluorescent plate is placed such that it covers the second main surface of said nitride semiconductor substrate.

69. The light emitting device according to claim 31, wherein a fluorescent plate is placed apart from said nitride semiconductor substrate such that it faces with the second main surface of said nitride semiconductor substrate.

70. The light emitting device according to claim 31, wherein said nitride semiconductor substrate include at least one of impurities and defects which generate fluorescence.

71. A light emitting device comprising more than one said light emitting device according to claim 31, wherein these light emitting devices are connected in serial or parallel.

72. A light emitting device comprising said light emitting devices according to claim 31 and a power supply circuit for causing the light emitting devices to generate light, wherein in said power supply circuit, two or more parallel portions each including two or more said light emitting devices connected in parallel are connected in parallel.

73. A light emitting device comprising a nitride semiconductor AlN substrate with a heat conductivity of 100 W/(m·K) or more, an n-type $Al_xGa_{1-x}N$ layer (x is within the range of 0 to 1) which is an n-type nitride semiconductor layer at a first main surface side of said AlN substrate and a p-type $Al_xGa_{1-x}N$ layer (x is within the range of 0 to 1) placed more distantly from said AlN substrate than said n-type $Al_xGa_{1-x}N$ layer at said first main surface side, and a light emitting layer placed between said n-type $Al_xGa_{1-x}N$ layer and said p-type $Al_xGa_{1-x}N$ layer at said first main surface side, wherein an n-electrode is provided in contact with a second main surface of said AlN substrate which is the main surface at the opposite side from said first main surface, and a p-electrode is provided in contact with said p-type $Al_xGa_{1-x}N$ layer, one of said n-electrode and said p-electrode is mounted at the top side which emits light and the other is mounted at the down side, and the electrode placed at the top side is constituted from a single electrode, and said substrate is n-typed with oxygen-doping, and said substrate has an oxygen concentration in the range from 1E17 to 2E19 oxygen atoms/cm³ and a thickness of 100 μm to 200 μm.

74. The light emitting device according to claim 73, comprising first p-electrodes placed discretely over the surface of the p-type nitride semiconductor layer in contact with said p-type nitride semiconductor layer, a second p-electrode formed from Ag, Al or Rh which fills the gaps of the first p-electrodes and covers said p-type nitride semiconductor layer and said first p-electrodes.

75. The light emitting device according to claim 74, wherein the coverage ratio of said first p-electrodes relative to the surface of said p-type nitride semiconductor layer is in the range from 10 to 40%.

76. The light emitting device according to claim 73, wherein said light emitting device is sealed with resin and includes a fluorescent member at any portion of said light emitting device and any portion of said resin, and said fluorescent member generates fluorescence on receiving said light and white light is emitted from said resin to the outside.

77. The light emitting device according to claim 73, wherein said single electrode at the top side is placed at the center of said light emitting device, in a plane view of said respective layers.

78. The light emitting device according to claim 73, wherein said light emitting device is constructed such that a side-view type LED equipped with the light emitting device has a thickness of 0.5 mm or less.

79. The light emitting device according to claim 73, wherein said light emitting device is constructed such that a side-view type LED equipped with the light emitting device has a thickness of 0.4 mm or less.

80. The light emitting device according to claim 73 having an electrostatic withstand voltage of 3000 V or more.

81. The light emitting device according to claim 73, wherein there is not provided a protection circuit for protecting said light emitting device from transient voltages or electrostatic discharge, which would be otherwise applied between said nitride semiconductor substrate and said p-type nitride semiconductor layer.

82. The light emitting device according to claim 81, wherein there is not provided an electric power shunting circuit including Zener diodes for dealing with said transient voltages or electrostatic discharge.

83. The light emitting device according to claim 73 which causes light emission when a voltage of 4 V or less is applied thereto.

84. The light emitting device according to claim 73, wherein said electrode at the top side has an area ratio below 50% and the opening ratio or the transparent portion is higher than 50%.

85. The light emitting device according to claim 73, wherein at least one of the sides of said top-side surface has a length of 350 μm or less.

86. The light emitting device according to claim 85, wherein sides of said top-side surface which are opposed to each other both have a length of 400 μm or greater.

87. The light emitting device according to claim 85, wherein sides of said top-side surface which are opposed to each other both have a length of 1.6 mm or greater.

88. The light emitting device according to claim 73, wherein at least one of the sides of said top-side surface has a length of 250 μm or less.

89. The light emitting device according to claim 73 constructed to have a heat resistance of 30° C./W or less.

90. The light emitting device according to claim 73, wherein the portion at which temperature rises most largely will have a temperature of 150° C. or less under continuous light emitting conditions.

91. The light emitting device according to claim 73, wherein said n-type nitride semiconductor layer has a thickness of 3 μm or less.

92. The light emitting device according to claim 73, wherein said p-type nitride semiconductor layer is down-mounted, and the portion of the second main surface, which serves as the light emitting surface, of said nitride semiconductor substrate which has not been covered with said electrode has been subjected to a non-mirror-surface treatment.

93. The light emitting device according to claim 92, wherein said surfaces which have been subjected to the non-mirror-surface treatment are surfaces which were made to be non-mirror surfaces using potassium hydroxide (KOH) solution, sodium hydroxide (NaOH) solution, ammonia ($NH_3$) solution or other alkali solution.

94. The light emitting device according to claim 92, wherein said surfaces which have been subjected to the non-mirror-surface treatment are surfaces which were made to be non-mirror surfaces using at least one of sulfuric acid ($H_2SO_4$) solution, hydrochloric acid (HCl) solution, phosphoric acid ($H_3PO_4$) solution, hydrofluoric acid (HF) solution and other acid solution.

95. The light emitting device according to claim 93, wherein said surfaces which have been subjected to the non-mirror-surface treatment are surfaces which were made to be non-mirror surfaces using reactive ion etching (RIE).

96. The light emitting device according to claim 73, wherein said electrode placed on the mounting side is formed from a material with a reflectivity of 0.5 or more.

97. The light emitting device according to claim 73, wherein a fluorescent plate is placed such that it covers the second main surface of said nitride semiconductor substrate.

98. The light emitting device according to claim 73, wherein a fluorescent plate is placed apart from said nitride semiconductor substrate such that it faces with the second main surface of said nitride semiconductor substrate.

99. The light emitting device according to claim 73, wherein the surface of said fluorescent plate to be faced with the second main surface of said nitride semiconductor substrate has been subjected to an asperities-forming process.

100. The light emitting device according to claim 73, wherein said nitride semiconductor substrate include at least one of impurities and defects which generate fluorescence.

101. A light emitting device comprising more than one said light emitting device according to claim 73, wherein these light emitting devices are connected in serial or parallel.

102. A light emitting device comprising said light emitting devices according to claim 73 and a power supply circuit for causing the light emitting devices to generate light, wherein in said power supply circuit, two or more parallel portions each including two or more said light emitting devices connected in parallel are connected in parallel.

103. A light emitting device comprising a nitride semiconductor substrate with a resistivity of 0.5 Ω·cm or less, an n-type nitride semiconductor layer at a first main surface side of said nitride semiconductor substrate and a p-type nitride semiconductor layer placed more distantly from said nitride semiconductor substrate than said n-type nitride semiconductor layer at said first main surface side, and a light emitting layer placed between said n-type nitride semiconductor layer and said p-type nitride semiconductor layer at said first main surface side, wherein
said nitride semiconductor substrate is mounted at the down side and said p-type nitride semiconductor layer is mounted at the top side which emits light, and
said substrate is n-typed with oxygen-doping, and said substrate has an oxygen concentration in the range from 1E17 to 2E19 oxygen atoms/cm$^3$ and a thickness of 100 μm to 200 μm.

104. The light emitting device according to claim 103, wherein said light emitting device is sealed with resin and includes a fluorescent member at any portion of said light emitting device and any portion of said resin, and said fluorescent member generates fluorescence on receiving said light and white light is emitted from said resin to the outside.

105. The light emitting device according to claim 103, wherein said single electrode at the top side is placed at the center of said light emitting device, in a plane view of said respective layers.

106. The light emitting device according to claim 103, wherein said light emitting device is constructed such that a side-view type LED equipped with the light emitting device has a thickness of 0.5 mm or less.

107. The light emitting device according to claim 103, wherein said light emitting device is constructed such that a side-view type LED equipped with the light emitting device has a thickness of 0.4 mm or less.

108. The light emitting device according to claim 103 having an electrostatic withstand voltage of 3000 V or more.

109. The light emitting device according to claim 103, wherein there is not provided a protection circuit for protecting said light emitting device from transient voltages or electrostatic discharge, which would be otherwise applied between said nitride semiconductor substrate and said p-type nitride semiconductor layer.

110. The light emitting device according to claim 109, wherein there is not provided an electric power shunting circuit including Zener diodes for dealing with said transient voltages or electrostatic discharge.

111. The light emitting device according to claim 103 which causes light emission when a voltage of 4 V or less is applied thereto.

112. The light emitting device according to claim 103, wherein said electrode at the top side has an area ratio below 50% and the opening ratio or the transparent portion is higher than 50%.

113. The light emitting device according to claim 103, wherein at least one of the sides of said top-side surface has a length of 350 μm or less.

114. The light emitting device according to claim 113, wherein sides of said top-side surface which are opposed to each other both have a length of 400 μm or greater.

115. The light emitting device according to claim 113, wherein sides of said top-side surface which are opposed to each other both have a length of 1.6 mm or greater.

116. The light emitting device according to claim 103, wherein at least one of the sides of said top-side surface has a length of 250 μm or less.

117. The light emitting device according to claim 103 constructed to have a heat resistance of 30° C./W or less.

118. The light emitting device according to claim 103, wherein the portion at which temperature rises most largely will have a temperature of 150° C. or less under continuous light emitting conditions.

119. The light emitting device according to claim 103, wherein said n-type nitride semiconductor layer has a thickness of 3 μm or less.

120. The light emitting device according to claim 103, wherein said p-type nitride semiconductor layer is down-mounted, and the portion of the second main surface, which serves as the light emitting surface, of said nitride semiconductor substrate which has not been covered with said electrode has been subjected to a non-mirror-surface treatment.

121. The light emitting device according to claim 120, wherein said surfaces which have been subjected to the non-mirror-surface treatment are surfaces which were made to be non-mirror surfaces using potassium hydroxide (KOH) solution, sodium hydroxide (NaOH) solution, ammonia ($NH_3$) solution or other alkali solution.

122. The light emitting device according to claim 120, wherein said surfaces which have been subjected to the non-mirror-surface treatment are surfaces which were made to be non-mirror surfaces using at least one of sulfuric acid ($H_2SO_4$) solution, hydrochloric acid (HCl) solution, phosphoric acid ($H_3PO_4$) solution, hydrofluoric acid (HF) solution and other acid solution.

123. The light emitting device according to claim 120, wherein said surfaces which have been subjected to the non-mirror-surface treatment are surfaces which were made to be non-mirror surfaces using reactive ion etching (RIE).

124. The light emitting device according to claim 103, wherein said electrode placed on the mounting side is formed from a material with a reflectivity of 0.5 or more.

125. The light emitting device according to claim 103, wherein a fluorescent plate is placed such that it covers the second main surface of said nitride semiconductor substrate.

126. The light emitting device according to claim 103, wherein a fluorescent plate is placed apart from said nitride semiconductor substrate such that it faces with the second main surface of said nitride semiconductor substrate.

127. The light emitting device according to claim 103, wherein the surface of said fluorescent plate to be faced with the second main surface of said nitride semiconductor substrate has been subjected to an asperities-forming process.

128. The light emitting device according to claim 103, wherein said nitride semiconductor substrate include at least one of impurities and defects which generate fluorescence.

129. A light emitting device comprising more than one said light emitting device according to claim 103, wherein these light emitting devices are connected in serial or parallel.

130. A light emitting device comprising said light emitting devices according to claim 103 and a power supply circuit for causing the light emitting devices to generate light, wherein in said power supply circuit, two or more parallel portions each including two or more said light emitting devices connected in parallel are connected in parallel.

131. A light emitting device comprising a GaN substrate with a dislocation density of $10^8/cm^2$ or less, an n-type nitride semiconductor layer at a first main surface side of said GaN substrate and a p-type nitride semiconductor placed more distantly from said GaN substrate than said n-type nitride semiconductor at said first main surface side, and a light emitting layer placed between said n-type nitride semiconductor layer and said p-type nitride semiconductor layer at said first main surface side, wherein
said GaN substrate is mounted at the down side and said p-type nitride semiconductor layer is provided at the top side which emits light, and
said substrate is n-typed with oxygen-doping, and said substrate has an oxygen concentration in the range from 1E17 to 2E19 oxygen atoms/cm$^3$ and a thickness of 100 µm to 200 µm.

132. The light emitting device according to claim 131, wherein dislocation bundles are distributed over the first main surface of said GaN substrate with a density of 4E6/cm$^3$ or less on average, wherein the dislocation bundles have been created by discretely concentrating dislocations which unavoidably generate during the formation of the GaN substrate into a string shape to distribute them along the substrate-thickwise direction in order to improve the crystallinity of the most region of said GaN substrate.

133. The light emitting device according to claim 132, wherein said dislocation bundles are distributed over said first main surface with a density of 4E2/cm$^3$ or less on average, and the shorter side length of the light emitting surface at said second main surface is within the range from 200 µm to 400 µm.

134. The light emitting device according to claim 131, wherein between said GaN substrate and said n-type $Al_xGa_{1-x}N$ layer (x is in the range from 0 to 1), an n-type AlGaN buffer layer is placed in contact with said GaN substrate, an n-type GaN buffer layer is placed in contact with said n-type AlGaN buffer layer and said n-type $Al_xGa_{1-x}N$ layer (x is in the range from 0 to 1) is placed in contact with said n-type GaN buffer layer.

135. The light emitting device according to claim 134, wherein said GaN substrate includes a region with an off angle of 0.10° or less and a region with an off angle of 1.0° or more.

136. The light emitting device according to claim 131, wherein said light emitting device is sealed with resin and includes a fluorescent member at any portion of said light emitting device and any portion of said resin, and said fluorescent member generates fluorescence on receiving said light and white light is emitted from said resin to the outside.

137. The light emitting device according to claim 131, wherein said single electrode at the top side is placed at the center of said light emitting device, in a plane view of said respective layers.

138. The light emitting device according to claim 131, wherein said light emitting device is constructed such that a side-view type LED equipped with the light emitting device has a thickness of 0.5 mm or less.

139. The light emitting device according to claim 131, wherein said light emitting device is constructed such that a side-view type LED equipped with the light emitting device has a thickness of 0.4 mm or less.

140. The light emitting device according to claim 131 having an electrostatic withstand voltage of 3000 V or more.

141. The light emitting device according to claim 131, wherein there is not provided a protection circuit for protecting said light emitting device from transient voltages or electrostatic discharge, which would be otherwise applied between said nitride semiconductor substrate and said p-type nitride semiconductor layer.

142. The light emitting device according to claim 141, wherein there is not provided an electric power shunting circuit including Zener diodes for dealing with said transient voltages or electrostatic discharge.

143. The light emitting device according to claim 131 which causes light emission when a voltage of 4 V or less is applied thereto.

144. The light emitting device according to claim 131, wherein said electrode at the top side has an area ratio below 50% and the opening ratio or the transparent portion is higher than 50%.

145. The light emitting device according to claim 131, wherein at least one of the sides of said top-side surface has a length of 350 µm or less.

146. The light emitting device according to claim 145, wherein sides of said top-side surface which are opposed to each other both have a length of 400 µm or greater.

147. The light emitting device according to claim 145, wherein sides of said top-side surface which are opposed to each other both have a length of 1.6 mm or greater.

148. The light emitting device according to claim 131, wherein at least one of the sides of said top-side surface has a length of 250 µm or less.

149. The light emitting device according to claim 131 constructed to have a heat resistance of 30° C./W or less.

150. The light emitting device according to claim 131, wherein the portion at which temperature rises most largely will have a temperature of 150° C. or less under continuous light emitting conditions.

151. The light emitting device according to claim 131, wherein said n-type nitride semiconductor layer has a thickness of 3 µm or less.

152. The light emitting device according to claim 131, wherein said p-type nitride semiconductor layer is down-mounted, and the portion of the second main surface, which serves as the light emitting surface, of said nitride semiconductor substrate which has not been covered with said electrode has been subjected to a non-mirror-surface treatment.

153. The light emitting device according to claim 152, wherein said surfaces which have been subjected to the non-mirror-surface treatment are surfaces which were made to be non-mirror surfaces using potassium hydroxide (KOH) solution, sodium hydroxide (NaOH) solution, ammonia (NH$_3$) solution or other alkali solution.

154. The light emitting device according to claim 152, wherein said surfaces which have been subjected to the non-mirror-surface treatment are surfaces which were made to be non-mirror surfaces using at least one of sulfuric acid (H$_2$SO$_4$) solution, hydrochloric acid (HCl) solution, phosphoric acid (H$_3$PO$_4$) solution, hydrofluoric acid (HF) solution and other acid solution.

155. The light emitting device according to claim 152, wherein said surfaces which have been subjected to the non-mirror-surface treatment are surfaces which were made to be non-mirror surfaces using reactive ion etching (RIE).

156. The light emitting device according to claim 131, wherein said electrode placed on the mounting side is formed from a material with a reflectivity of 0.5 or more.

157. The light emitting device according to claim 131, wherein a fluorescent plate is placed such that it covers the second main surface of said nitride semiconductor substrate.

158. The light emitting device according to claim 131, wherein a fluorescent plate is placed apart from said nitride semiconductor substrate such that it faces with the second main surface of said nitride semiconductor substrate.

159. The light emitting device according to claim 131, wherein the surface of said fluorescent plate to be faced with the second main surface of said nitride semiconductor substrate has been subjected to an asperities-forming process.

160. The light emitting device according to claim 131, wherein said nitride semiconductor substrate include at least one of impurities and defects which generate fluorescence.

161. A light emitting device comprising more than one said light emitting device according to claim 131, wherein these light emitting devices are connected in serial or parallel.

162. A light emitting device comprising said light emitting devices according to claim 131 and a power supply circuit for causing the light emitting devices to generate light, wherein in said power supply circuit, two or more parallel portions each including two or more said light emitting devices connected in parallel are connected in parallel.

* * * * *